(12) United States Patent
Fujimoto

(10) Patent No.: US 8,110,872 B2
(45) Date of Patent: Feb. 7, 2012

(54) SEMICONDUCTOR DEVICE WITH TRANSISTOR, CONDUCTIVE PAD, AND CONTACT

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 94 days.

(21) Appl. No.: 12/621,104

(22) Filed: Nov. 18, 2009

(65) Prior Publication Data

US 2010/0123170 A1    May 20, 2010

(30) Foreign Application Priority Data

Nov. 19, 2008    (JP) .................................. 2008-295831

(51) Int. Cl.
*H01L 31/119* (2006.01)
(52) U.S. Cl. ................. 257/330; 257/E27.062
(58) Field of Classification Search .................. 257/330, 257/E27.062, E29.267
See application file for complete search history.

(56) References Cited

U.S. PATENT DOCUMENTS

| | | | |
|---|---|---|---|
| 6,242,775 B1 * | 6/2001 | Noble | 257/330 |
| 7,205,604 B2 | 4/2007 | Ouyang et al. | |
| 2001/0050388 A1 * | 12/2001 | Hamamoto | 257/301 |

FOREIGN PATENT DOCUMENTS

| | | |
|---|---|---|
| JP | 11-214684 A | 8/1999 |
| JP | 2005-12214 A | 1/2005 |

* cited by examiner

*Primary Examiner* — Thomas L Dickey
(74) *Attorney, Agent, or Firm* — Foley & Lardner LLP

(57) ABSTRACT

A semiconductor device includes a transistor, a conductive pad, and a contact. The conductive pad is electrically connected to the transistor. The conductive pad may include, but is not limited to, a first region and a second region. The contact is electrically connected to the conductive pad. At least a main part of the first region overlaps the transistor in plan view. At least a main part of the second region does not overlap the transistor in plan view. At least a main part of the contact overlaps the second region in plan view. The at least main part of the contact does not overlap the first region in plan view. The at least main part of the contact does not overlap the transistor in plan view.

18 Claims, 31 Drawing Sheets

FIG. 17A
FIG. 17B
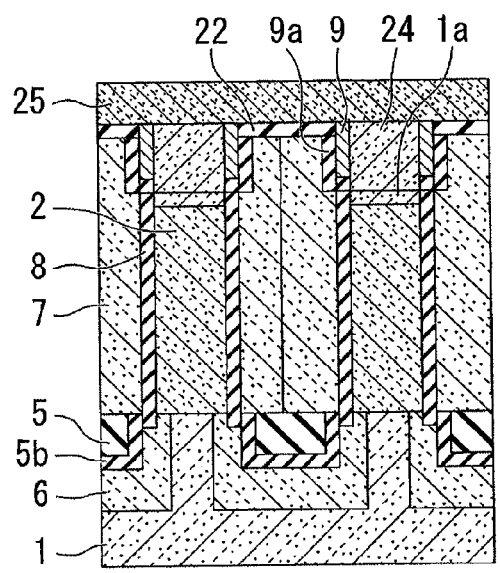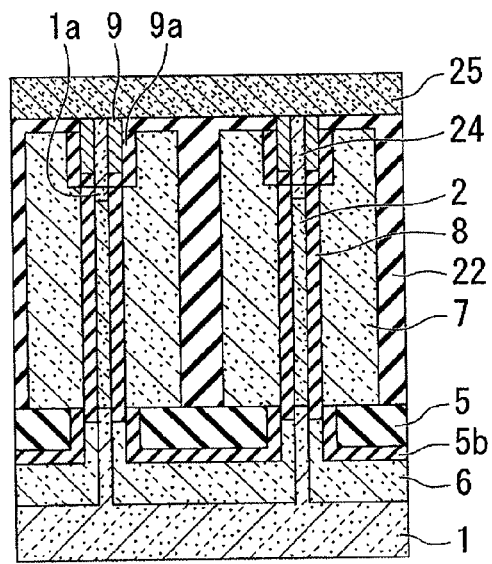
FIG. 18A
FIG. 18B
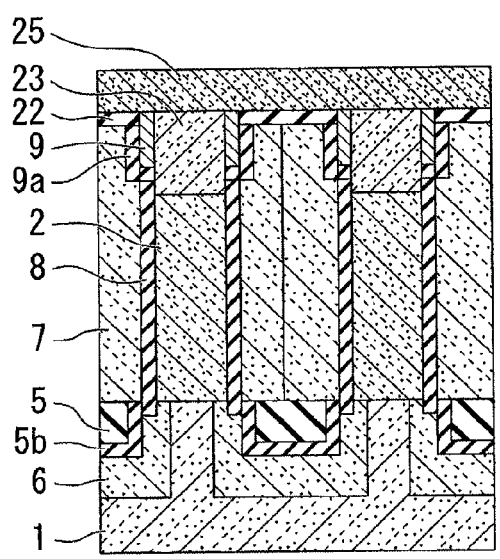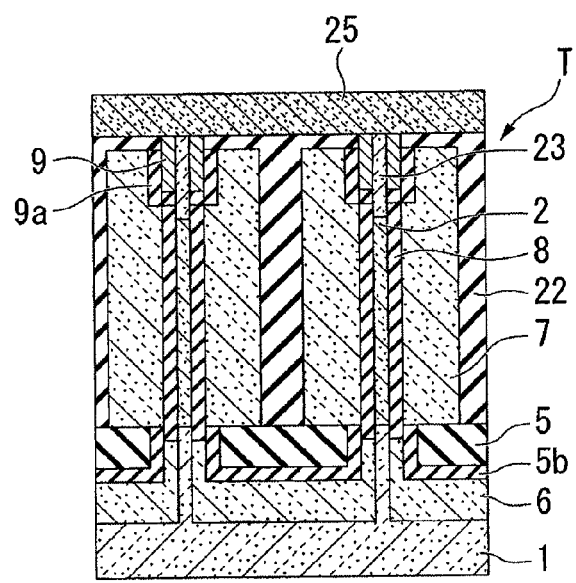

FIG. 28A
FIG. 28B
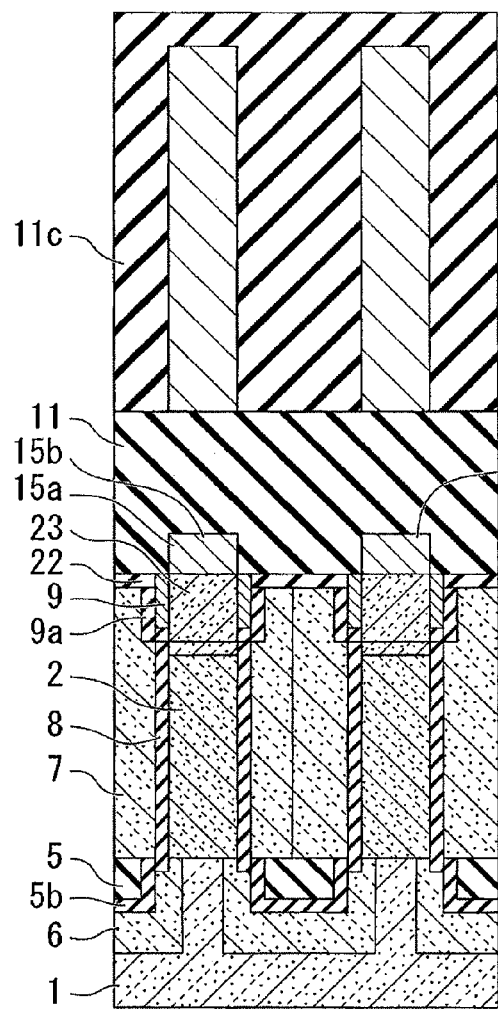
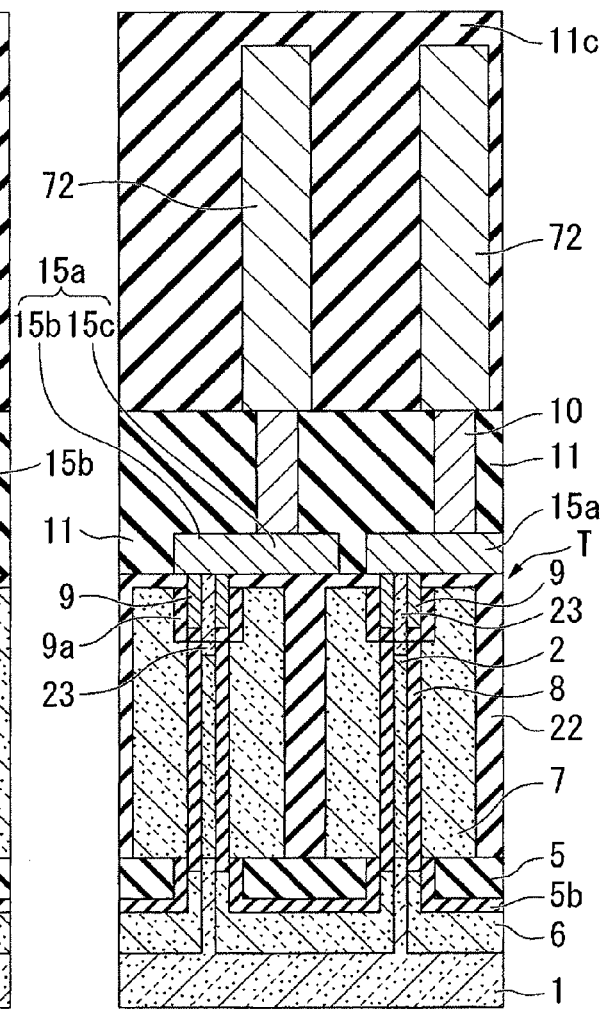

FIG. 29A
FIG. 29B
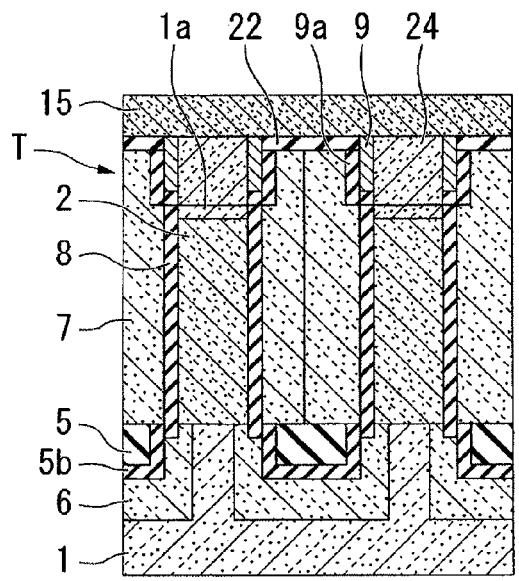
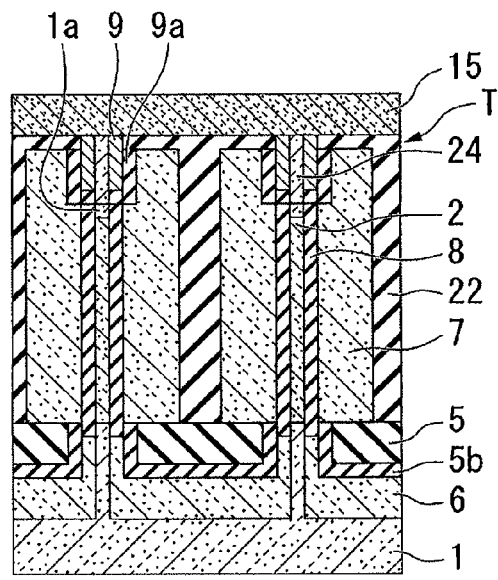
FIG. 30A
FIG. 30B
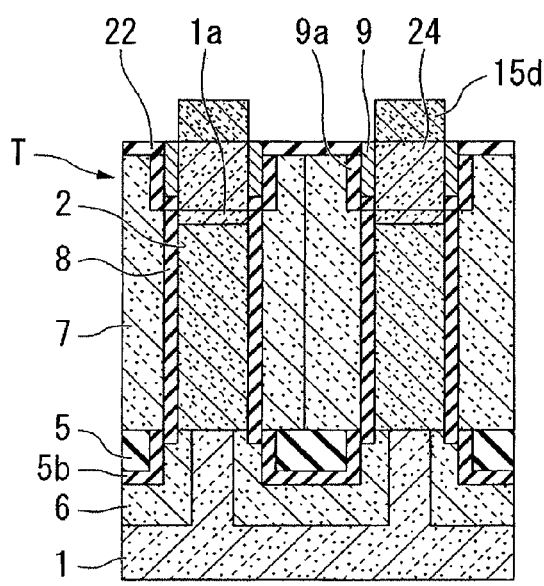
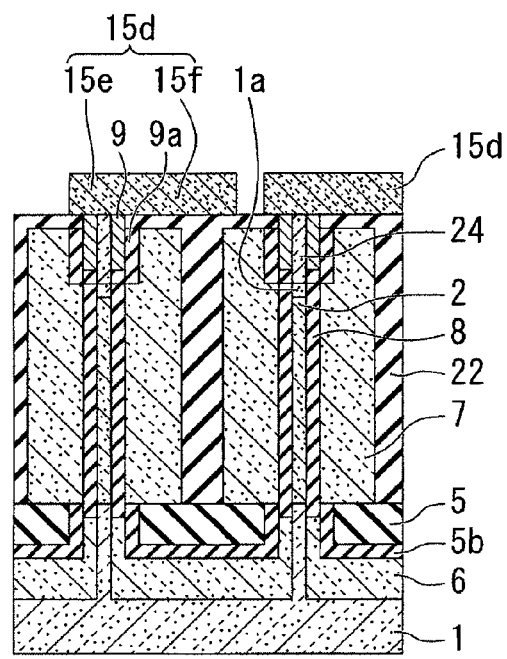

FIG. 33A
FIG. 33B
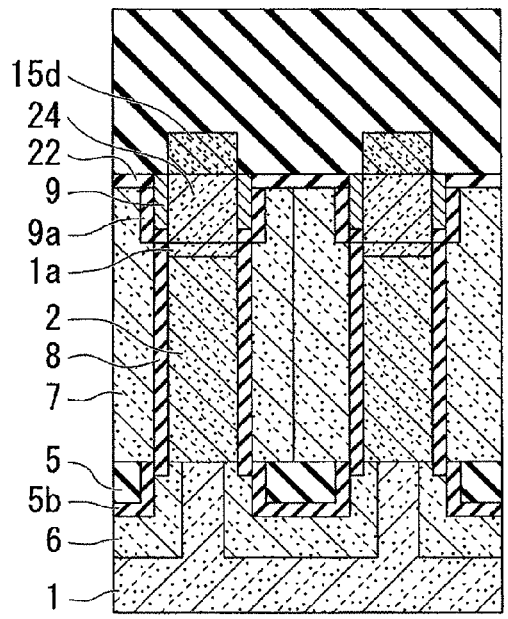
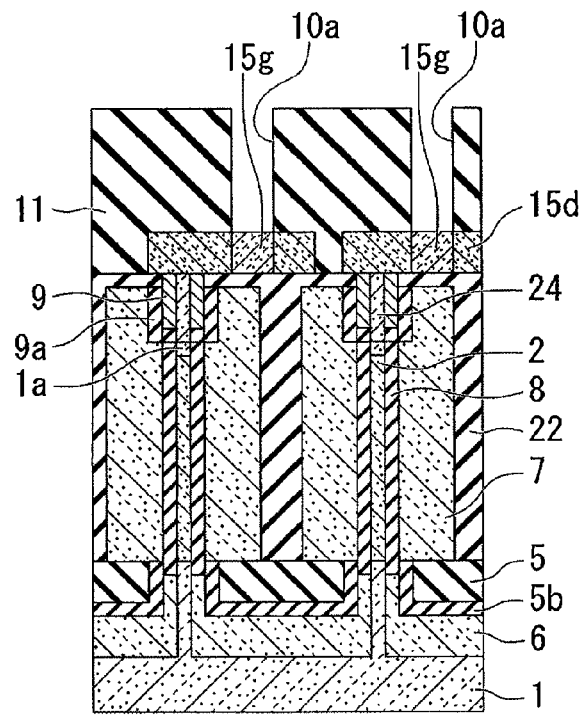
FIG. 34A
FIG. 34B
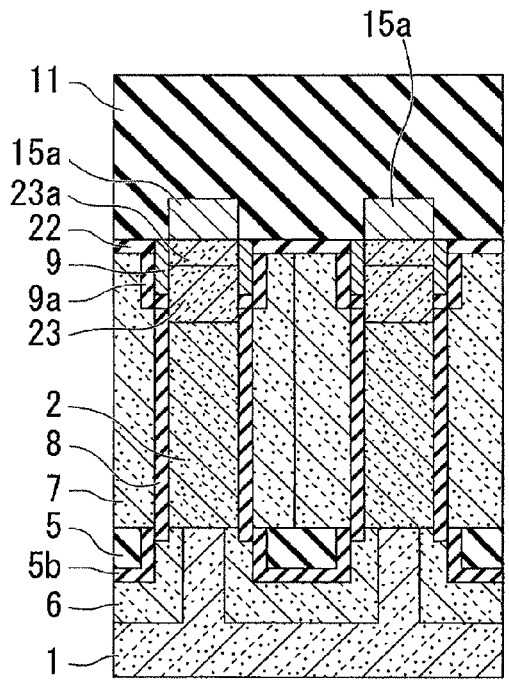
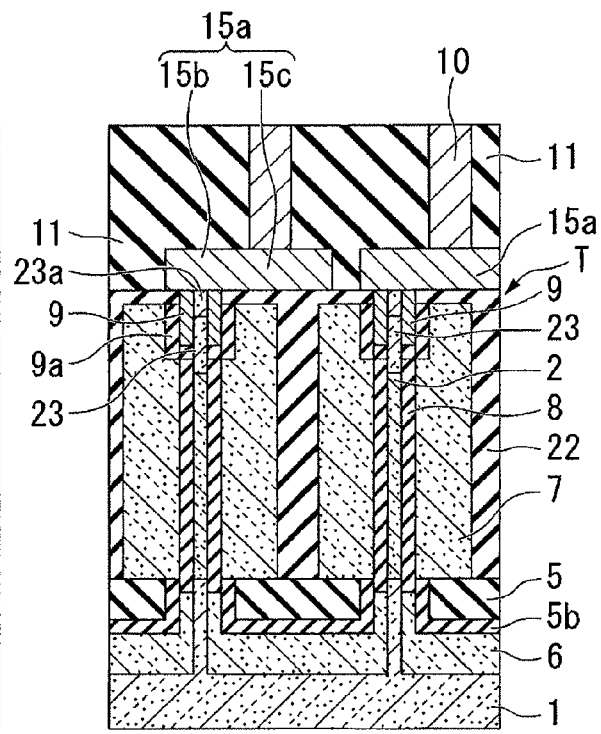

FIG. 42A
FIG. 42B
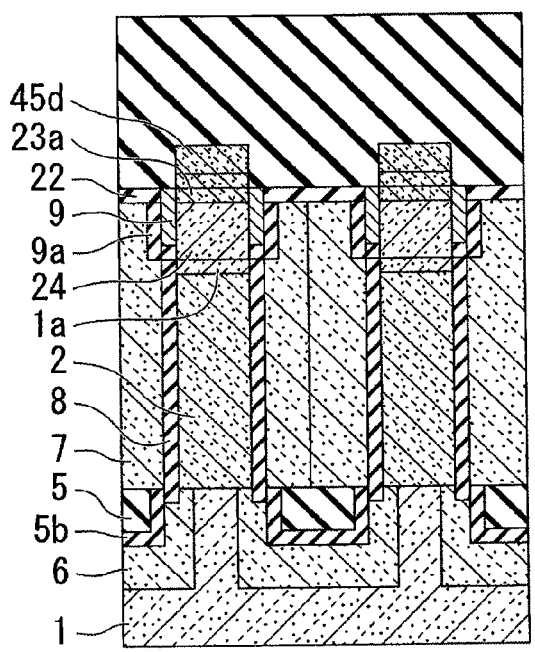
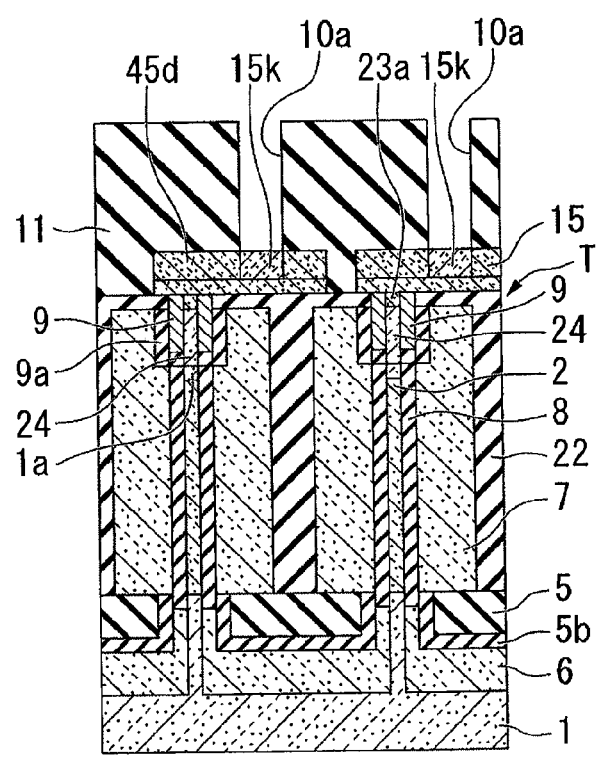

FIG. 45A
FIG. 45B
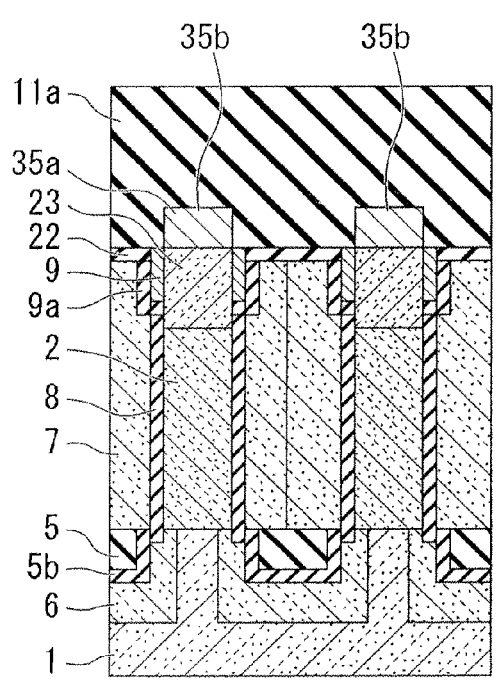
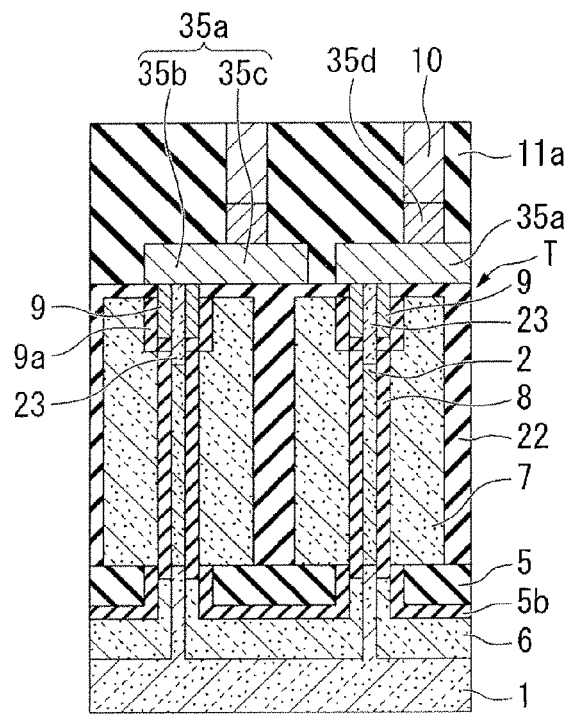
FIG. 46A
RELATED ART
FIG. 46B
RELATED ART
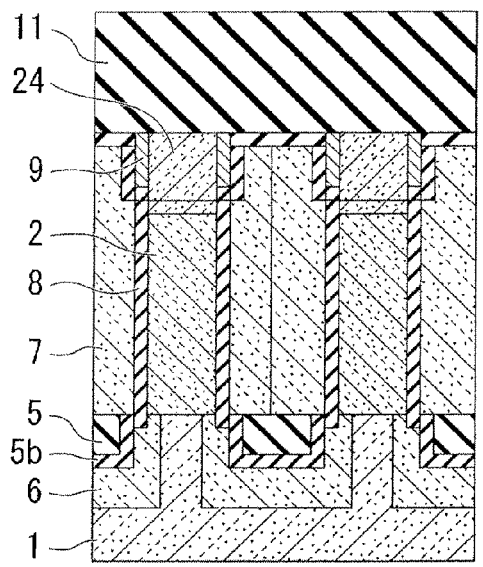
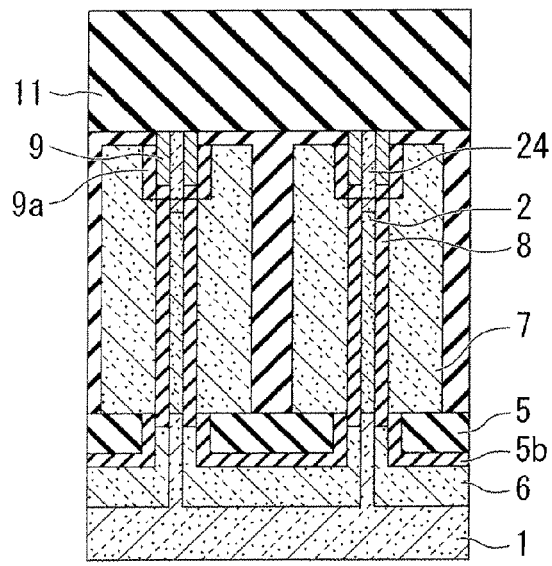

FIG. 47A
FIG. 47B
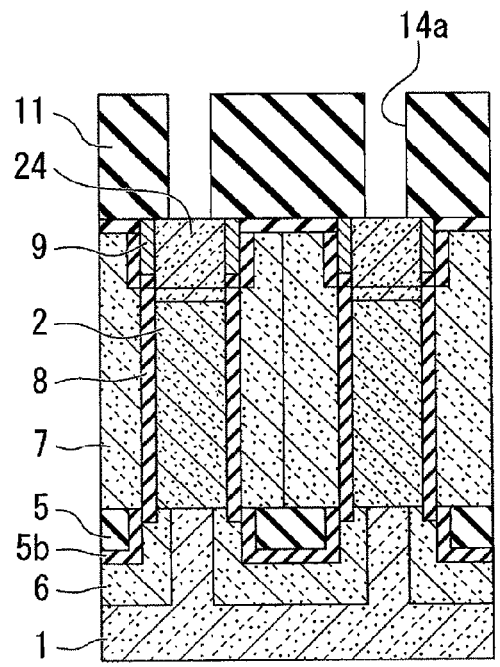
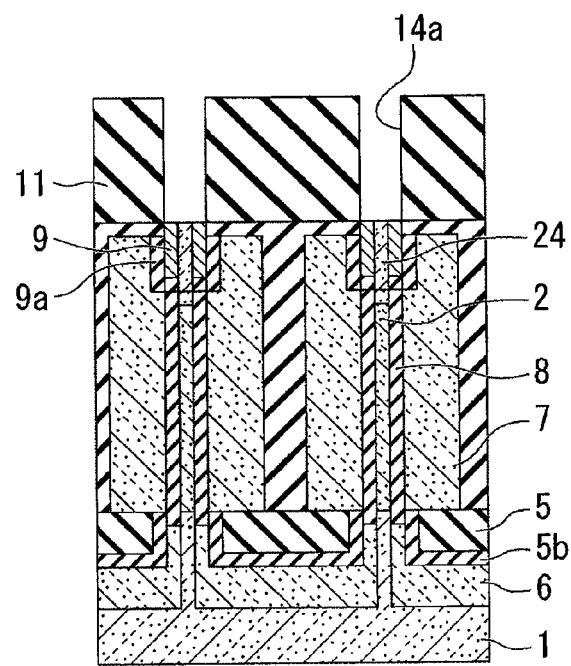
FIG. 48A
FIG. 48B
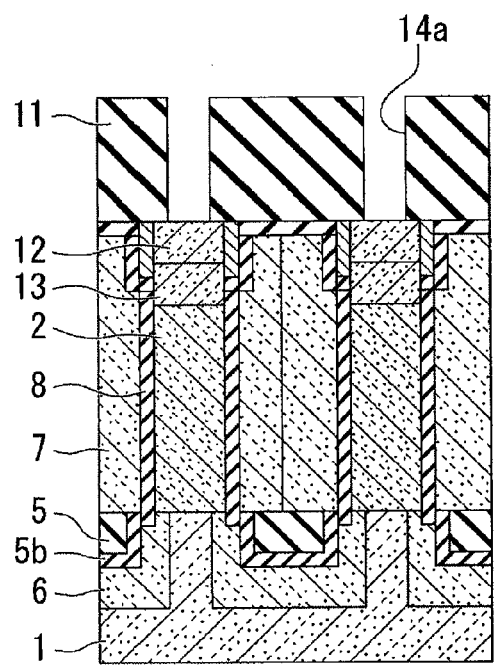
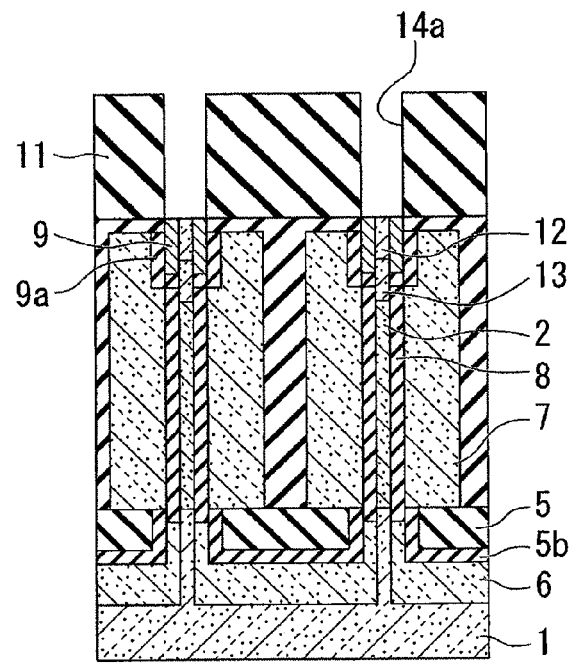

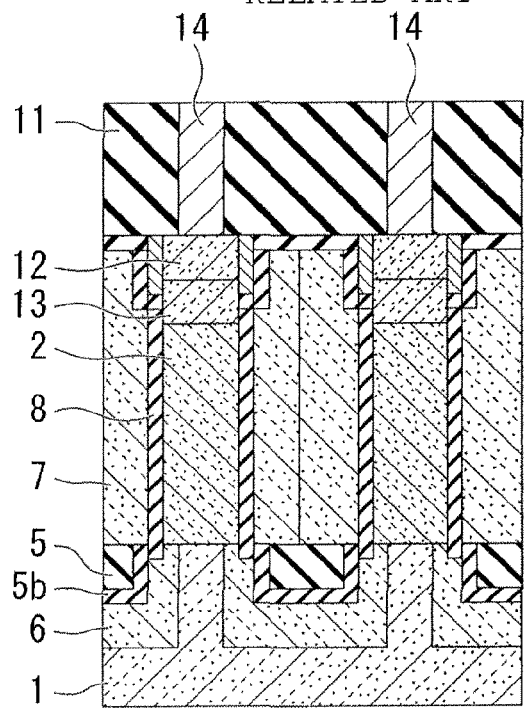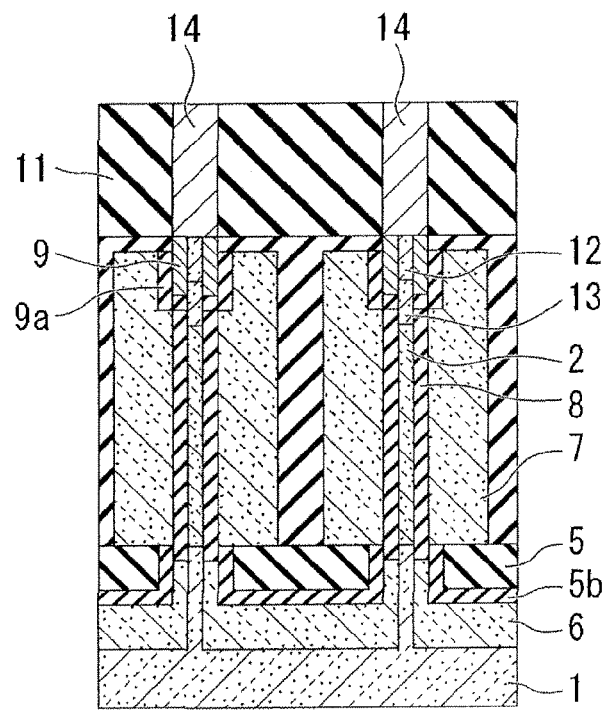
FIG. 49A RELATED ART
FIG. 49B RELATED ART

SEMICONDUCTOR DEVICE WITH TRANSISTOR, CONDUCTIVE PAD, AND CONTACT

BACKGROUND OF THE INVENTION

1. Field of the Invention

The present invention generally relates to a semiconductor device and a method of forming the same. More specifically, the present invention relates to a semiconductor device including a vertical transistor and a method of forming the same.

Priority is claimed on Japanese Patent Application No. 2008-295831, filed Nov. 19, 2008, the content of which is incorporated herein by reference.

2. Description of the Related Art

There have been known vertical metal oxide semiconductor transistors which will hereinafter be referred to as vertical MOS transistor. Japanese Unexamined Patent Application, First Publication, No. 2005-012214 discloses a vertical nMOSFET which includes an n+-relaxed SiGe drain, an epitaxial p-relaxed SiGe body, an epitaxial n+-tensile stressed Si, and an epitaxial tensile stressed channel.

Japanese Unexamined Patent Application, First Publication, No. 11-214684 discloses a semiconductor device including a MOS transistor. The MOS transistor includes an n-diffusion wiring layer. The MOS transistor also includes an n+-silicon selective epitaxial layer as a source region over the n-diffusion wiring layer. The MOS transistor also includes a p--silicon selective epitaxial layer as a channel region over the n-diffusion wiring layer. The MOS transistor also includes an n+-silicon selective epitaxial layer as a drain region over the n-diffusion wiring layer.

SUMMARY

In one embodiment, a semiconductor device may include, but is not limited to, a transistor, a conductive pad, and a contact. The conductive pad is electrically connected to the transistor. The conductive pad may include, but is not limited to, a first region and a second region. The contact is electrically connected to the conductive pad. At least a main part of the first region overlaps the transistor in plan view. At least a main part of the second region does not overlap the transistor in plan view. At least a main part of the contact overlaps the second region in plan view. The at least main part of the contact does not overlap the first region in plan view. The at least main part of the contact does not overlap the transistor in plan view.

In another embodiment, a method of forming a semiconductor device may include, but is not limited to, forming a transistor, forming a conductive pad, reducing a resistance of the conductive pad, and forming a contact. The conductive pad may include, but is not limited to, a first region and a second region. The conductive pad is electrically connected to the transistor. At least a main part of the first region overlaps the transistor in plan view. At least a main part of the second region not overlaps the transistor in plan view. At least a main part of the contact overlaps the second region in plan view. The at least main part of the contact does not overlap the first region in plan view. The at least main part of the contact does not overlap the first region in plan view.

In still another embodiment, a method of forming a semiconductor device may include, but is not limited to, forming a transistor, forming a conductive pad, forming a mask with a contact hole, introducing a dopant, diffusing the dopant, and forming a contact. The conductive pad may include, but is not limited to, a first region and a second region. The conductive pad is electrically connected to the transistor. At least a main part of the first region overlaps the transistor in plan view. At least a main part of the second region does not overlap the transistor in plan view. A mask with a contact hole is formed. The mask covers the conductive pad. A dopant through the contact hole is introduced into a selected part of the conductive pad. At least a main part of the selected part does not overlap the transistor in plan view. The dopant is diffused from the selected part to the conductive pad entirely. A contact is formed. At least a main part of the contact overlaps the second region in plan view. The at least main part of the contact does not overlap the first region in plan view. The at least main part of the contact does not overlap the first region in plan view.

BRIEF DESCRIPTION OF THE DRAWINGS

The above features and advantages of the present invention will be more apparent from the following description of certain preferred embodiments taken in conjunction with the accompanying drawings, in which:

FIG. 17A is a fragmentary cross sectional elevation view, taken along the first direction, illustrating a semiconductor device of the second embodiment in a step involved in a method of forming the semiconductor device of FIG. 23A;

FIG. 17B is a fragmentary cross sectional elevation view, taken along the second direction, illustrating the semiconductor device of FIG. 23A;

FIG. 18A is a fragmentary cross sectional elevation view, taken along the first direction, illustrating a semiconductor device of the second embodiment in a step subsequent to the step of FIG. 17A involved in the method of forming the semiconductor device of FIGS. 23A and 23B;

FIG. 18B is a fragmentary cross sectional elevation view, taken along the second direction, illustrating the semiconductor device of FIG. 18A;

FIG. 28A is a fragmentary cross sectional elevation view, taken along a first direction, illustrating a semiconductor device in a fourth modification to the first, second third embodiments in accordance with the present invention;

FIG. 28B is a fragmentary cross sectional elevation view, taken along a second direction perpendicular to the first direction, illustrating the semiconductor device of FIG. 28A;

FIG. 29A is a fragmentary cross sectional elevation view, taken along the first direction, illustrating a semiconductor device of the fourth embodiment in a step involved in a method of forming the semiconductor device of FIG. 34A.

FIG. 29B is a fragmentary cross sectional elevation view, taken along the second direction, illustrating the semiconductor device of FIG. 29A;

FIG. 29B is a fragmentary cross sectional elevation view, taken along the second direction, illustrating the semiconductor device of FIG. 29A;

FIG. 30A is a fragmentary cross sectional elevation view, taken along the first direction, illustrating a semiconductor device of the fourth embodiment in a step subsequent to the step of FIG. 29A involved in the method of forming the semiconductor device of FIGS. 34A and 34B;

FIG. 30B is a fragmentary cross sectional elevation view, taken along the second direction, illustrating the semiconductor device of FIG. 30A;

FIG. 33A is a fragmentary cross sectional elevation view, taken along the first direction, illustrating a semiconductor device of the fourth embodiment in a step subsequent to the step of FIG. 32A involved in the method of forming the semiconductor device of FIGS. 34A and 34B;

FIG. 33B is a fragmentary cross sectional elevation view, taken along the second direction, illustrating the semiconductor device of FIG. 33A;

FIG. 34A is a fragmentary cross sectional elevation view, taken along a first direction, illustrating a semiconductor device in a fourth embodiment in accordance with the present invention;

FIG. 34B is a fragmentary cross sectional elevation view, taken along a second direction perpendicular to the first direction, illustrating the semiconductor device of FIG. 34A;

FIG. 42A is a fragmentary cross sectional elevation view, taken along the first direction, illustrating a semiconductor device of the sixth embodiment in a step subsequent to the step of FIG. 41A involved in the method of forming the semiconductor device of FIGS. 34A and 34B;

FIG. 42B is a fragmentary cross sectional elevation view, taken along the second direction, illustrating the semiconductor device of FIG. 42A;

FIG. 45A is a fragmentary cross sectional elevation view, taken along a first direction, illustrating a semiconductor device in a seventh embodiment in accordance with the present invention;

FIG. 45B is a fragmentary cross sectional elevation view, taken along a second direction perpendicular to the first direction, illustrating the semiconductor device of FIG. 45A;

FIG. 46A is a fragmentary cross sectional elevation view, taken along the first direction, illustrating a semiconductor device of the related art in a step involved in a method of forming the semiconductor device of FIG. 49A;

FIG. 46B is a fragmentary cross sectional elevation view, taken along the second direction, illustrating the semiconductor device of FIG. 46A;

FIG. 47A is a fragmentary cross sectional elevation view, taken along the first direction, illustrating a semiconductor device of the related art in a step subsequent to the step of FIG. 46A involved in the method of forming the semiconductor device of FIG. 49A;

FIG. 47B is a fragmentary cross sectional elevation view, taken along the second direction, illustrating the semiconductor device of FIG. 47A;

FIG. 48A is a fragmentary cross sectional elevation view, taken along the first direction, illustrating a semiconductor device of the related art in a step subsequent to the step of FIG. 47A involved in the method of forming the semiconductor device of FIG. 49A;

FIG. 48B is a fragmentary cross sectional elevation view, taken along the second direction, illustrating the semiconductor device of FIG. 48A;

FIG. 49A is a fragmentary cross sectional elevation view, taken along a first direction, illustrating a semiconductor device in the related art; and FIG. 49B is a fragmentary cross sectional elevation view, taken along a second direction perpendicular to the first direction, illustrating the semiconductor device of FIG. 49A.

DETAILED DESCRIPTION OF THE PREFERRED EMBODIMENTS

Figure 1A:
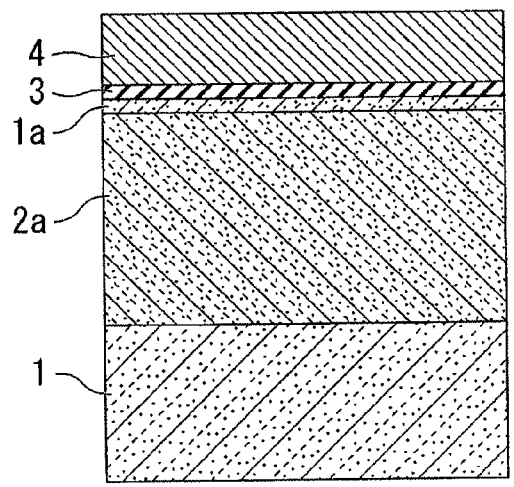
FIG. 1A is a fragmentary cross sectional elevation view, taken along the first direction, illustrating a semiconductor device of the first embodiment in a step involved in a method of forming the semiconductor device of FIG. 13A.

Before describing the present invention, the related art will be explained in detail with reference to FIGS. 46A, 46B, 47A, 47B, 48A, 48B, 49A, and 49B, in order to facilitate the understanding of the present invention.

FIG. 49A is a fragmentary cross sectional elevation view, taken along a first direction, illustrating a semiconductor device in the related art. FIG. 49B is a fragmentary cross sectional elevation view, taken along a second direction perpendicular to the first direction, illustrating the semiconductor device of FIG. 49A. FIG. 46A is a fragmentary cross sectional elevation view, taken along the first direction, illustrating a semiconductor device of the related art in a step involved in a method of forming the semiconductor device of FIG. 49A. FIG. 46B is a fragmentary cross sectional elevation view, taken along the second direction, illustrating the semiconductor device of FIG. 46A. FIG. 47A is a fragmentary cross sectional elevation view, taken along the first direction, illustrating a semiconductor device of the related art in a step subsequent to the step of FIG. 46A involved in the method of forming the semiconductor device of FIG. 49A. FIG. 47B is a fragmentary cross sectional elevation view, taken along the second direction, illustrating the semiconductor device of FIG. 47A. FIG. 48A is a fragmentary cross sectional elevation view, taken along the first direction, illustrating a semiconductor device of the related art in a step subsequent to the step of FIG. 47A involved in the method of forming the semiconductor device of FIG. 49A. FIG. 48B is a fragmentary cross sectional elevation view, taken along the second direction, illustrating the semiconductor device of FIG. 48A.

With reference to FIGS. 49A and 49B, a semiconductor device includes a semiconductor substrate 1, lower diffusion layers 6, pillars 2, upper diffusion layers 13, gate insulating films 8, and gate electrodes 7. The lower diffusion layers 6 are disposed in the semiconductor substrate 1. The pillars 2 are disposed over the lower diffusion layers 6. The pillars 2 provide channels. The upper diffusion layers 13 are disposed over the pillars 2. The gate insulating film 8 surrounds the pillar 2. The gate electrode 7 surrounds the gate insulating film 8 that surrounds the pillar 2. The gate electrode 7 is separated by the gate insulating film 8 from the pillar 2.

The lower diffusion layers 6 are electrically separated by oxide films 5 and 5b from the gate electrodes 7. The upper diffusion layer 13 is surrounded by a side wall 9. The upper diffusion layer 13 is electrically separated by an oxide film 9a from the gate electrodes 7.

Contact layers 12 are disposed over the upper diffusion layers 13. The contact layers 12 are doped with a dopant. An inter-layer insulator 11 extends over the contact layers 12 and over the gate electrodes 7. The inter-layer insulator 11 has contact holes in which contacts 14 are disposed. The contacts 14 are disposed over the contact layers 12. The upper diffusion layer 13 is electrically connected through the contact layer 12 to the contact 14. The contact layer 12 doped with the dopant is provided to reduce the contact resistance between the upper diffusion layer 13 and the contact 14.

Processes for forming the semiconductor device of FIGS. 49A and 49B will be described.

With reference to FIGS. 46A and 46B, a vertical transistor structure is formed over the semiconductor substrate 1. The vertical transistor structure includes the lower diffusion layers 6, the pillars 2, the gate insulating films 8, the gate electrodes 7, and semiconductor layers 24. The semiconductor layers 24 are formed into the contact layers 12 and the upper diffusion layers 13. The inter-layer insulator 11 is formed over the vertical transistor structure.

With reference to FIGS. 47A and 47B, a resist pattern is formed over the inter-layer insulator 11 by a lithography process. A dry etching process is carried out using the resist pattern as a mask to form contact holes 14a in the inter-layer insulator 11. The contact holes 14a are positioned overt the semiconductor layers 24. The resist pattern is removed. The contact holes 14a are formed to form contacts 14. Parts of the semiconductor layers 24 are exposed through the contact holes 14a. The semiconductor layers 24 are to be formed into the contact layers 12 and the upper diffusion layers 13.

With reference to FIGS. 48A and 48B, a dopant is doped into the exposed portions of the semiconductor layers 24 through the contact holes 14a, thereby forming the upper diffusion layers 13 in the semiconductor layers 24 under the contact holes 14a. Further, a dopant is doped into the exposed portions of the semiconductor layers 24 through the contact holes 14a, thereby forming the contact layers 12 in the semiconductor layers 24 under the contact holes 14a.

With reference again to FIGS. 49A and 49B, the contacts 14 are formed in the contact holes 14a, thereby completing the semiconductor device.

When the semiconductor device shown in FIGS. 49A and 49B is formed by the processes shown in FIGS. 46A, 46B, 47A, 47B, 48A and 48B, the doping process to form the contact layers 12 or the contact implantation can not prevent that the dopant penetrates the upper diffusion layers 13 and reaches the pillars 2. Once the dopant for forming the contact layers 12 is doped into the pillars 2, a punch through phenomenon may be caused in the semiconductor device.

Reducing the dose or the amount of the dopant into the semiconductor layers 24 may be effective to avoid the punch through problem that the dopant for forming the contact layers 12 is doped into the pillars 2. Reducing the dose or the amount of the dopant into the semiconductor layers 24 may cause another problem with the resistivity of the contact layers 12 between the upper diffusion layers 13 and the contacts 14. Namely, reducing the dose or the amount of the dopant into the semiconductor layers 24 may increase the contact resistance between the upper diffusion layers 13 and the contacts 14. Increasing the contact resistance between the upper diffusion layers 13 and the contacts 14 reduces the on-current of the semiconductor device.

When the semiconductor device shown in FIGS. 49A and 49B is formed by the processes shown in FIGS. 46A, 46B, 47A, 47B, 48A and 48B, the doping process to form the upper diffusion layers 13 or the source/drain implantation can not prevent that the dopant reaches the pillars 2. Once the dopant for forming the upper diffusion layers 13 is doped into the pillars 2, the punch through phenomenon may be caused in the semiconductor device.

Reducing the doping energy or the implantation energy in doping the dopant into the semiconductor layers 24 may be effective to avoid the punch through problem that the dopant for forming the upper diffusion layers 13 is doped into the pillars 2. Reducing the doping energy or the implantation energy in doping the dopant into the semiconductor layers 24 may cause another problem that the upper diffusion layers 13 are off-set from the gate electrodes 7. There is formed an off-set region between the upper diffusion layers 13 and the gate electrodes 7. When the vertical transistor turns ON, the off-set region is highly resistive. The highly resistive off-set region between the upper diffusion layers 13 and the gate electrodes 7 reduces the on-current of the semiconductor device.

It had been desired to provide a semiconductor device which can avoid punch-through problem caused by the contact implantation and/or the source/drain implantation. The semiconductor device has high ON current characteristics. It had been desired to provide a method of forming such a semiconductor device.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

Figure 13A:
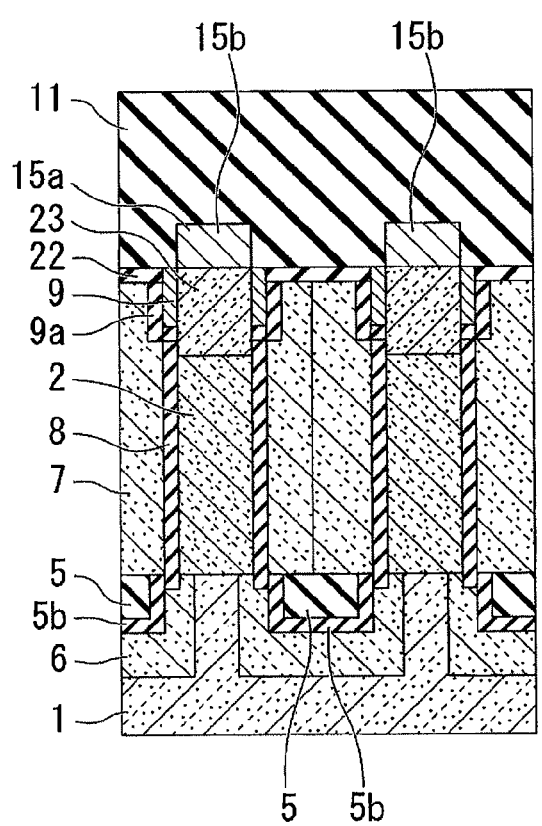
FIG. 13A is a fragmentary cross sectional elevation view, taken along a first direction, illustrating a semiconductor device in a first embodiment in accordance with the present invention.
Figure 13B:
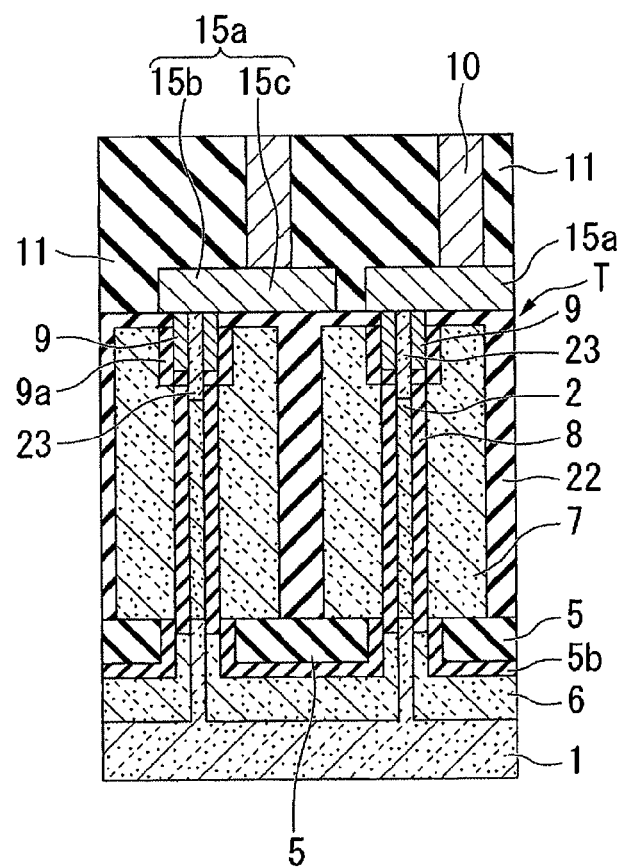
FIG. 13B is a fragmentary cross sectional elevation view, taken along a second direction perpendicular to the first direction, illustrating the semiconductor device of FIG. 13A.

FIG. 13A is a fragmentary cross sectional elevation view, taken along a first direction, illustrating a semiconductor device in a first embodiment in accordance with the present invention. FIG. 13B is a fragmentary cross sectional elevation view, taken along a second direction perpendicular to the first direction, illustrating the semiconductor device of FIG. 13A.

A semiconductor device shown in FIGS. 13A and 13B includes a semiconductor substrate 1 and a vertical transistor T over the semiconductor substrate 1. The vertical transistor T may include, but is not limited to, lower diffusion layers 6, pillars 2, upper diffusion layers 23, gate insulating films 8, and gate electrodes 7. The lower diffusion layers 6 are disposed in the semiconductor substrate 1. The pillars 2 are disposed over the lower diffusion layers 6. The upper diffusion layers 23 are disposed over the pillars 2. The gate insulating film 8 surrounds the pillar 2. The gate electrode 7 surrounds the gate insulating film 8 that surrounds the pillar 2. The gate electrode 7 is separated by the gate insulating film 8 from the pillar 2.

The lower diffusion layers 6 may be realized by a doped silicon layer. The lower diffusion layers 6 can be formed by source/drain implantation process. The lower diffusion layers 6 are electrically separated by oxide films 5 and 5b from the gate electrodes 7. The pillars 2 provide channels. The pillars 2 may be realized by a doped silicon layer. The pillars 2 can be formed by channel implantation process. The upper diffusion layers 23 may be realized by a doped silicon layer. The upper diffusion layers 23 can be formed by source/drain implantation process. The upper diffusion layer 23 is surrounded by a side wall 9. The upper diffusion layer 23 is electrically separated by an oxide film 9a from the gate electrodes 7.

Figure 14:
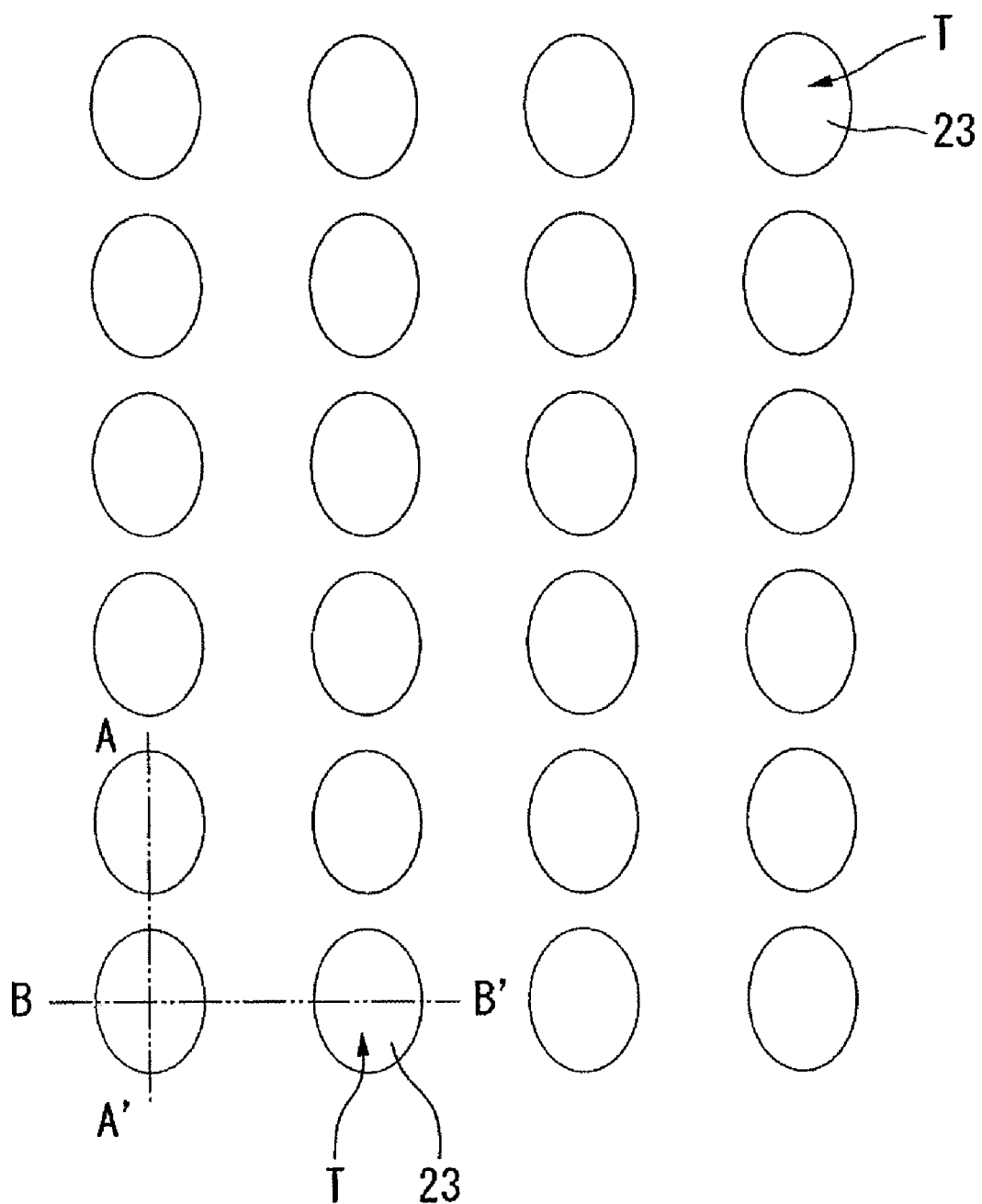
FIG. 14 is a fragmentary plan view illustrating the semiconductor device of FIGS. 13A and 13B with an array of upper diffusion layers.
Figure 15:
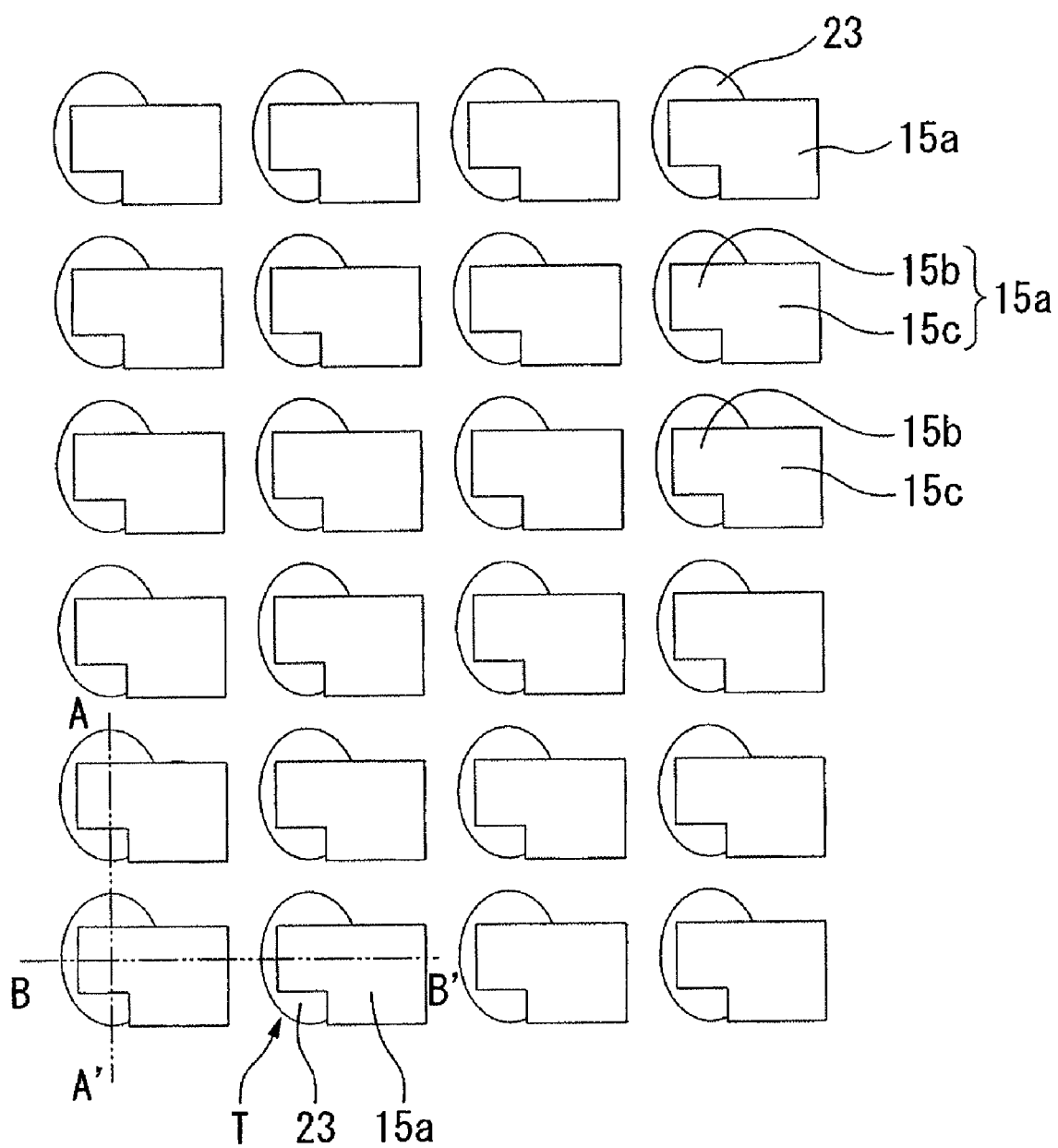
FIG. 15 is a fragmentary plan view illustrating the semiconductor device of FIGS. 13A and 13B with an array of upper diffusion layers and conductive pads.
Figure 16:
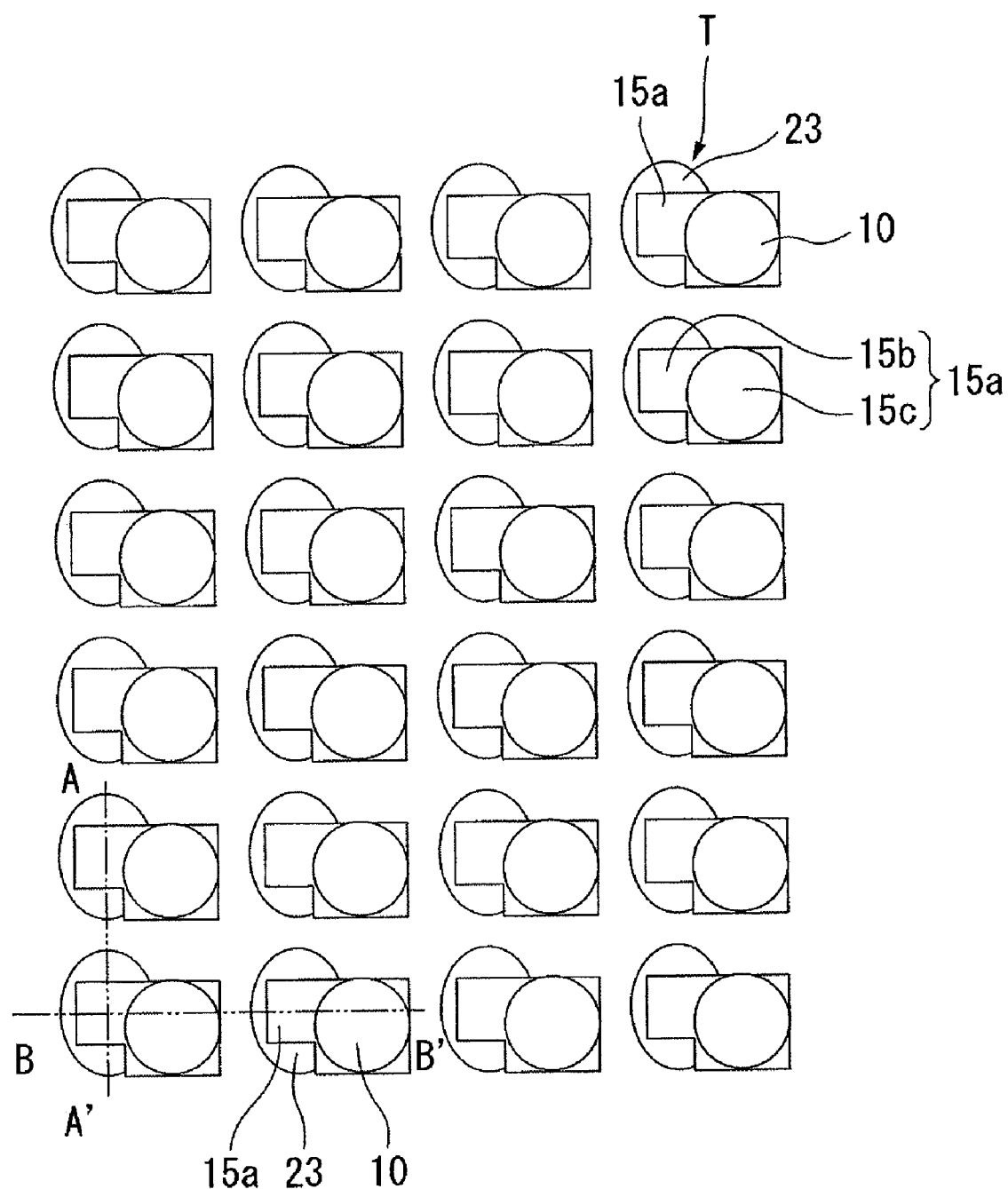
FIG. 16 is a fragmentary plan view illustrating the semiconductor device of FIGS. 13A and 13B with an array of upper diffusion layers, conductive pads, and contacts.

FIG. 14 is a fragmentary plan view illustrating the semiconductor device of FIGS. 13A and 13B with an array of upper diffusion layers. FIG. 15 is a fragmentary plan view illustrating the semiconductor device of FIGS. 13A and 13B with an array of upper diffusion layers and conductive pads. FIG. 16 is a fragmentary plan view illustrating the semiconductor device of FIGS. 13A and 13B with an array of upper diffusion layers, conductive pads, and contacts. In FIGS. 14, 15 and 16, the line A-A' is the first direction, along which the fragmentary cross sectional elevation view of FIG. 13A is taken, and the line B-B' is the second direction, along which the fragmentary cross sectional elevation view of FIG. 13B is taken.

The pillars 2 may each have a generally elliptical shape in plan view as shown in FIGS. 14, 15, and 16. The generally elliptical shape of each of the pillars 2 may have a major axis along the A-A' line of FIGS. 14, 15, and 16, and a minor axis along the B-B' line of FIGS. 14, 15, and 16.

As shown in FIGS. 13A, 13B, 15 and 16, the semiconductor device may include conductive pads 15a. The conductive pads 15a are disposed over the upper diffusion layers 23. The upper diffusion layers 23 are upper portions of the vertical transistor T. The conductive pads 15a can be realized by an electrically conductive material. The conductive pads 15a may be formed of, but are not limited to, a doped polysilicon. The conductive pads 15a may each have, but is not limited to, a generally L-shape in plan view as shown in FIGS. 15 and 16. The conductive pads 15a may each include, but is not limited to, a transistor connection region 15b and a contact region 15c. The transistor connection region 15b overlaps the vertical transistor T in plan view. The contact region 15c does not overlap the vertical transistor T in plan view as shown in FIGS. 13A, 13B and 15.

As shown in FIGS. 13A, 13B and 16, the semiconductor device may include contacts 10 which are electrically connected to the conductive pads 15a. The contacts 10 can be made of a conductive material. As shown in FIG. 16, the contacts 10 may each have a generally circular shape in plan view. As shown in FIG. 16, the contacts 10 may each be disposed over the contact region 15c and a part of the transistor connection region 15b of the conductive pads 15a. It is also possible that the contacts 10 may each overlap only the contact region 15c but does not overlap the transistor connection region 15b of the conductive pads 15a.

The contacts 10 may each overlap at least a part of the contact region 15c of the conductive pads 15a. This arrangement of the contact 10 overlapping at least a part of the contact region 15c of the conductive pads 15a can be effective to reduce or prevent the punch-through effects which would be caused by the contact implantation and/or the source/drain implantation. The contacts 10 may each overlap entirely the contact region 15c of the conductive pads 15a. This arrangement of the contact 10 overlapping entirely the contact region 15c of the conductive pads 15a can be more effective to reduce or prevent the punch-through effects which would be caused by the contact implantation and/or the source/drain implantation.

The contact 10 overlapping at least a part of the contact region 15c of the conductive pads 15a can be formed by making a contact hole 10a which is positioned over the at least part of the contact region 15c of the conductive pads 15a so that the at least part of the contact region 15c is exposed through the contact hole 10a. The contact 10 overlapping entirely the contact region 15c of the conductive pads 15a can be formed by making a contact hole 10a which is positioned over entirely the contact region 15c of the conductive pads 15a so that the contact region 15c is entirely exposed through the contact hole 10a.

As shown in FIGS. 13A, 13B, 14, 15 and 16, the semiconductor device may have a two-dimensional array of sets of the vertical transistor T, the conductive pad 15a and the contact 10. The two-dimensional array may be a lattice with constant pitches, such as a matrix array. Each set of the vertical transistor T, the conductive pad 15a and the contact 10 may have the same arrangements of the conductive pad 15a and the contact 10 with respect to the vertical transistor T as shown in FIG. 16.

The semiconductor device as described with reference to FIGS. 13A, 13B, 14, and 16 can be formed by, but not limited to, the following processes.

Figure 1B:
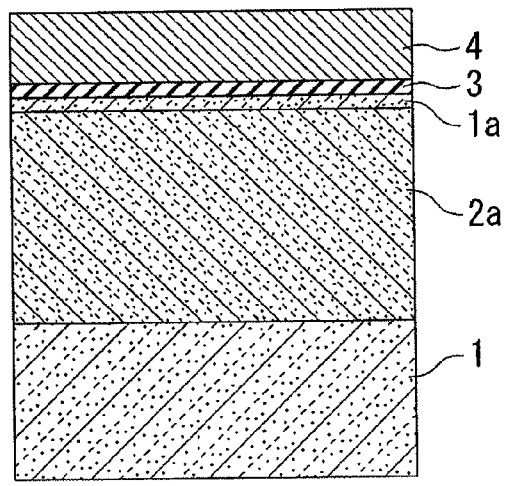
FIG. 1B is a fragmentary cross sectional elevation view, taken along the second direction, illustrating the semiconductor device of FIG. 13A.

FIG. 1A is a fragmentary cross sectional elevation view, taken along the first direction, illustrating a semiconductor device of the first embodiment in a step involved in a method of forming the semiconductor device of FIG. 13A. FIG. 1B is a fragmentary cross sectional elevation view, taken along the second direction, illustrating the semiconductor device of FIG. 13A.

A semiconductor substrate 1 is prepared. A thermal oxidation process is carried out to form a thermal oxide film 3 on the semiconductor substrate 1. The thickness of the thermal oxide film 3 may be, but is not limited to, 10 nm. A dopant implantation process or a channel implantation process is carried out to selectively introduce a dopant into the semiconductor substrate 1 in a depth range for channel formation, thereby forming a channel implantation silicon region 2a. For example, the channel implantation process can be realized by, but is not limited to, the followings. Boron is implanted at implantation energy of 20 KeV and at a dose of $1E13/cm^2$. While the channel implantation silicon region 2a is formed in the semiconductor substrate 1, a non-doped silicon region 1a is formed in the semiconductor substrate 1, wherein the non-doped silicon region 1a is over the channel implantation silicon region 2a and under the thermal oxide film 3.

A silicon nitride film 4 is formed over the thermal oxide film 3. The thickness of the silicon nitride film 4 may be, but is not limited to, 100 nm. The silicon nitride film 4 will be used as a hard mask in later process.

Figure 2A:
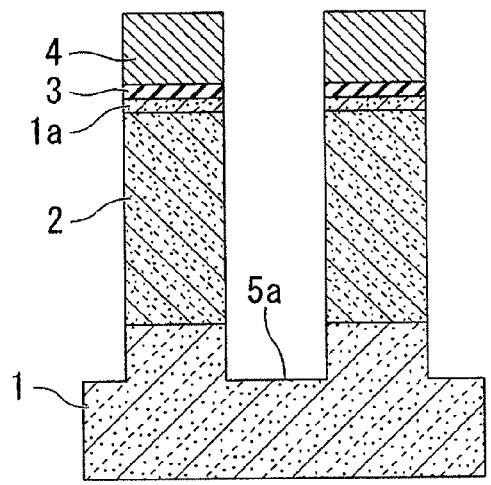
FIG. 2A is a fragmentary cross sectional elevation view, taken along the first direction, illustrating a semiconductor device of the first embodiment in a step subsequent to the step of FIG. 1A involved in the method of forming the semiconductor device of FIGS. 13A and 13B.
Figure 2B:
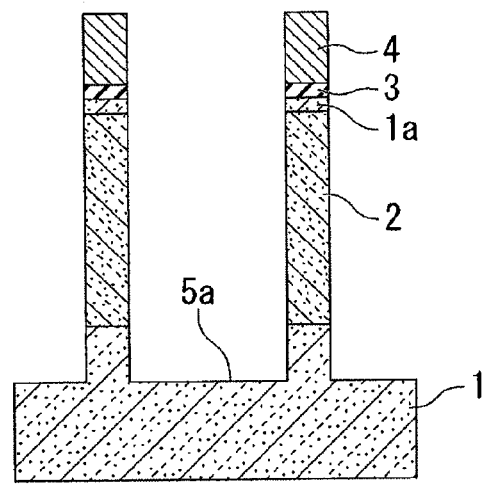
FIG. 2B is a fragmentary cross sectional elevation view, taken along the second direction, illustrating the semiconductor device of FIG. 2A.

FIG. 2A is a fragmentary cross sectional elevation view, taken along the first direction, illustrating a semiconductor device of the first embodiment in a step subsequent to the step of FIG. 1A involved in the method of forming the semiconductor device of FIGS. 13A and 13B. FIG. 2B is a fragmentary cross sectional elevation view, taken along the second direction, illustrating the semiconductor device of FIG. 2A.

A resist film is applied on the silicon nitride film 4. A lithography process is carried out to pattern the resist film, thereby forming a resist pattern over the silicon nitride film 4.

A dry etching process is carried out using the resist pattern as a mask to selectively dry-etch the silicon nitride film 4, thereby forming a hard mask 4 of silicon nitride. The resist pattern is removed. A dry etching process is carried out using the hard mask 4 of silicon nitride to selectively dry-etch the thermal oxide film 3, so that the non-doped silicon region 1a is partially exposed. Dry etching processes are carried out using the hard mask 4 of silicon nitride to selectively dry-etch the non-doped silicon region 1a, the channel implantation silicon region 2a and the semiconductor substrate 1, thereby forming pillars 2 and grooves 5a. The pillars 2 are each made of the channel implantation silicon region 2a. The grooves 5a define the pillars 2 made of the channel implantation silicon region 2a. The grooves 5a extend to the deeper region than the pillars 2. The bottoms of the grooves 5a are deeper than the bottoms of the pillars 2. The depth of the grooves 5a may be, but is not limited to, 150 nm.

Figure 3A:
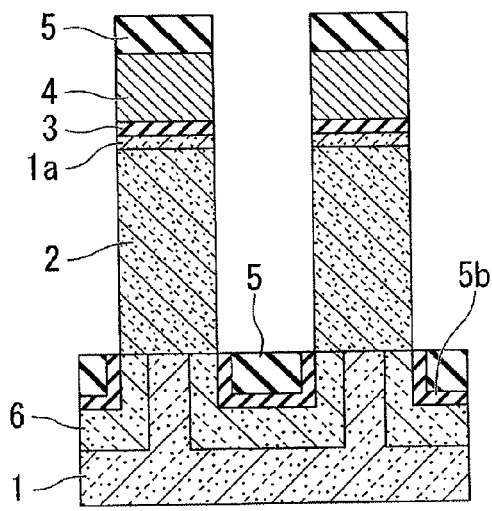
FIG. 3A is a fragmentary cross sectional elevation view, taken along the first direction, illustrating a semiconductor device of the first embodiment in a step subsequent to the step of FIG. 2A involved in the method of forming the semiconductor device of FIGS. 13A and 13B.
Figure 3B:
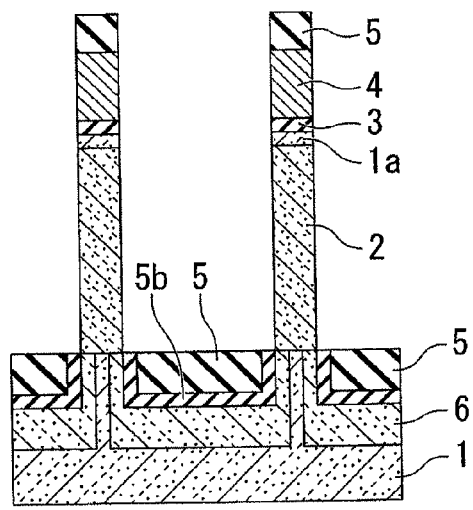
FIG. 3B is a fragmentary cross sectional elevation view, taken along the second direction, illustrating the semiconductor device of FIG. 3A.

FIG. 3A is a fragmentary cross sectional elevation view, taken along the first direction, illustrating a semiconductor device of the first embodiment in a step subsequent to the step of FIG. 2A involved in the method of forming the semiconductor device of FIGS. 13A and 13B. FIG. 3B is a fragmentary cross sectional elevation view, taken along the second direction, illustrating the semiconductor device of FIG. 3A.

A thermal oxidation process is carried out to oxidize the bottoms and side walls of the grooves 5a and side walls of the pillars 2, thereby forming an oxide film 5b. The oxide film 5b extends along the bottom and side walls of the grooves 5a and the side walls of the pillars 2. The oxide film 5b extending along the side walls of the pillars 2 is not illustrated. A high density plasma method is used to deposit an oxide film 5 over the silicon nitride hard mask 4 and in the grooves 5a so that the grooves 5a is partially filled with the oxide film 5. The lower part of the grooves 5a is filled with the oxide film 5. The lower part of the grooves 5a is lower in level than the pillars 2. The thickness of the grooves 5a may be, but is not limited to, 30 nm.

Another dopant implantation process or a source/drain implantation process is carried out to selectively introduce a dopant into the semiconductor substrate 1 in a deeper depth range for source/drain formation, thereby forming lower diffusion layers 6 in the semiconductor substrate 1. For example, the source/drain implantation process can be realized by, but is not limited to, the followings. Arsenic is implanted at implantation energy of 30 KeV and at a dose of $5E15/cm^2$. The oxide films that are not illustrated and extend along the side walls of the pillars 2 are then removed by a wet etching process, so that the side walls of the pillars 2 are exposed.

A gate oxidation process is carried out to firm gate insulating films 8. The gate insulating film 8 extends continuously along the side walls of the pillar 2 and is adjacent to an upper portion of the oxide film 5b. The upper portion of the oxide film 5b is adjacent to the boundary between the pillar 2 and the lower diffusion layers 6. Namely, the gate insulating film 8 extends along the side walls of the pillar 2 and extends in the upper portion of the lower diffusion layers 6. The upper portion of the lower diffusion layers 6 is adjacent to the pillar 2. The gate oxidation process can be carried out by a steam oxidation at a temperature of 1000° C. The thickness of the gate insulating films 8 may be, but are not limited to, 8 nm.

Figure 4A:
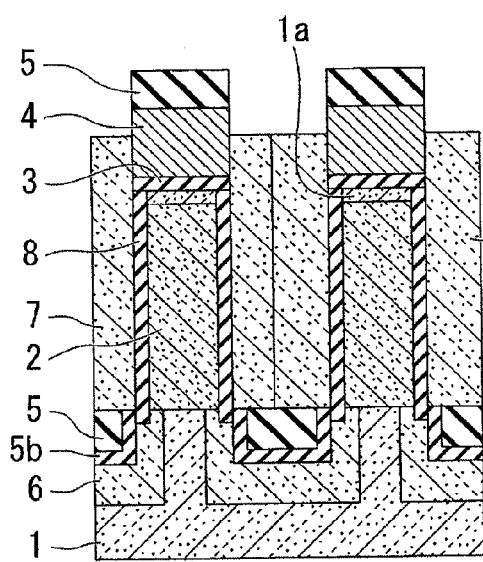
FIG. 4A is a fragmentary cross sectional elevation view, taken along the first direction, illustrating a semiconductor device of the first embodiment in a step subsequent to the step of FIG. 3A involved in the method of forming the semiconductor device of FIGS. 13A and 13B.
Figure 4B:
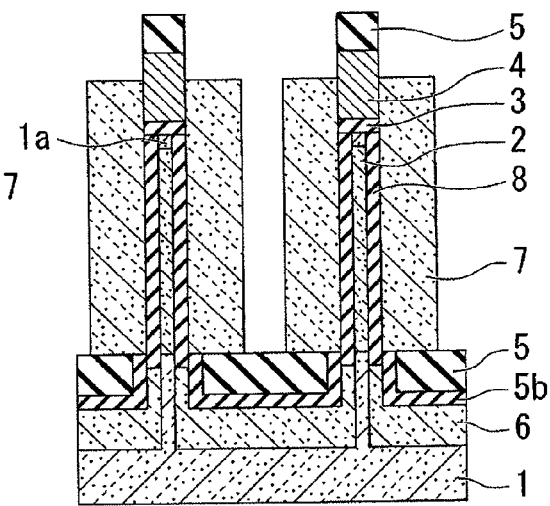
FIG. 4B is a fragmentary cross sectional elevation view, taken along the second direction, illustrating the semiconductor device of FIG. 4A.

FIG. 4A is a fragmentary cross sectional elevation view, taken along the first direction, illustrating a semiconductor device of the first embodiment in a step subsequent to the step of FIG. 3A involved in the method of forming the semiconductor device of FIGS. 13A and 13B. FIG. 4B is a fragmentary cross sectional elevation view, taken along the second direction, illustrating the semiconductor device of FIG. 4A.

A deposition process is carried out to deposit a polysilicon film entirely, while carrying out an in-situ doping of phosphorous. The thickness of the polysilicon film may be, but is not limited to, 50 nm. The phosphorus-doped polysilicon is then etched back by a dry etching process, thereby forming gate electrodes 7. The top of the etched-back polysilicon films or the gate electrodes 7 are lower in level than the top of the silicon nitride film 4 and higher in level than the bottom of the silicon nitride film 4.

Figure 5A:
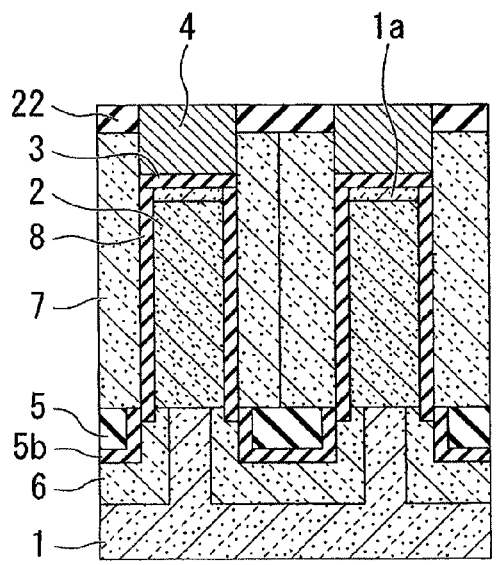
FIG. 5A is a fragmentary cross sectional elevation view, taken along the first direction, illustrating a semiconductor device of the first embodiment in a step subsequent to the step of FIG. 4A involved in the method of forming the semiconductor device of FIGS. 13A and 13B.
Figure 5B:
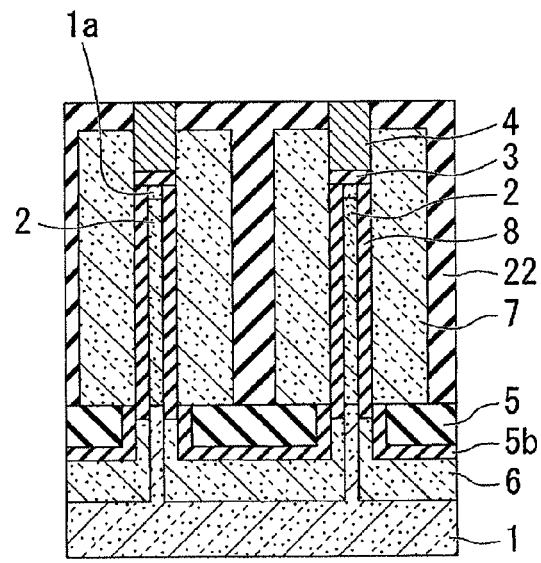
FIG. 5B is a fragmentary cross sectional elevation view, taken along the second direction, illustrating the semiconductor device of FIG. 5A.

FIG. 5A is a fragmentary cross sectional elevation view, taken along the first direction, illustrating a semiconductor device of the first embodiment in a step subsequent to the step of FIG. 4A involved in the method of forming the semiconductor device of FIGS. 13A and 13B. FIG. 5B is a fragmentary cross sectional elevation view, taken along the second direction, illustrating the semiconductor device of FIG. 5A.

An oxide film is formed entirely over the semiconductor substrate. A chemical mechanical polishing process for polishing the oxide film is carried out using the silicon nitride film 4 as a stopper to planarize the oxide film, thereby forming an inter-layer insulator 22.

Figure 6A:
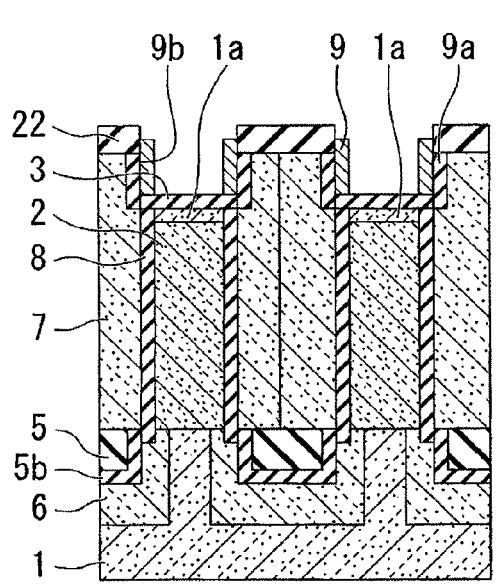
FIG. 6A is a fragmentary cross sectional elevation view, taken along the first direction, illustrating a semiconductor device of the first embodiment in a step subsequent to the step of FIG. 5A involved in the method of forming the semiconductor device of FIGS. 13A and 13B.
Figure 6B:
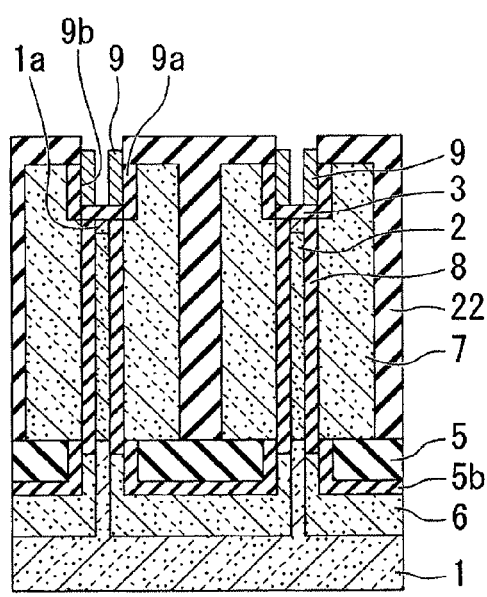
FIG. 6B is a fragmentary cross sectional elevation view, taken along the second direction, illustrating the semiconductor device of FIG. 6A.

FIG. 6A is a fragmentary cross sectional elevation view, taken along the first direction, illustrating a semiconductor device of the first embodiment in a step subsequent to the step of FIG. 5A involved in the method of forming the semiconductor device of FIGS. 13A and 13B. FIG. 6B is a fragmentary cross sectional elevation view, taken along the second direction, illustrating the semiconductor device of FIG. 6A.

The silicon nitride film 4 is removed by a wet etching process to form grooves 9b. The side walls of the upper portions of the polysilicon gate electrodes 7 are exposed to the grooves 9b. The side walls of the upper portions of the polysilicon gate electrodes 7 are oxidized to form oxide films 9a on the side walls of the upper portions of the polysilicon gate electrodes 7. The gate electrodes 7 are separated by the oxide films 9a from the grooves 9b. A silicon nitride film is formed along the thermal oxide film 3, the oxide films 9a, and the inter-layer insulator 22. The thickness of the silicon nitride film may be, but is not limited to, 10 nm. The silicon nitride film is etched back, thereby forming silicon nitride side walls 9. The silicon nitride side walls 9 extend along the oxide films 9a. The silicon nitride side walls 9 extend along the side walls of the grooves 9b. The tops of the silicon nitride side walls 9 are lower in level than the top of the inter-layer insulator 22 and higher in level than the tops of the polysilicon gate electrodes 7.

Figure 7A:
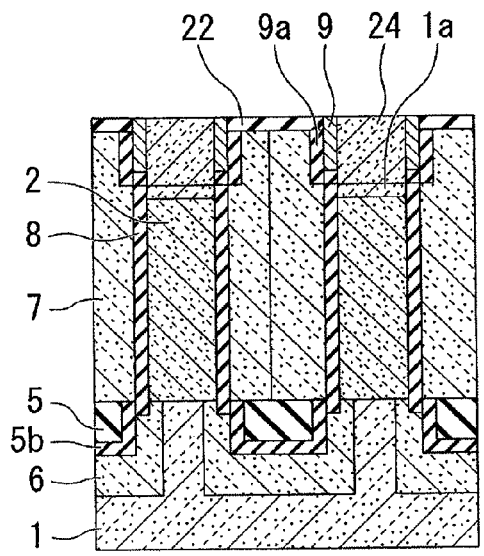
FIG. 7A is a fragmentary cross sectional elevation view, taken along the first direction, illustrating a semiconductor device of the first embodiment in a step subsequent to the step of FIG. 6A involved in the method of forming the semiconductor device of FIGS. 13A and 13B.
Figure 7B:
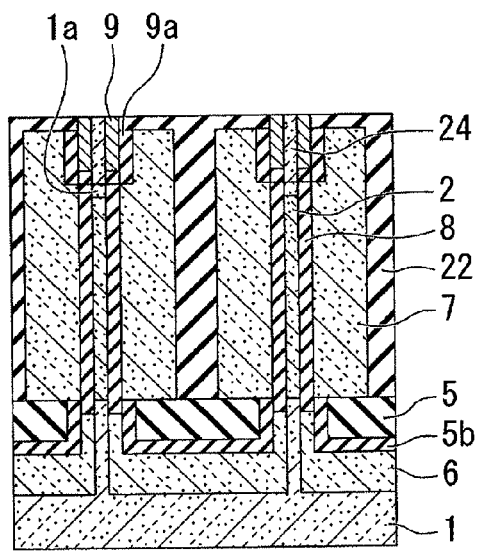
FIG. 7B is a fragmentary cross sectional elevation view, taken along the second direction, illustrating the semiconductor device of FIG. 7A.

FIG. 7A is a fragmentary cross sectional elevation view, taken along the first direction, illustrating a semiconductor device of the first embodiment in a step subsequent to the step of FIG. 6A involved in the method of forming the semiconductor device of FIGS. 13A and 13B. FIG. 7B is a fragmentary cross sectional elevation view, taken along the second direction, illustrating the semiconductor device of FIG. 7A.

A dry etching process is carried out to remove the oxide films 3 so that the non-doped silicon regions 1a are exposed. A selective epitaxial growth is carried out to form selective epitaxial layers 24 on the exposed surfaces of the non-doped silicon regions 1a. The selective epitaxial layers 24 are then planarized. The selective epitaxial layers 24 can be made of a polysilicon film. The thickness of the selective epitaxial layers 24 may be, but is not limited to, 20 nm.

Figure 8A:
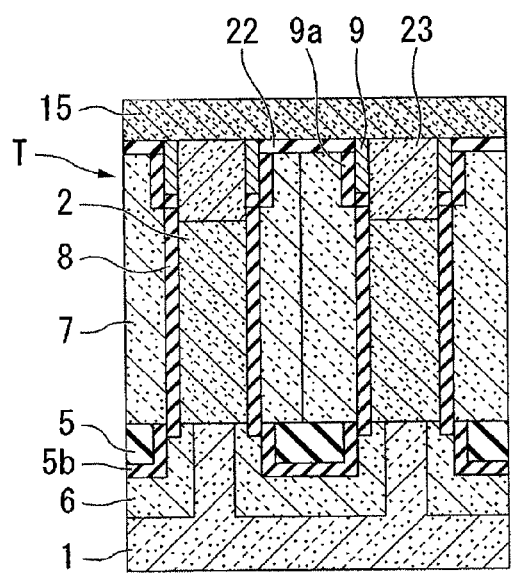
FIG. 8A is a fragmentary cross sectional elevation view, taken along the first direction, illustrating a semiconductor device of the first embodiment in a step subsequent to the step of FIG. 7A involved in the method of forming the semiconductor device of FIGS. 13A and 13B.
Figure 8B:
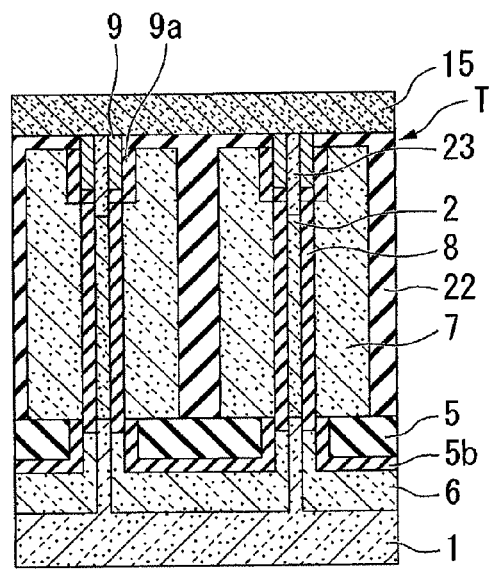
FIG. 8B is a fragmentary cross sectional elevation view, taken along the second direction, illustrating the semiconductor device of FIG. 8A.

FIG. 8A is a fragmentary cross sectional elevation view, taken along the first direction, illustrating a semiconductor device of the first embodiment in a step subsequent to the step of FIG. 7A involved in the method of forming the semiconductor device of FIGS. 13A and 13B. FIG. 8B is a fragmentary cross sectional elevation view, taken along the second direction, illustrating the semiconductor device of FIG. 8A.

A polysilicon film 15 is formed entirely over the semiconductor substrate 1, while carrying out an in-situ doping of phosphorous into the polysilicon film 15. The polysilicon film 15 can be deposited by a chemical vapor deposition process. The thickness of the polysilicon film 15 may be, but is not limited to, 30 nm.

Still another dopant implantation process or a second source/drain implantation process is carried out to selectively introduce a dopant into the selective epitaxial layers 24 and the non-doped silicon regions 1a, thereby forming upper diffusion layers 23. The upper diffusion layers 23 are formed over the pillars 2. For example, the second source/drain implantation process can be realized by, but is not limited to, the followings. Arsenic is implanted at implantation energy of 20 KeV and at a dose of $1E15/cm^2$. The oxide films that are not illustrated and extend along the side walls of the pillars 2 are then removed by a wet etching process, so that the side walls of the pillars 2 are exposed.

As a result, the vertical transistors T are formed, which each include the lower diffusion layer 6, the pillar 2, and the upper diffusion layer 23.

Figure 9A:
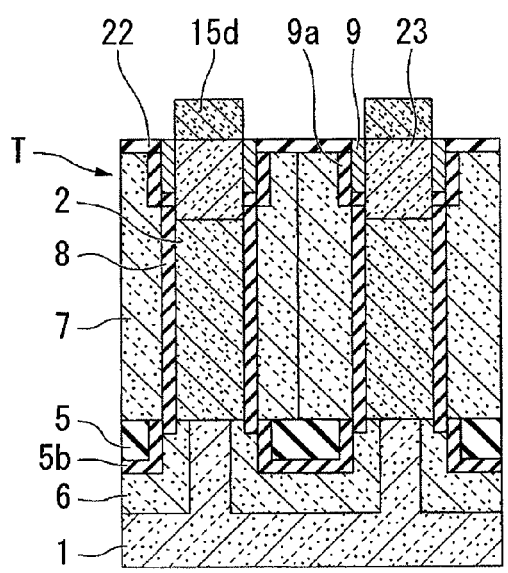
FIG. 9A is a fragmentary cross sectional elevation view, taken along the first direction, illustrating a semiconductor device of the first embodiment in a step subsequent to the step of FIG. 8A involved in the method of forming the semiconductor device of FIGS. 13A and 13B.
Figure 9B:
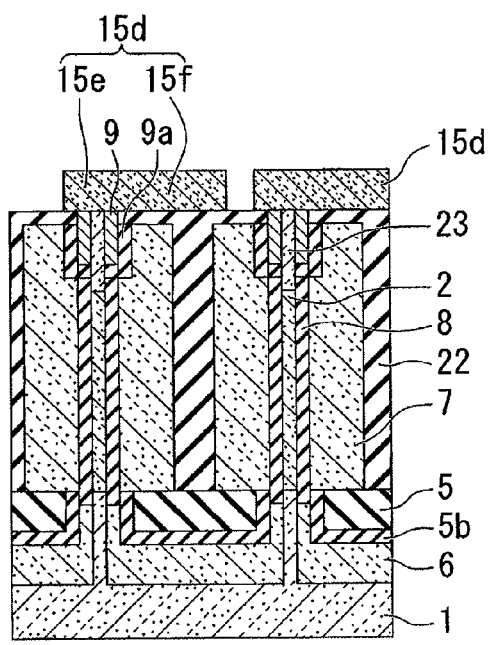
FIG. 9B is a fragmentary cross sectional elevation view, taken along the second direction, illustrating the semiconductor device of FIG. 9A.

FIG. 9A is a fragmentary cross sectional elevation view, taken along the first direction, illustrating a semiconductor device of the first embodiment in a step subsequent to the step of FIG. 8A involved in the method of forming the semiconductor device of FIGS. 13A and 13B. FIG. 9B is a fragmentary cross sectional elevation view, taken along the second direction, illustrating the semiconductor device of FIG. 9A.

A resist film is formed over the polysilicon film 15. A lithography process is carried out to pattern the resist film, thereby forming a resist pattern over the polysilicon film 15. A dry etching process is carried out using the resist pattern as a mask to selectively etch the polysilicon film 15, thereby forming conductive pads 15d. The conductive pads 15d may each include, but is not limited to, a transistor connection region 15e and a contact region 15f. The transistor connection region 15e overlaps the vertical transistor T in plan view. The contact region 15f does not overlap the vertical transistor T in plan view. The resist pattern is removed.

Figure 10A:
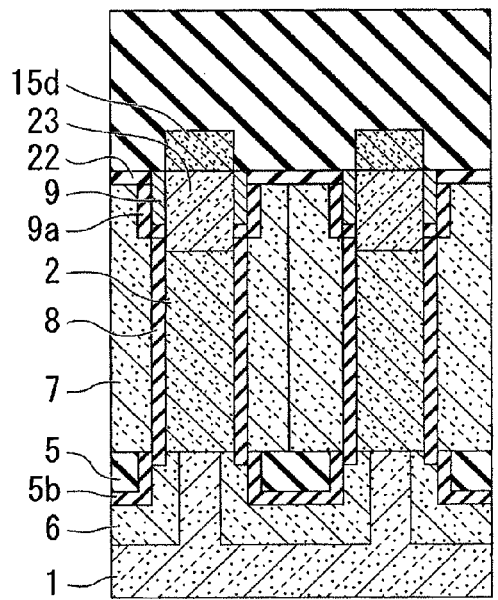
FIG. 10A is a fragmentary cross sectional elevation view, taken along the first direction, illustrating a semiconductor device of the first embodiment in a step subsequent to the step of FIG. 9A involved in the method of forming the semiconductor device of FIGS. 13A and 13B.
Figure 10B:
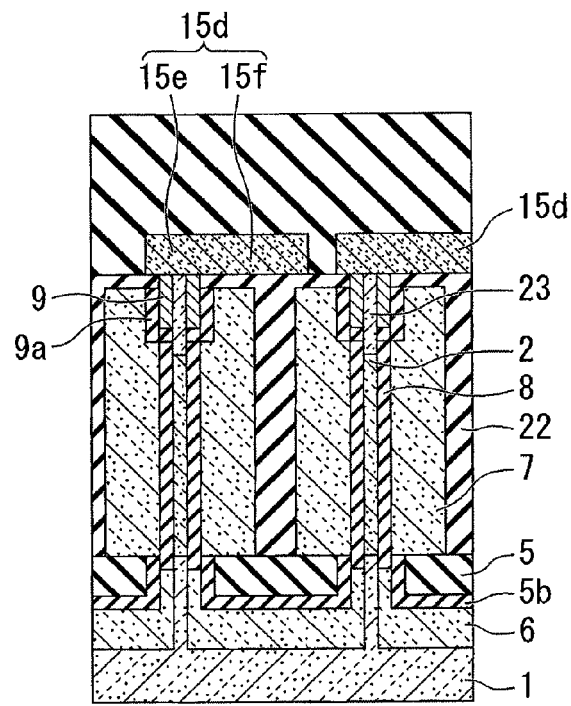
FIG. 10B is a fragmentary cross sectional elevation view, taken along the second direction, illustrating the semiconductor device of FIG. 10A.

FIG. 10A is a fragmentary cross sectional elevation view, taken along the first direction, illustrating a semiconductor device of the first embodiment in a step subsequent to the step of FIG. 9A involved in the method of forming the semiconductor device of FIGS. 13A and 13B. FIG. 10B is a fragmentary cross sectional elevation view, taken along the second direction, illustrating the semiconductor device of FIG. 10A.

An inter-layer insulator 11 is formed over the conductive pads 15d and the inter-layer insulator 22. The inter-layer insulator 11 can be formed by a sputtering method. A chemical mechanical polishing process is then carried out to planarize the inter-layer insulator 11.

Figure 11A:
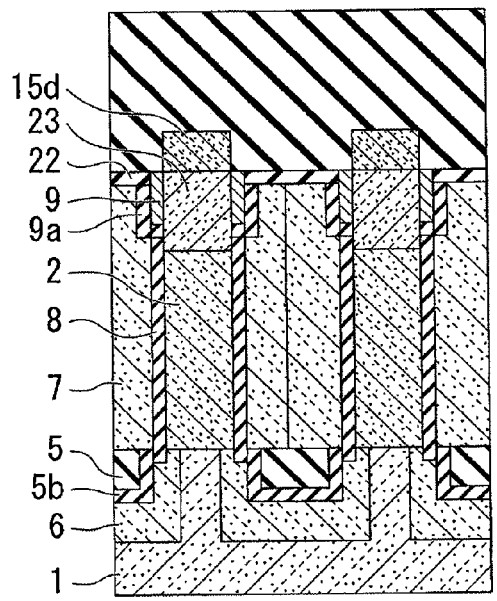
FIG. 11A is a fragmentary cross sectional elevation view, taken along the first direction, illustrating a semiconductor device of the first embodiment in a step subsequent to the step of FIG. 10A involved in the method of forming the semiconductor device of FIGS. 13A and 13B.
Figure 11B:
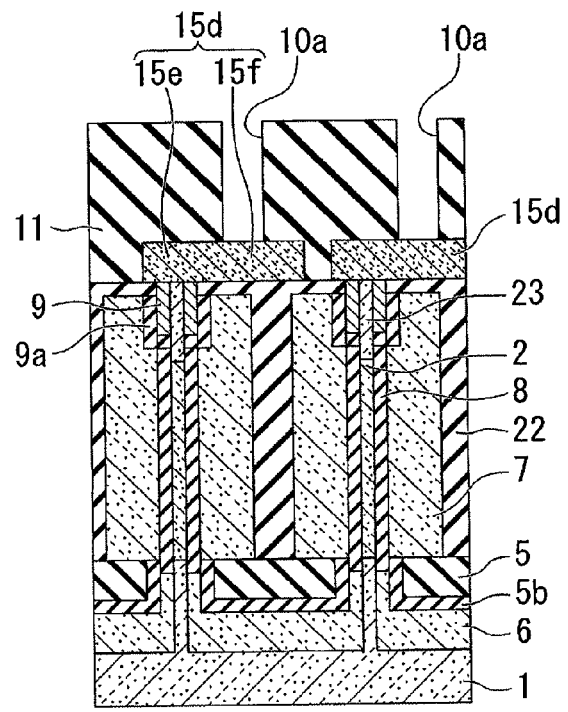
FIG. 11B is a fragmentary cross sectional elevation view, taken along the second direction, illustrating the semiconductor device of FIG. 11A.

FIG. 11A is a fragmentary cross sectional elevation view, taken along the first direction, illustrating a semiconductor device of the first embodiment in a step subsequent to the step of FIG. 10A involved in the method of forming the semiconductor device of FIGS. 13A and 13B. FIG. 11B is a fragmentary cross sectional elevation view, taken along the second direction, illustrating the semiconductor device of FIG. 11A.

A resist film is formed over the inter-layer insulator 11. A lithography process is carried out to pattern the resist film, thereby forming a resist pattern over the inter-layer insulator 11. A dry etching process is carried out using the resist pattern as a mask to selectively etch the inter-layer insulator 11, thereby forming contact holes 10a in the inter-layer insulator 11. The contact holes 10a are positioned over parts of the conductive pads 15d. The contact holes 10a are each positioned over a part of the transistor connection region 15e and a part of the contact region 15f. The resist film is then removed. The inter-layer insulator 11 has the contact holes 10a which expose the parts of the conductive pads 15d. The contact holes 10a each expose a part of the transistor connection region 15e and a part of the contact region 15f.

Figure 12A:
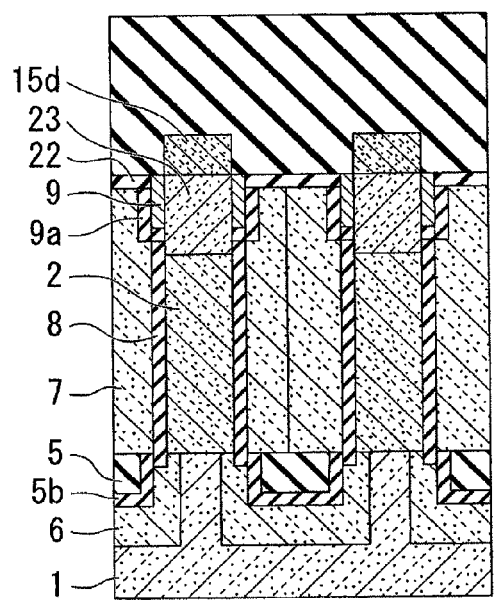
FIG. 12A is a fragmentary cross sectional elevation view, taken along the first direction, illustrating a semiconductor device of the first embodiment in a step subsequent to the step of FIG. 11A involved in the method of forming the semiconductor device of FIGS. 13A and 13B.
Figure 12B:
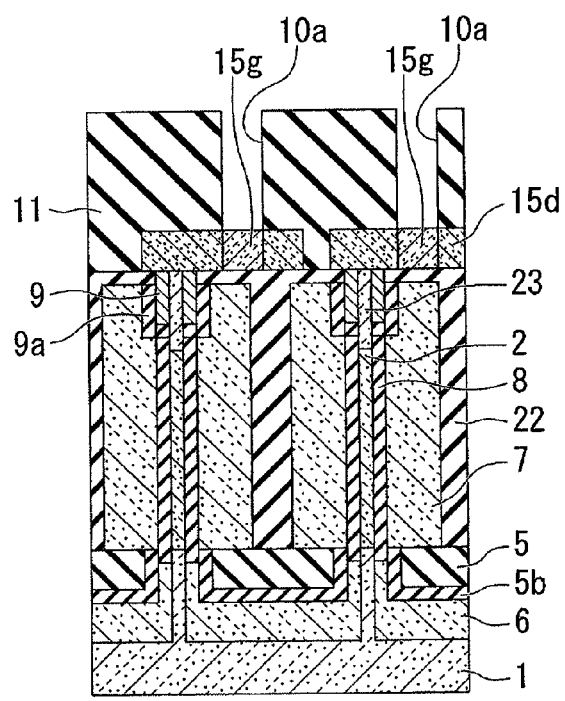
FIG. 12B is a fragmentary cross sectional elevation view, taken along the second direction, illustrating the semiconductor device of FIG. 12A.

FIG. 12A is a fragmentary cross sectional elevation view, taken along the first direction, illustrating a semiconductor device of the first embodiment in a step subsequent to the step of FIG. 11A involved in the method of forming the semiconductor device of FIGS. 13A and 13B. FIG. 12B is a fragmentary cross sectional elevation view, taken along the second direction, illustrating the semiconductor device of FIG. 12A.

The conductive pads 15d are reduced in its resistivity. Yet another dopant implantation process or a contact implantation process is carried out using the inter-layer insulator 11 with the contact holes 10a as a mask to selectively introduce a dopant into the conductive pads 15d, thereby forming doped regions 15g in the conductive pads 15d. Namely, the contact implantation process is carried out to introduce the dopant through the contact holes 10a into the exposed parts of the transistor connection region 15e and the exposed part of the contact region 15f, thereby forming the doped regions 15g in the transistor connection region 15e and the doped regions 15g in the contact region 15f. The contact implantation process can be carried out by using phosphorous as the dopant at implantation energy of 20 KeV and at a dose of $3E16/cm^2$.

With reference again to FIGS. 13A and 13B, a heat treatment is carried out to diffuse the dopant from the doped regions 15g to the entire region of the conductive pads 15d, and activate the polysilicon of the conductive pads 15d, thereby reducing the resistance of the conductive pads 15d. Diffusion of the dopant to the entire region of the conductive pads 15d and activation of the polysilicon of the conductive pads 15d results in forming the conductive pads 15a. The conductive pads 15a are electrically connected to the upper diffusion layers 23. The conductive pad 15a each includes, but is not limited to, a transistor connection region 15b and a contact region 15c. The transistor connection region 15b overlaps the vertical transistor T in plan view. The contact region 15c does not overlap the vertical transistor T in plan view as shown in FIGS. 13A, 13B and 15.

As shown in FIGS. 13A, 13B and 16, the contact holes 10a are filled with a conductive material, thereby forming contacts 10 in contact holes 10a. The contacts 10 are electrically connected to the conductive pads 15a. As shown in FIG. 16, the contacts 10 may each have a generally circular shape in plan view. As shown in FIG. 16, the contacts 10 may each be disposed over a part of the contact region 15c and a part of the transistor connection region 15b of the conductive pads 15a. This arrangement of the contact 10 overlapping entirely the contact region 15c of the conductive pads 15a can be more effective to reduce or prevent the punch-through effects which would be caused by the contact implantation and/or the source/drain implantation.

As shown in FIGS. 13A, 13B and 16, the semiconductor device includes the conductive pad 15a and the contact 10. The conductive pad 15a includes, but is not limited to, the transistor connection region 15b and the contact region 15c. The transistor connection region 15b overlaps the vertical transistor T in plan view. The transistor connection region 15b is eclectically connected to the vertical transistor T. The contact region 15c does not overlap the vertical transistor T in plan view. The contact 10 is electrically connected to the conductive pads 15a. The contact 10 is disposed over the contact region 15c of the conductive pads 15a. The conductive pads 15a can be formed by selectively introducing a dopant using the inter-layer insulator 11 with the contact holes 10a as a mask and by diffusing the dopant. These processes for forming the conductive pads 15a can not prevent that the dopant penetrates the upper diffusion layers 13 and reaches the pillars 2, thereby reducing or preventing any punch-through problem. This allows the vertical transistor T to show high performance.

The conductive pad 15a is disposed between the contact 10 and the upper diffusion layers 23 being positioned over the pillar 2. The conductive pad 15a can be formed by selectively introducing a dopant using the inter-layer insulator 11 with the contact holes 10a as a mask and by diffusing the dopant. The conductive pad 15a can allow that the contact 10 does not overlap in plan view the upper diffusion layers 23 of the vertical transistor T, through the contact 10 is electrically connected through the conductive pad 15a to the upper diffusion layers 23 of the vertical transistor T. This makes it possible to reduce the amount of a dopant to be introduced into the pillar 2 which provides the channel of the vertical transistor T.

Differently from this embodiment, if no conductive pad 15a were provided between the contact 10 and the upper diffusion layers 23 being positioned over the pillar 2, then the dopant to would reach the pillars 2. Once the dopant would be doped into the pillar 2, a punch through phenomenon may be caused in the vertical transistor T. The conductive pad 15a can reduce the amount of a dopant to be introduced into the pillar 2 which provides the channel of the vertical transistor T, as compared to when no conductive pad 15a is provided, wherein the vertical transistor T is positioned directly under the contact 10. Differently from this embodiment, it is assumed that no conductive pad 15a was provided between the contact 10 and the upper diffusion layers 23 being positioned over the pillar 2. It is assumed that the vertical transistor T is positioned directly under the contact 10. In this case, the contact implantation process is carried out for introducing a dopant directly into the upper portion of the vertical transistor T. This may allow that the dopant to would reach the pillars 2. Once the dopant would be doped into the pillar 2, a punch through phenomenon may be caused in the vertical transistor T.

In accordance with this embodiment, the conductive pad 15a is disposed between the contact 10 and the upper diffusion layer 23 being positioned over the pillar 2. The contact 10 is connected through the conductive pad 15a to the upper diffusion layer 23 being positioned over the pillar 2. The contact 10 is connected through the conductive pad 15a to the upper portion of the vertical transistor T. The contact 10 is positioned mainly and directly over the contact region 15c of the conductive pad 15a. The upper diffusion layer 23 being positioned over the pillar 2 is positioned mainly and directly under the transistor connection region 15b of the conductive pad 15a. The contact 10 is electrically connected through the conductive pad 15a to the upper diffusion layer 23 and the pillar 2 of the vertical transistor T. The conductive pad 15a allows that the contact 10 does not largely overlap the upper diffusion layer 23 and the pillar 2 of the vertical transistor T. The conductive pad 15a can reduce an overlapping area in plan view between the contact 10 and the upper diffusion layer 23 and the pillar 2 of the vertical transistor T. The conductive pad 15a can allow the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact 10 and the vertical transistor T results as follows. Almost no amount or a reduced amount of a dopant is introduced into the vertical transistor T during the contact implantation process, even if a sufficiently large amount of a dopant is introduced into the conductive pad 15a during the contact implantation process. The conductive pad 15a is sufficiently reduced in its contact resistance with the contact 10. Any punch through due to the contact implantation process can be avoided effectively. Thus, the vertical transistor T can show high performances.

As shown in FIGS. 13A, 13B, 15 and 16, the semiconductor device includes conductive pad 15a which further includes the transistor connection region 15b and the contact region 15c. The transistor connection region 15b overlaps the vertical transistor T in plan view. The contact region 15c does not overlap the vertical transistor T in plan view. It is possible to adjust or modify the shape and the dimension of the conductive pads 15a, particularly, the shape and the dimension of the contact region 15c of the conductive pad 15a. Adjustment or modification to the shape and the dimension of the conductive pad 15a, particularly, the contact region 15c can adjust or modify the overlapping area in plan view between the contact 10 and the upper diffusion layer 23 and the pillar 2 of the vertical transistor T. The conductive pad 15a ensures the electrical connection between the contact 10 and the upper diffusion layer 23 and the pillar 2 of the vertical transistor T, while avoiding that a certain amount of a dopant is introduced into the upper diffusion layer 23 and the pillar 2 of the vertical transistor T during the contact implantation process. Any punch through due to the contact implantation process can be avoided effectively. Thus, the vertical transistor T can show high performances. The conductive pad 15a can keep a sufficiently high design flexibility of the semiconductor device.

In accordance with this embodiment, the pad formation process is that the conductive pad 15d including the transistor connection region 15e and the contact region 15f is formed so that the transistor connection region 15e overlaps the vertical transistor T in plan view, while the contact region 15f does not overlap the vertical transistor T in plan view. The resistance reduction processes include the contact implantation process and the diffusion of the dopant. At lest a part of the transistor connection region 15e is covered by the inter-layer insulator 11 having the contact holes 10a. The contact implantation process is carried out using the inter-layer insulator 11 with the contact holes 10a as a mask to selectively introduce a dopant into the conductive pads 15d, thereby forming doped regions 15g in the conductive pads 15d. The heat treatment is carried out to diffuse the dopant from the doped regions 15g to the entire region of the conductive pads 15d, and activate the polysilicon of the conductive pads 15d, thereby reducing the resistance of the conductive pads 15d. The contact formation process is that the contacts 10 are formed in contact holes 10a. The contacts 10 are disposed over the contact region 15f of the conductive pad 15d. The contact implantation process is carried out to introduce a dopant through the contact hole 10a into the doped regions 15g in the conductive pads 15d. The contact hole 10a does not largely overlap or does not overlap the vertical transistor T. The conductive pads 15d including the transistor connection region 15e and the contact region 15f can reduce an overlapping area in plan view between the contact hole 10a and the upper diffusion layer 23 and the pillar 2 of the vertical transistor T. The conductive pad 15d can allow the contact hole 10a does not overlap the upper diffusion layer 23 and the pillar 2 of the vertical transistor T. Reduction of the overlapping area in plan view between the contact hole 10a and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact hole 10a and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact hole 10a and the vertical transistor T results as follows. Almost no amount or a reduced amount of a dopant is introduced into the vertical transistor T during the contact implantation process, even if a sufficiently large amount of a dopant is introduced into the conductive pad 15a during the contact implantation process. The conductive pad 15a is sufficiently reduced in its contact resistance with the contact 10. Any punch through due to the contact implantation process can be avoided effectively. Thus, the vertical transistor T can show high performances.

Second Embodiment

Figure 23A:
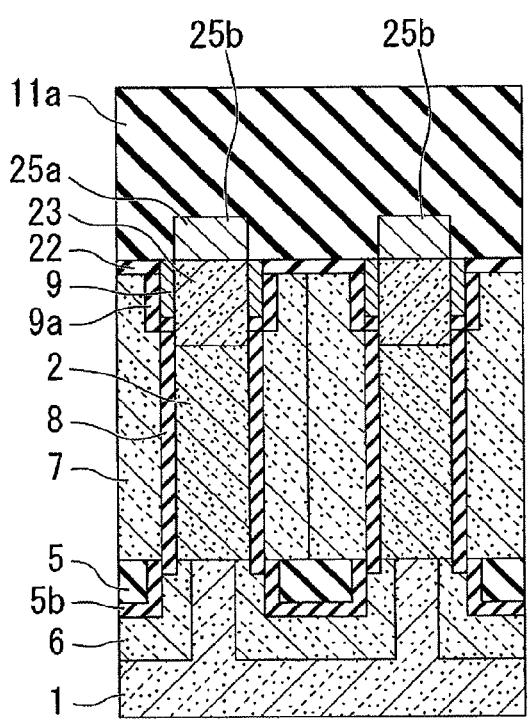
FIG. 23A is a fragmentary cross sectional elevation view, taken along a first direction, illustrating a semiconductor device in a second embodiment in accordance with the present invention.
Figure 23B:
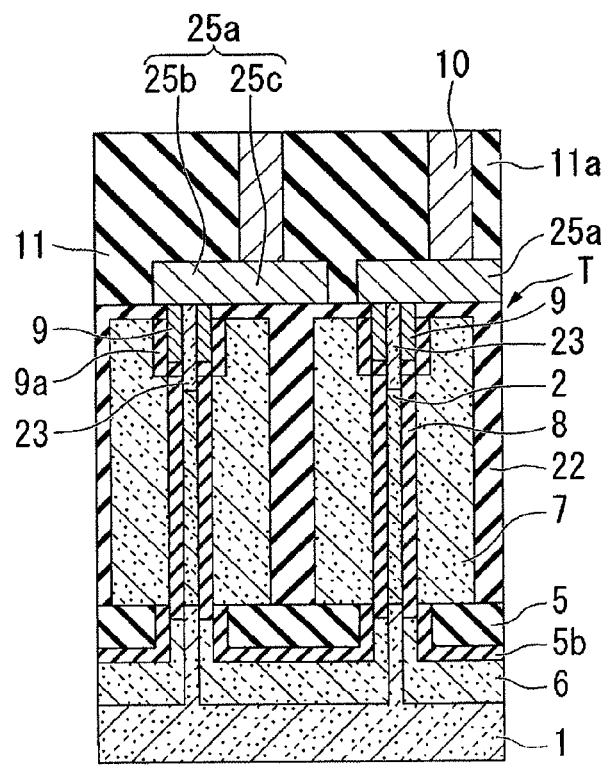
FIG. 23B is a fragmentary cross sectional elevation view, taken along a second direction perpendicular to the first direction, illustrating the semiconductor device of FIG. 23A.

FIG. 23A is a fragmentary cross sectional elevation view, taken along a first direction, illustrating a semiconductor device in a second embodiment in accordance with the present invention. FIG. 23B is a fragmentary cross sectional elevation view, taken along a second direction perpendicular to the first direction, illustrating the semiconductor device of FIG. 23A.

The semiconductor device shown in FIGS. 23A and 23B is different from the semiconductor device shown in FIGS. 13A and 13B only in that conductive pads 25a are formed by reducing resistance of selective epitaxial silicon layers.

As shown in FIGS. 23A, 23B, 15 and 16, the semiconductor device may include conductive pads 25a. The conductive pads 25a are disposed over the upper diffusion layers 23. The upper diffusion layers 23 are upper portions of the vertical transistor T. The conductive pads 25a may be formed of, but are not limited to, an epitaxial silicon layer. The conductive pads 25a may each have, but is not limited to, a generally L-shape in plan view as shown in FIGS. 15 and 16. The conductive pads 25a may each include, but is not limited to, a transistor connection region 25b and a contact region 25c. The transistor connection region 25b overlaps the vertical transistor T in plan view. The contact region 25c does not overlap the vertical transistor T in plan view as shown in FIGS. 23A, 23B and 15.

As shown in FIGS. 13A, 13B and 16, the semiconductor device may include contacts 10 which are electrically connected to the conductive pads 25a. The contacts 10 can be made of a conductive material. As shown in FIG. 16, the contacts 10 may each have a generally circular shape in plan view. As shown in FIG. 16, the contacts 10 may each be disposed over the contact region 25c and a part of the transistor connection region 25b of the conductive pads 25a. It is also possible that the contacts 10 may each overlap only the contact region 25c but does not overlap the transistor connection region 25b of the conductive pads 25a.

The contacts 10 may each overlap at least a part of the contact region 25c of the conductive pads 25a. This arrangement of the contact 10 overlapping at least a part of the contact region 25c of the conductive pads 25a can be effective to reduce or prevent the punch-through effects which would be caused by the contact implantation and/or the source/drain implantation. The contacts 10 may each overlap entirely the contact region 25c of the conductive pads 25a. This arrangement of the contact 10 overlapping entirely the contact region 25c of the conductive pads 25a can be more effective to reduce or prevent the punch-through effects which would be caused by the contact implantation and/or the source/drain implantation.

The contact 10 overlapping at least a part of the contact region 25c of the conductive pads 25a can be formed by making a contact hole 10a which is positioned over the at least part of the contact region 25c of the conductive pads 25a so that the at least part of the contact region 25c is exposed through the contact hole 10a. The contact 10 overlapping entirely the contact region 25c of the conductive pads 25a can be formed by making a contact hole 10a which is positioned over entirely the contact region 25c of the conductive pads 25a so that the contact region 25c is entirely exposed through the contact hole 10a.

The semiconductor device as described with reference to FIGS. 23A, 23B, 14, 25 and 16 can be formed by, but not limited to, the following processes.

The same processes as described with reference to FIGS. 1A, 1B, 2A, 2B, 3A, 3B, 4A, 4B, 5A, 5B, 6A, 6B, 7A and 7B are also carried out in this embodiment. The selective epitaxial layers 24 are planarized as shown in FIGS. 7A and 7B.

FIG. 17A is a fragmentary cross sectional elevation view, taken along the first direction, illustrating a semiconductor device of the second embodiment in a step involved in a method of forming the semiconductor device of FIG. 23A. FIG. 17B is a fragmentary cross sectional elevation view, taken along the second direction, illustrating the semiconductor device of FIG. 23A.

A silicon epitaxial growth process is carried out to form a selective epitaxial silicon layer 25 entirely over the semiconductor substrate 1. The silicon epitaxial growth process can be carried out at 800° C.

FIG. 18A is a fragmentary cross sectional elevation view, taken along the first direction, illustrating a semiconductor device of the second embodiment in a step subsequent to the step of FIG. 17A involved in the method of forming the semiconductor device of FIGS. 23A and 23B. FIG. 18B is a fragmentary cross sectional elevation view, taken along the second direction, illustrating the semiconductor device of FIG. 18A.

The dopant implantation process or the source/drain implantation process is carried out to selectively introduce a dopant into the selective epitaxial silicon layer 25 and the non-doped silicon regions 1a, thereby forming upper diffusion layers 23. The upper diffusion layers 23 are formed over the pillars 2. For example, the second source/drain implantation process can be realized by, but is not limited to, the followings. Arsenic is implanted at implantation energy of 20 KeV and at a dose of $1E25/cm^2$. As a result, the vertical transistor T is formed, which includes the lower diffusion layer 6, the pillar 2, and the upper diffusion layer 23.

Figure 19A:
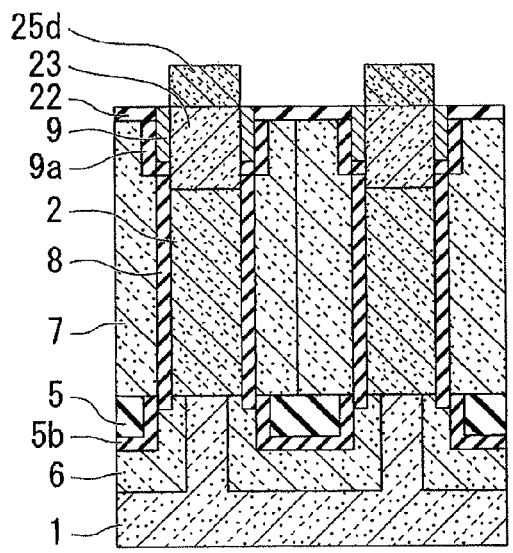
FIG. 19A is a fragmentary cross sectional elevation view, taken along the first direction, illustrating a semiconductor device of the second embodiment in a step subsequent to the step of FIG. 18A involved in the method of forming the semiconductor device of FIGS. 23A and 23B.
Figure 19B:
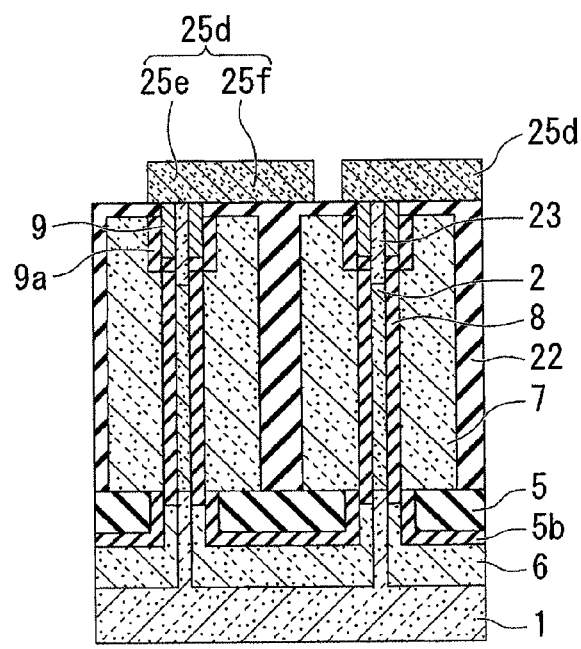
FIG. 19B is a fragmentary cross sectional elevation view, taken along the second direction, illustrating the semiconductor device of FIG. 19A.

FIG. 19A is a fragmentary cross sectional elevation view, taken along the first direction, illustrating a semiconductor device of the second embodiment in a step subsequent to the step of FIG. 18A involved in the method of forming the semiconductor device of FIGS. 23A and 23B. FIG. 19B is a fragmentary cross sectional elevation view, taken along the second direction, illustrating the semiconductor device of FIG. 19A.

A resist film is formed over the selective epitaxial silicon layer 25. A lithography process is carried out to pattern the resist film, thereby forming a resist pattern over the selective epitaxial silicon layer 25. A dry etching process is carried out using the resist pattern as a mask to selectively etch the selective epitaxial silicon layer 25, thereby forming conductive pads 25d. The conductive pads 25d may each include, but is not limited to, a transistor connection region 25e and a contact region 25f. The transistor connection region 25e overlaps the vertical transistor T in plan view. The contact region 25f does not overlap the vertical transistor T in plan view. The resist pattern is removed.

Figure 20A:
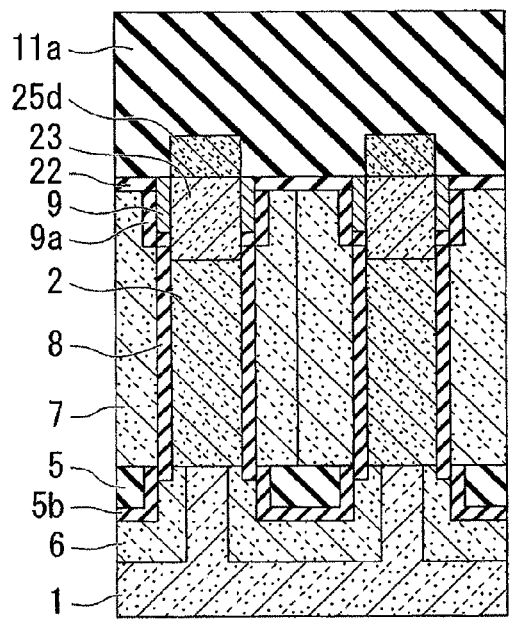
FIG. 20A is a fragmentary cross sectional elevation view, taken along the first direction, illustrating a semiconductor device of the second embodiment in a step subsequent to the step of FIG. 19A involved in the method of forming the semiconductor device of FIGS. 23A and 23B.
Figure 20B:
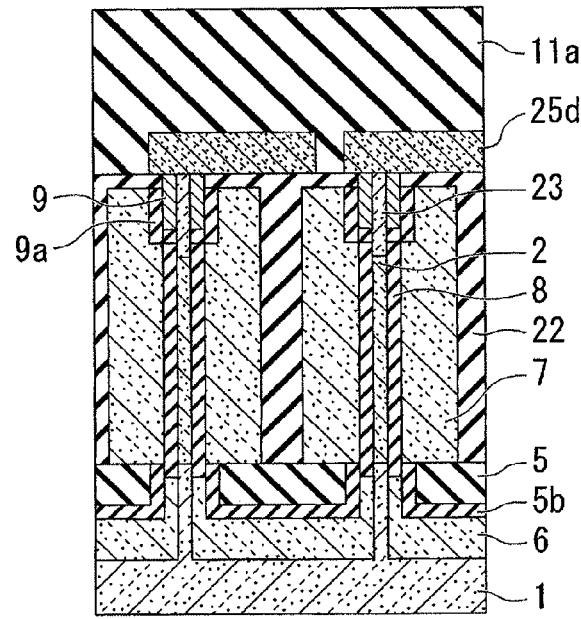
FIG. 20B is a fragmentary cross sectional elevation view, taken along the second direction, illustrating the semiconductor device of FIG. 20A.

FIG. 20A is a fragmentary cross sectional elevation view, taken along the first direction, illustrating a semiconductor device of the second embodiment in a step subsequent to the step of FIG. 19A involved in the method of forming the semiconductor device of FIGS. 23A and 23B. FIG. 20B is a fragmentary cross sectional elevation view, taken along the second direction, illustrating the semiconductor device of FIG. 20A.

An inter-layer insulator 11a is formed over the conductive pads 25d and the inter-layer insulator 22. The inter-layer insulator 11a can be formed by a sputtering method. A chemical mechanical polishing process is then carried out to planarize the inter-layer insulator 11a.

Figure 21A:
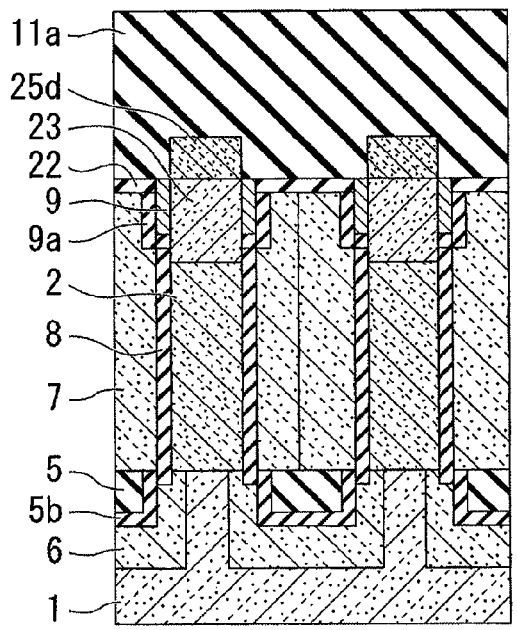
FIG. 21A is a fragmentary cross sectional elevation view, taken along the first direction, illustrating a semiconductor device of the second embodiment in a step subsequent to the step of FIG. 20A involved in the method of forming the semiconductor device of FIGS. 23A and 23B.
Figure 21B:
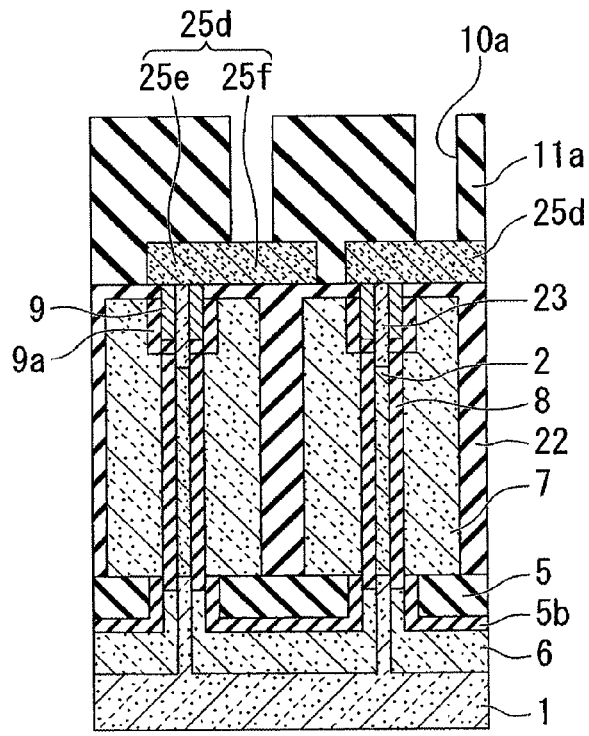
FIG. 21B is a fragmentary cross sectional elevation view, taken along the second direction, illustrating the semiconductor device of FIG. 21A.

FIG. 21A is a fragmentary cross sectional elevation view, taken along the first direction, illustrating a semiconductor device of the second embodiment in a step subsequent to the step of FIG. 20A involved in the method of forming the semiconductor device of FIGS. 23A and 23B. FIG. 21B is a fragmentary cross sectional elevation view, taken along the second direction, illustrating the semiconductor device of FIG. 21A.

A resist film is formed over the inter-layer insulator 11a. A lithography process is carried out to pattern the resist film, thereby forming a resist pattern over the inter-layer insulator 11a. A dry etching process is carried out using the resist pattern as a mask to selectively etch the inter-layer insulator 11a, thereby forming contact holes 10a in the inter-layer insulator 11a. The contact holes 10a are positioned over parts of the conductive pads 25d. The contact holes 10a are each positioned over a part of the transistor connection region 25e and a part of the contact region 25f. The resist film is then removed. The inter-layer insulator 11a has the contact holes 10a which expose the parts of the conductive pads 25d. The contact holes 10a each expose a part of the transistor connection region 25e and a part of the contact region 25f.

Figure 22A:
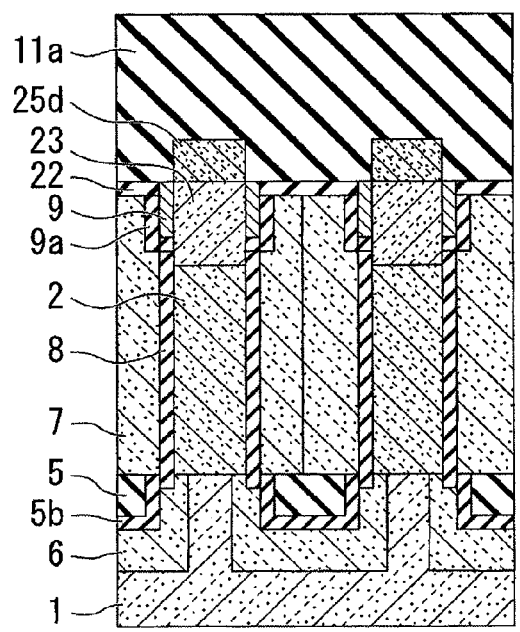
FIG. 22A is a fragmentary cross sectional elevation view, taken along the first direction, illustrating a semiconductor device of the second embodiment in a step subsequent to the step of FIG. 21A involved in the method of forming the semiconductor device of FIGS. 23A and 23B.
Figure 22B:
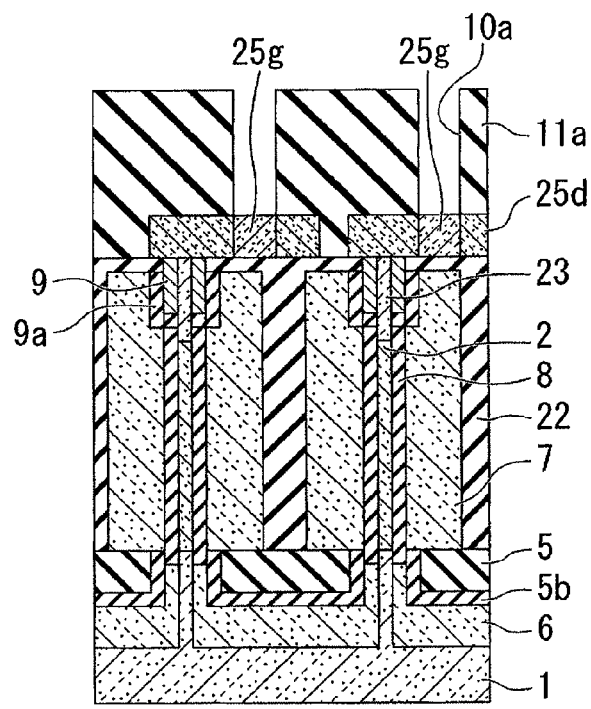
FIG. 22B is a fragmentary cross sectional elevation view, taken along the second direction, illustrating the semiconductor device of FIG. 22A.

FIG. 22A is a fragmentary cross sectional elevation view, taken along the first direction, illustrating a semiconductor device of the second embodiment in a step subsequent to the step of FIG. 21A involved in the method of forming the semiconductor device of FIGS. 23A and 23B. FIG. 22B is a fragmentary cross sectional elevation view, taken along the second direction, illustrating the semiconductor device of FIG. 22A.

The conductive pads 25d are reduced in its resistivity. Another dopant implantation process or a contact implantation process is carried out using the inter-layer insulator 11a with the contact holes 10a as a mask to selectively introduce a dopant into the conductive pads 25d, thereby forming doped regions 25g in the conductive pads 25d. Namely, the contact implantation process is carried out to introduce the dopant through the contact holes 10a into the exposed parts of the transistor connection region 25e and the exposed part of the contact region 25f, thereby forming the doped regions 25g in the transistor connection region 25e and the doped regions 25g in the contact region 25f. The contact implantation process can be carried out by using phosphorous as the dopant at implantation energy of 20 KeV and at a dose of $3E16/cm^2$.

Figure 25:
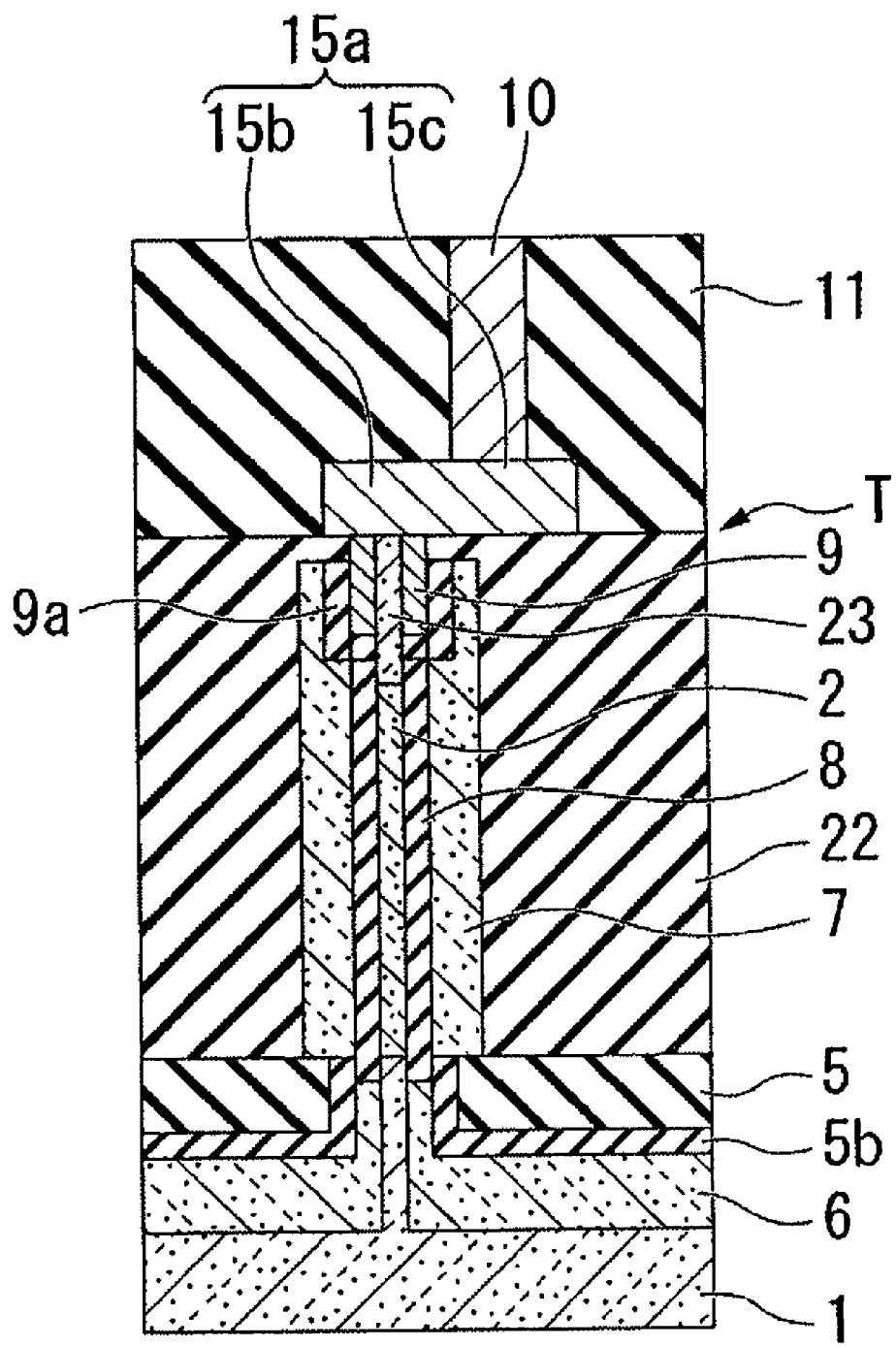
FIG. 25 is a fragmentary cross sectional elevation view, taken along the second direction, illustrating a semiconductor device in a first modification to the first, second third embodiments in accordance with the present invention.

With reference again to FIGS. 23A and 23B, a heat treatment is carried out to diffuse the dopant from the doped regions 25g to the entire region of the conductive pads 25d, and activate the polysilicon of the conductive pads 25d, thereby reducing the conductive pads 25d. Diffusion of the dopant to the entire region of the conductive pads 25d and activation of the polysilicon of the conductive pads 25d results in forming the conductive pads 25a. The conductive pads 25a are electrically connected to the upper diffusion layers 23. The conductive pad 25a each includes, but is not limited to, a transistor connection region 25b and a contact region 25c. The transistor connection region 25b overlaps the vertical transistor T in plan view. The contact region 25c does not overlap the vertical transistor T in plan view as shown in FIGS. 23A, 23B and 25.

As shown in FIGS. 23A, 23B and 16, the contact holes 10a are filled with a conductive material, thereby forming contacts 10 in contact holes 10a. The contacts 10 are electrically connected to the conductive pads 25a. As shown in FIG. 16, the contacts 10 may each have a generally circular shape in plan view. As shown in FIG. 16, the contacts 10 may each be disposed over a part of the contact region 25c and a part of the transistor connection region 25b of the conductive pads 25a. This arrangement of the contact 10 overlapping entirely the contact region 25c of the conductive pads 25a can be more effective to reduce or prevent the punch-through effects which would be caused by the contact implantation and/or the source/drain implantation.

In accordance with this embodiment, the conductive pad 25a is disposed between the contact 10 and the upper diffusion layer 23 being positioned over the pillar 2. The contact 10 is connected through the conductive pad 25a to the upper diffusion layer 23 being positioned over the pillar 2. The contact 10 is connected through the conductive pad 25a to the upper portion of the vertical transistor T. The contact 10 is positioned mainly and directly over the contact region 25c of the conductive pad 25a. The upper diffusion layer 23 being positioned over the pillar 2 is positioned mainly and directly under the transistor connection region 25b of the conductive pad 25a. The contact 10 is electrically connected through the conductive pad 25a to the upper diffusion layer 23 and the pillar 2 of the vertical transistor T. The conductive pad 25a allows that the contact 10 does not largely overlap the upper diffusion layer 23 and the pillar 2 of the vertical transistor T. The conductive pad 25a can reduce an overlapping area in plan view between the contact 10 and the upper diffusion layer 23 and the pillar 2 of the vertical transistor T. The conductive pad 25a can allow that the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact 10 and the vertical transistor T results as follows. Almost no amount or a reduced amount of a dopant is introduced into the vertical transistor T during the contact implantation process, even if a sufficiently large amount of a dopant is introduced into the conductive pad 25a during the contact implantation process. The conductive pad 25a is sufficiently reduced in its contact resistance with the contact 10. Any punch through due to the contact implantation process can be avoided effectively. Thus, the vertical transistor T can show high performances.

As shown in FIGS. 23A, 23B, 15 and 16, the semiconductor device includes conductive pad 25a which further includes the transistor connection region 25b and the contact region 25c. The transistor connection region 25b overlaps the vertical transistor T in plan view. The contact region 25c does not overlap the vertical transistor T in plan view. It is possible to adjust or modify the shape and the dimension of the conductive pads 25a, particularly, the shape and the dimension of the contact region 25c of the conductive pad 25a. Adjustment or modification to the shape and the dimension of the conductive pad 25a, particularly, the contact region 25c can adjust or modify the overlapping area in plan view between the contact 10 and the upper diffusion layer 23 and the pillar 2 of the vertical transistor T. The conductive pad 25a ensures the electrical connection between the contact 10 and the upper diffusion layer 23 and the pillar 2 of the vertical transistor T, while avoiding that a certain amount of a dopant is introduced into the upper diffusion layer 23 and the pillar 2 of the vertical transistor T during the contact implantation process. Any punch through due to the contact implantation process can be avoided effectively. Thus, the vertical transistor T can show high performances. The conductive pad 25a can keep a sufficiently high design flexibility of the semiconductor device.

In accordance with this embodiment, the pad formation process is that the conductive pad 25d including the transistor connection region 25e and the contact region 25f is formed so that the transistor connection region 25e overlaps the vertical transistor T in plan view, while the contact region 25f does not overlap the vertical transistor T in plan view. The resistance reduction processes include the contact implantation process and the diffusion of the dopant. At lest a part of the transistor connection region 25e is covered by the inter-layer insulator 11a having the contact holes 10a. The contact implantation process is carried out using the inter-layer insulator 11a with the contact holes 10a as a mask to selectively introduce a dopant into the conductive pads 25d, thereby forming doped regions 25g in the conductive pads 25d. The heat treatment is carried out to diffuse the dopant from the doped regions 25g to the entire region of the conductive pads 25d, and activate the polysilicon of the conductive pads 25d, thereby reducing the conductive pads 25d. The contact formation process is that the contacts 10 are formed in contact holes 10a. The contacts 10 are disposed over the contact region 25f of the conductive pad 25d. The contact implantation process is carried out to introduce a dopant through the contact hole 10a into the doped regions 25g in the conductive pads 25d. The contact hole 10a does not largely overlap or does not overlap the vertical transistor T. The conductive pads 25d including the transistor connection region 25e and the contact region 25f can reduce an overlapping area in plan view between the contact hole 10a and the upper diffusion layer 23 and the pillar 2 of the vertical transistor T. The conductive pad 25d can allow the contact hole 10a does not overlap the upper diffusion layer 23 and the pillar 2 of the vertical transistor T. Reduction of the overlapping area in plan view between the contact hole 10a and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact hole 10a and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact hole 10a and the vertical transistor T results as follows. Almost no amount or a reduced amount of a dopant is introduced into the vertical transistor T during the contact implantation process, even if a sufficiently large amount of a dopant is introduced into the conductive pad 25a during the contact implantation process. The conductive pad 25a is sufficiently reduced in its contact resistance with the contact 10. Any punch through due to the contact implantation process can be avoided effectively. Thus, the vertical transistor T can show high performances.

It is possible as a modification that the conductive pad 25a may be made of other epitaxial semiconductor such as selective epitaxial SiGe instead of the selective epitaxial silicon layer.

Third Embodiment

Figure 24:
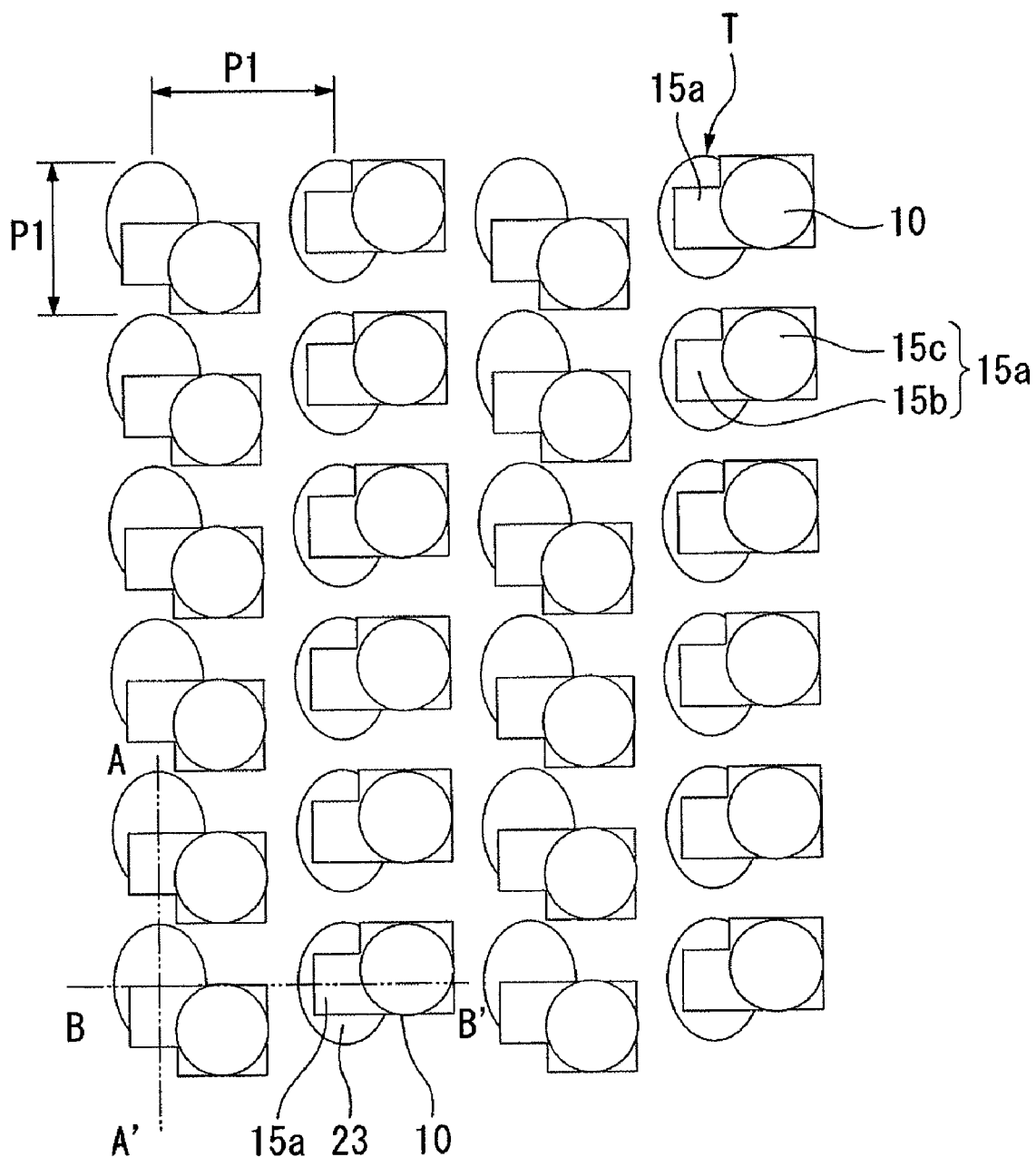
FIG. 24 is a fragmentary plan view illustrating a semiconductor device with an array of upper diffusion layers, conductive pads, and contacts in accordance with a third embodiment of the present invention.

FIG. 24 is a fragmentary plan view illustrating a semiconductor device with an array of upper diffusion layers, conductive pads, and contacts in accordance with a third embodiment of the present invention.

The semiconductor device shown in FIG. 24 is different from the semiconductor device shown in FIGS. 13A, 13B, 16A and 16B only in the in-plan layout of the conductive pads 15a and the contacts 10 with reference to the vertical transistors T.

As shown in FIG. 24, the semiconductor device may have a two-dimensional array of sets of the vertical transistor T, the conductive pad 15a and the contact 10 from the two-dimensional array. The two-dimensional array shown in FIG. 24 may also be a lattice with constant pitches, such as a matrix array. Each set of the vertical transistor T, the conductive pad 15a and the contact 10 may have the same arrangements of the conductive pad 15a and the contact 10 with respect to the vertical transistor T as shown in FIG. 24.

The vertical transistors T are two-dimensionally arrayed in matrix. The conductive pads 15a and the contacts 10 are arrayed regularly in the first direction or the line A-A' of FIG. 24. The conductive pads 15a and the contacts 10 are arrayed staggeringly in the second direction or the line B-B' of FIG. 24. The vertical transistors T are two-dimensionally arrayed regularly both in the first direction and in the second direction. The conductive pads 15a and the contacts 10 are two-dimensionally arrayed regularly in the first direction and staggeringly in the second direction so as to reduce the minimum pitch of the two-dimensional array. The sets of the conductive pads 15a and the contacts 10 are displaced relative to each other between two adjacent alignments extending in the first direction. The vertical transistors T can be arrayed in matrix at a constant pitch P1 both in the first and second directions. The constant pitch P1 may be equal to 2F, where F represents the feature size or one half of the pitch of bit lines. The sets of the conductive pads 15a and the contacts 10 are arrayed staggeringly in the second direction so that the sets of the conductive pads 15a and the contacts 10 are displaced relative each other by F/2 or one half of the feature size in the first direction between two adjacent alignments extending in the first direction. On one alignment extending in the first direction, the sets of the conductive pads 15a and the contacts 10 are displaced in the first direction by F/4 or one quarter of the feature size from their original positions shown in FIG. 16. On an adjacent alignment extending in the first direction, the sets of the conductive pads 15a and the contacts 10 are displaced in the anti-parallel direction to the first direction by F/4 or one quarter of the feature size from their original positions shown in FIG. 16. Between two adjacent alignments extending in the first direction, the sets of the conductive pads 15a and the contacts 10 are displaced in opposing directions which are anti-parallel to each other and are perpendicular to the second direction. The amounts of the anti-parallel displacements are F/4 or one quarter of the feature size from their original positions shown in FIG. 16, so that the sets of the conductive pads 15a and the contacts 10 are displaced by F/2 or one half of the feature size in the first direction between two adjacent alignments extending in the first direction. This staggered array of the conductive pads 15a and the contacts 10 can keep the maximum distance between two adjacent contacts 10 and also between two adjacent conductive pads 15a, while the vertical transistors T are two-dimensionally arrayed in matrix at the minimum pitch both in the first and second directions. Thus, this staggered array of the conductive pads 15a and the contacts 10 can allow increasing the areas of the contacts 10. Thus, this staggered array of the conductive pads 15a and the contacts 10 can easier ensure the connection between the conductive pads 15a and the contacts 10. If the semiconductor device includes capacitors which are connected through the contacts 10 to the vertical transistors T, then this staggered array of the conductive pads 15a and the contacts 10 can allow increasing the capacity of the capacitors.

The vertical transistors T are two-dimensionally arrayed in matrix. The sets of the conductive pads 15a and the contacts 10 are arrayed regularly in the first direction and staggeringly in the second direction. This staggered array of the conductive pads 15a and the contacts 10 can keep a larger distance between two adjacent contacts 10 and also between two adjacent conductive pads 15a, as compared to the matrix array shown in FIG. 16. This staggered array of the conductive pads 15a and the contacts 10 can easier ensure the connection between the conductive pads 15a and the contacts 10.

The above-described structures related to the conductive pads 15a and 25a in the first, second and third embodiments may be modified to the following.

First Modification to First Through Third Embodiments:

FIG. 25 is a fragmentary cross sectional elevation view, taken along the second direction, illustrating a semiconductor device in a first modification to the first, second third embodiments in accordance with the present invention. The second direction of FIG. 25 is the same as the second direction of FIGS. 13B and 16B. The semiconductor device includes a single set of the vertical transistor T, the conductive pad 15a and the contact 10. There is no array of the plural sets of the vertical transistors T, the conductive pads 15a and the contacts 10 as described in the first, second and third embodiments. Even if the semiconductor device includes a single set of the vertical transistor T, the conductive pad 15a and the contact 10, then the same advantages as described in the first and second embodiments can be taken. The conductive pad 15a can reduce an overlapping area in plan view between the contact 10 and the upper diffusion layer 23 and the pillar 2 of the vertical transistor T. The conductive pad 15a can allow the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

Figure 26:
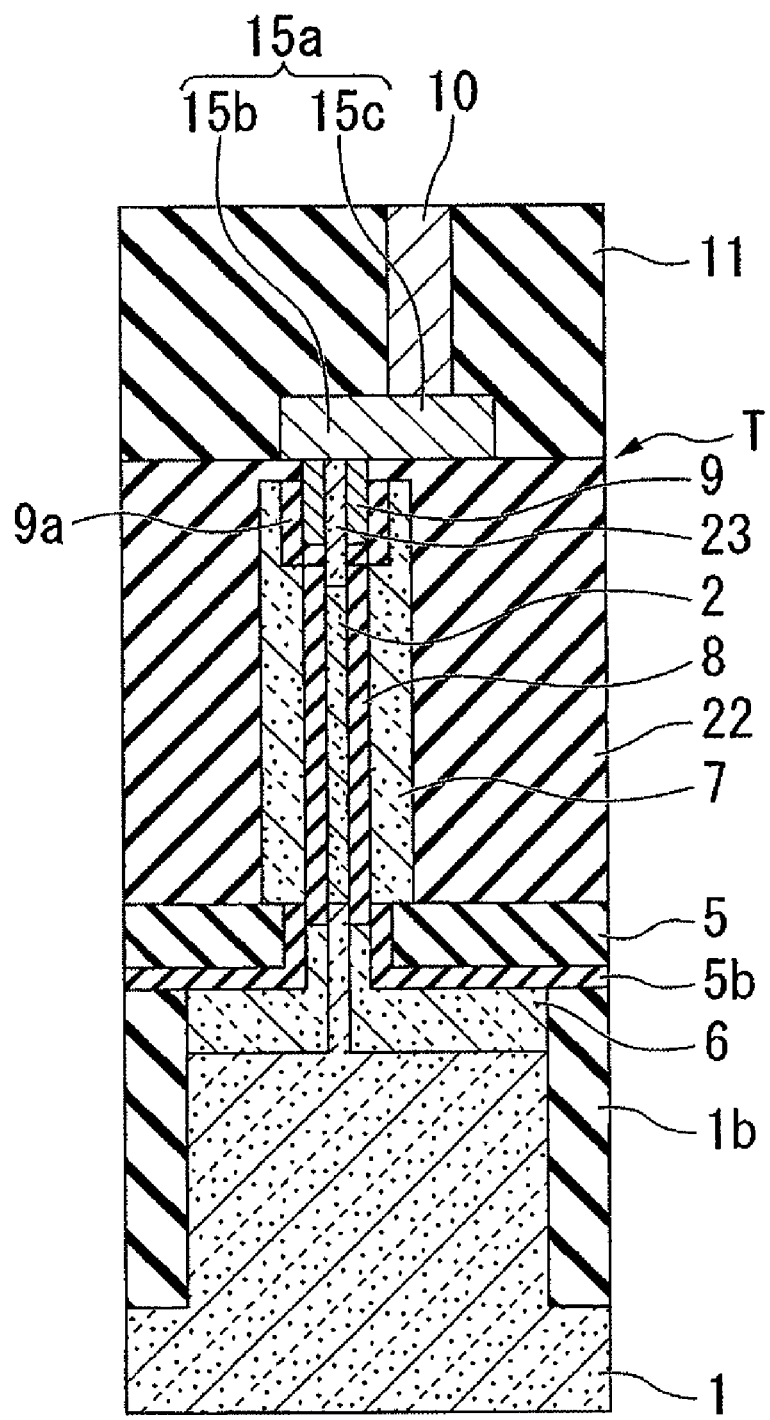
FIG. 26 is a fragmentary cross sectional elevation view, taken along the second direction, illustrating a semiconductor device in a second modification to the first, second third embodiments in accordance with the present invention.

Second Modification to First Through Third Embodiments:

FIG. 26 is a fragmentary cross sectional elevation view, taken along the second direction, illustrating a semiconductor device in a second modification to the first, second third embodiments in accordance with the present invention. The second direction of FIG. 26 is the same as the second direction of FIGS. 13B and 16B.

The semiconductor device includes a single set of the vertical transistor T, the conductive pad 15a and the contact 10. The semiconductor device further includes an isolation 1b which surrounds the vertical transistor T. The isolation 1b is formed in the semiconductor substrate 1. The isolation 1b isolates the vertical transistor T. Even if the semiconductor device includes a single set of the vertical transistor T, the conductive pad 15a and the contact 10 as well as the isolation 1a which surrounds the vertical transistor T, then the same advantages as described in the first and second embodiments can be taken. The conductive pad 15a can reduce an overlapping area in plan view between the contact 10 and the upper diffusion layer 23 and the pillar 2 of the vertical transistor T. The conductive pad 15a can allow the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

Figure 27:
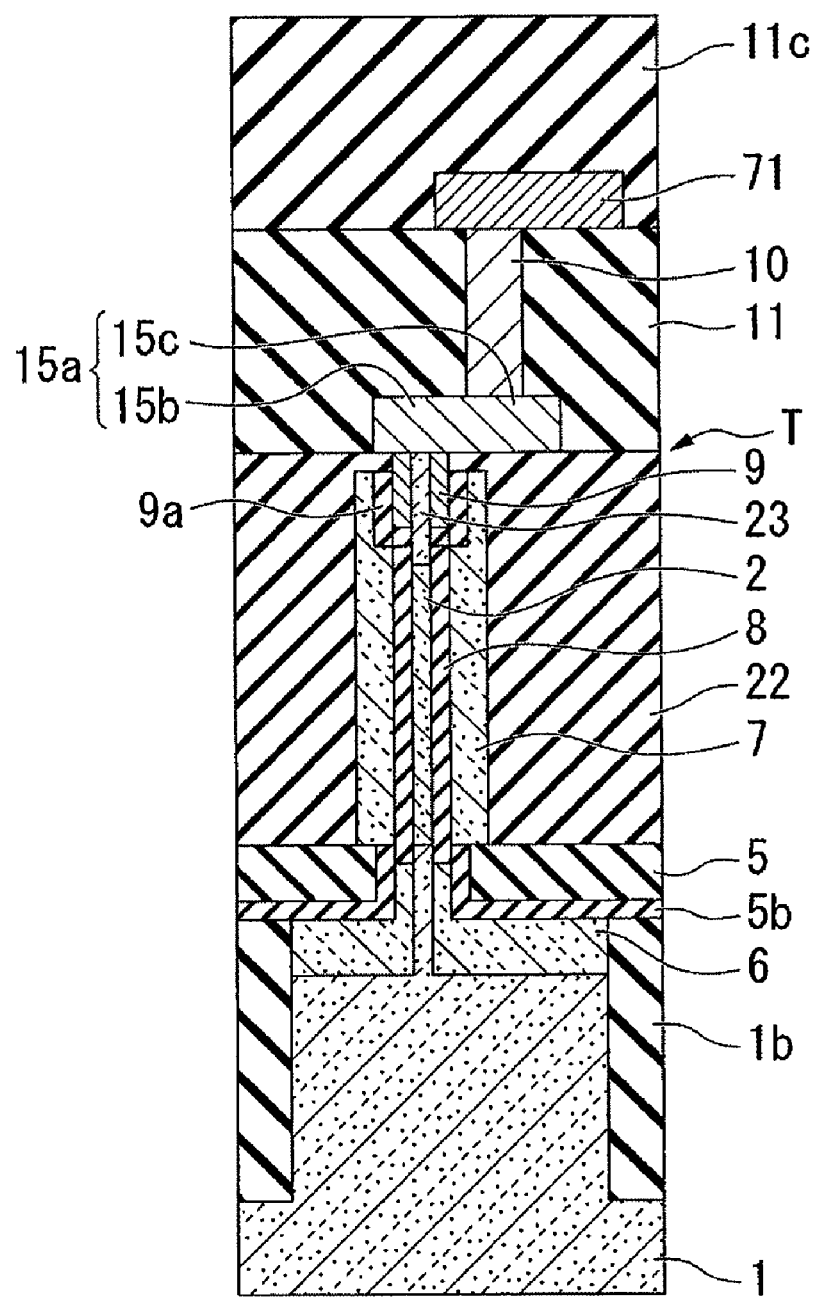
FIG. 27 is a fragmentary cross sectional elevation view, taken along the second direction, illustrating a semiconductor device in a third modification to the first, second third embodiments in accordance with the present invention.

Third Modification to First Through Third Embodiments:

FIG. 27 is a fragmentary cross sectional elevation view, taken along the second direction, illustrating a semiconductor device in a third modification to the first, second third embodiments in accordance with the present invention. The second direction of FIG. 27 is the same as the second direction of FIGS. 13B and 16B.

The semiconductor device includes a single set of the vertical transistor T, the conductive pad 15a and the contact 10. The semiconductor device further includes an isolation 1b which surrounds the vertical transistor T. The semiconductor device furthermore includes a wiring 71 covered by a second inter-layer insulator 11c. The isolation 1b is formed in the semiconductor substrate 1. The isolation 1b isolates the vertical transistor T. The wiring 71 is electrically connected through the contact 10 and the conductive pad 15a to the vertical transistor T. Even if the semiconductor device includes a single set of the vertical transistor T, the conductive pad 15a and the contact 10 as well as the isolation 1a which surrounds the vertical transistor T and the and the wiring 71 electrically connected through the contact 10 and the conductive pad 15a to the vertical transistor T, then the same advantages as described in the first and second embodiments can be taken. The conductive pad 15a can reduce an overlapping area in plan view between the contact 10 and the upper diffusion layer 23 and the pillar 2 of the vertical transistor T. The conductive pad 15a can allow the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

Fourth Modification to First Through Third Embodiments:

FIG. 28A is a fragmentary cross sectional elevation view, taken along a first direction, illustrating a semiconductor device in a fourth modification to the first, second third embodiments in accordance with the present invention. FIG. 28B is a fragmentary cross sectional elevation view, taken along a second direction perpendicular to the first direction, illustrating the semiconductor device of FIG. 28A. The first direction of FIG. 28A is the same as the first direction of FIGS. 13A and 16A. The second direction of FIG. 28B is the same as the second direction of FIGS. 13B and 16B.

The semiconductor device shown in FIGS. 28A and 28B is different from the semiconductor device shown in FIGS. 13A and 13B in that the semiconductor device shown in FIGS. 28A and 28B further include capacitors 72 covered by a second inter-layer insulator 11c. The capacitor 72 is electrically connected through the contact 10 and the conductive pad 15a to the vertical transistor T, so that the semiconductor device performs as a semiconductor memory such as a dynamic random access memory (DRAM). Even if the semiconductor device includes a single set of the vertical transistor T, the conductive pad 15a and the contact 10 as well as the capacitor 72 electrically connected through the contact 10 and the conductive pad 15a to the vertical transistor T, then the same advantages as described in the first and second embodiments can be taken. The conductive pad 15a can reduce an overlapping area in plan view between the contact 10 and the upper diffusion layer 23 and the pillar 2 of the vertical transistor T. The conductive pad 15a can allow the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

The above-described structure of the conductive pad 15a and the contact 10 can be applied to any types of the vertical transistors T such as the vertical MOS transistor. The above-described structure of the conductive pad 15a and the contact 10 can be applied to the semiconductor device including a phase change memory.

Fourth Embodiment

FIG. 34A is a fragmentary cross sectional elevation view, taken along a first direction, illustrating a semiconductor device in a fourth embodiment in accordance with the present invention. FIG. 34B is a fragmentary cross sectional elevation view, taken along a second direction perpendicular to the first direction, illustrating the semiconductor device of FIG. 34A.

The semiconductor device shown in FIGS. 34A and 34B is different from the semiconductor device shown in FIGS. 13A and 13B only in that pad contact layers 23a are additionally disposed between the conductive pads 25a and the upper diffusion layers 23. The pad contact layers 23a are each provided to reduce the contact resistance between the conductive pads 25a and the upper diffusion layers 23.

The semiconductor device as described with reference to FIGS. 34A and 34B can be formed by, but not limited to, the following processes.

The same processes as described with reference to FIGS. 1A, 1B, 2A, 2B, 3A, 3B, 4A, 4B, 5A, 5B, 6A, 6B, 7A and 7B are also carried out in this embodiment. The selective epitaxial layers 24 are planarized as shown in FIGS. 7A and 7B.

FIG. 29A is a fragmentary cross sectional elevation view, taken along the first direction, illustrating a semiconductor device of the fourth embodiment in a step involved in a method of forming the semiconductor device of FIG. 34A. FIG. 29B is a fragmentary cross sectional elevation view, taken along the second direction, illustrating the semiconductor device of FIG. 29A.

A chemical vapor deposition process is carried out to deposit a polysilicon film 15 entirely, while carrying out an in-situ doping of phosphorous into the polysilicon film 15. The thickness of the phosphorous-doped polysilicon film may be, but is not limited to, 30 nm.

FIG. 30A is a fragmentary cross sectional elevation view, taken along the first direction, illustrating a semiconductor device of the fourth embodiment in a step subsequent to the step of FIG. 29A involved in the method of forming the semiconductor device of FIGS. 34A and 34B. FIG. 30B is a fragmentary cross sectional elevation view, taken along the second direction, illustrating the semiconductor device of FIG. 30A.

A resist film is formed over the polysilicon film 15. A lithography process is carried out to pattern the resist film, thereby forming a resist pattern over the polysilicon film 15. A dry etching process is carried out using the resist pattern as a mask to selectively etch the polysilicon film 15, thereby forming conductive pads 15d. The conductive pads 15d may each include, but is not limited to, a transistor connection region 15e and a contact region 15f. The transistor connection region 15e overlaps the vertical transistor T in plan view. The contact region 15f does not overlap the vertical transistor T in plan view. The resist pattern is removed.

Figure 31A:
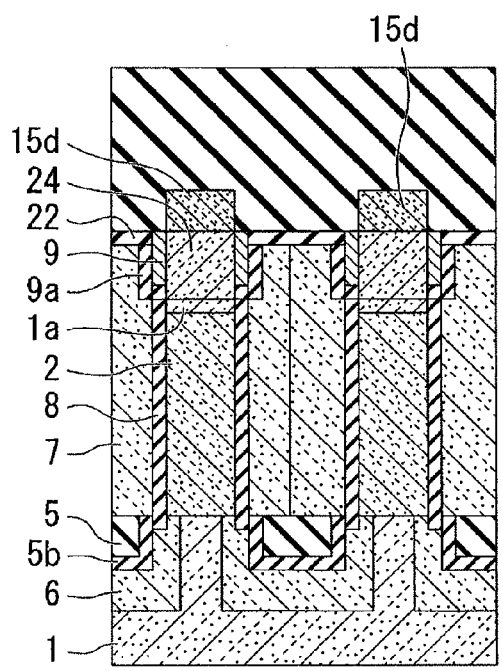
FIG. 31A is a fragmentary cross sectional elevation view, taken along the first direction, illustrating a semiconductor device of the fourth embodiment in a step subsequent to the step of FIG. 30A involved in the method of forming the semiconductor device of FIGS. 34A and 34B.
Figure 31B:
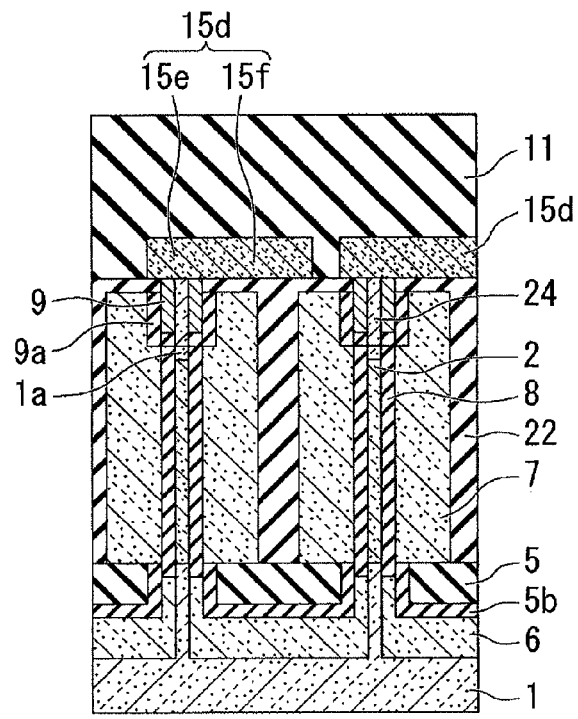
FIG. 31B is a fragmentary cross sectional elevation view, taken along the second direction, illustrating the semiconductor device of FIG. 31A.

FIG. 31A is a fragmentary cross sectional elevation view, taken along the first direction, illustrating a semiconductor device of the fourth embodiment in a step subsequent to the step of FIG. 30A involved in the method of forming the semiconductor device of FIGS. 34A and 34B. FIG. 31B is a fragmentary cross sectional elevation view, taken along the second direction, illustrating the semiconductor device of FIG. 31A.

An inter-layer insulator 11 is formed over the conductive pads 15d and the inter-layer insulator 22. The inter-layer insulator 11 can be formed by a sputtering method. A chemical mechanical polishing process is then carried out to planarize the inter-layer insulator 11.

Figure 32A:
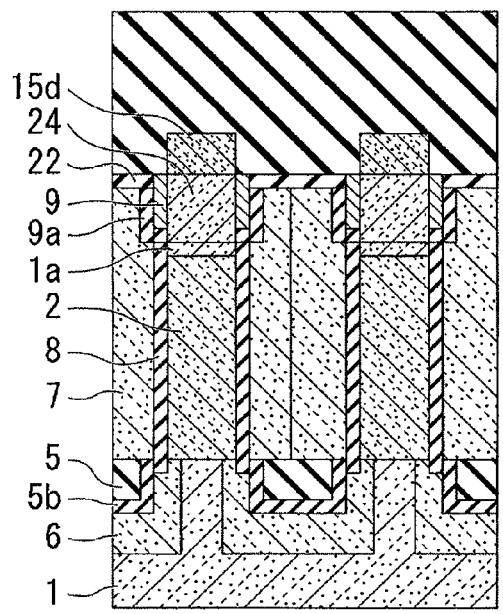
FIG. 32A is a fragmentary cross sectional elevation view, taken along the first direction, illustrating a semiconductor device of the fourth embodiment in a step subsequent to the step of FIG. 31A involved in the method of forming the semiconductor device of FIGS. 34A and 34B.
Figure 32B:
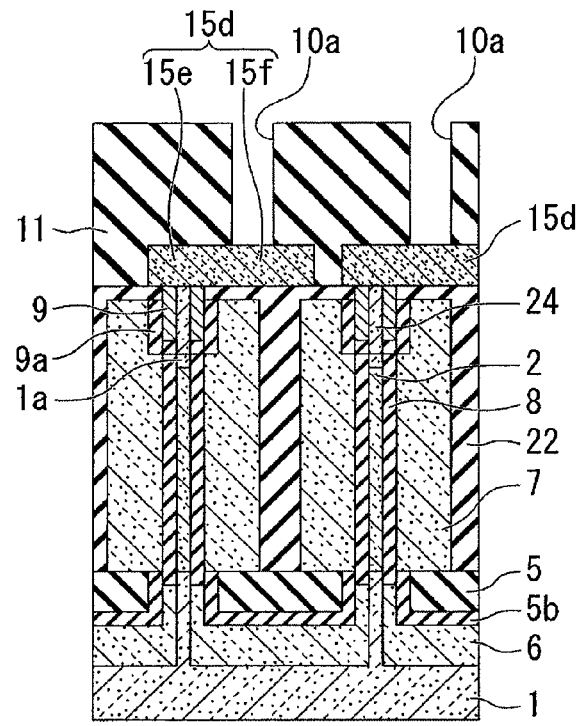
FIG. 32B is a fragmentary cross sectional elevation view, taken along the second direction, illustrating the semiconductor device of FIG. 32A.

FIG. 32A is a fragmentary cross sectional elevation view, taken along the first direction, illustrating a semiconductor device of the fourth embodiment in a step subsequent to the step of FIG. 31A involved in the method of forming the semiconductor device of FIGS. 34A and 34B. FIG. 32B is a fragmentary cross sectional elevation view, taken along the second direction, illustrating the semiconductor device of FIG. 32A.

A resist film is formed over the inter-layer insulator 11. A lithography process is carried out to pattern the resist film, thereby forming a resist pattern over the inter-layer insulator 11. A dry etching process is carried out using the resist pattern as a mask to selectively etch the inter-layer insulator 11, thereby forming contact holes 10a in the inter-layer insulator 11. The contact holes 10a are positioned over parts of the conductive pads 15d. The contact holes 10a are each positioned over a part of the transistor connection region 15e and a part of the contact region 15f. The resist film is then removed. The inter-layer insulator 11 has the contact holes 10a which expose the parts of the conductive pads 15d. The contact holes 10a each expose a part of the transistor connection region 15e and a part of the contact region 15f.

FIG. 33A is a fragmentary cross sectional elevation view, taken along the first direction, illustrating a semiconductor device of the fourth embodiment in a step subsequent to the step of FIG. 32A involved in the method of forming the semiconductor device of FIGS. 34A and 34B. FIG. 33B is a fragmentary cross sectional elevation view, taken along the second direction, illustrating the semiconductor device of FIG. 33A.

The conductive pads 15d are reduced in its resistivity. A dopant implantation process or a contact implantation process is carried out using the inter-layer insulator 11 with the contact holes 10a as a mask to selectively introduce a dopant into the conductive pads 15d, thereby forming doped regions 15g in the conductive pads 15d. Namely, the contact implantation process is carried out to introduce the dopant through the contact holes 10a into the exposed parts of the transistor connection region 15e and the exposed part of the contact region 15f, thereby forming the doped regions 15g in the transistor connection region 15e and the doped regions 15g in the contact region 15f. The contact implantation process can be carried out by using phosphorous as the dopant at implantation energy of 20 KeV and at a dose of $3E16/cm^2$.

With reference again to FIGS. 34A and 34B, a heat treatment is carried out to diffuse the dopant from the doped regions 15g to the entire region of the conductive pads 15d as well as to the entire region of the selective epitaxial layer 24 and the non-doped silicon region 1a, and activate the polysilicon of the conductive pads 15d and the non-doped silicon region 1a, thereby reducing the resistance of the conductive pads 15d as well as reducing the resistances of the selective epitaxial layer 24 and the non-doped silicon region 1a. Diffusion of the dopant and activation of the polysilicon results in transforming the selective epitaxial layer 24 and the non-doped silicon region 1a into the pad contact layer 23a and the upper diffusion layer 23 as well as transforming the conductive pad 15d into the conductive pad 15a. The conductive pad 15a is electrically connected through the pad contact layer 23a to the upper diffusion layers 23. The conductive pad 15a each includes, but is not limited to, a transistor connection region 15b and a contact region 15c. The transistor connection region 15b overlaps the vertical transistor T in plan view. The contact region 15c does not overlap the vertical transistor T in plan view as shown in FIGS. 34A and 34B.

The contact holes 10a are filled with a conductive material, thereby forming contacts 10 in contact holes 10a. The contacts 10 are electrically connected to the conductive pads 25a. The contacts 10 may each be disposed over a part of the contact region 25c and a part of the transistor connection region 25b of the conductive pads 25a. This arrangement of the contact 10 overlapping entirely the contact region 25c of the conductive pads 25a can be more effective to reduce or prevent the punch-through effects which would be caused by the contact implantation and/or the source/drain implantation.

In accordance with this embodiment, the semiconductor device includes the conductive pad 15a which further includes the transistor connection region 15b and the contact region 15c. The transistor connection region 15b overlaps the vertical transistor T in plan view. The contact region 15c does not overlap the vertical transistor T in plan view. The contact 10 is positioned mainly and directly over the contact region 15c of the conductive pad 15a. The upper diffusion layer 23 being positioned over the pillar 2 is positioned mainly and directly under the transistor connection region 15b of the conductive pad 15a. The conductive pad 15a allows that the contact 10 does not largely overlap the upper diffusion layer 23 and the pillar 2 of the vertical transistor T. The conductive pad 15a can reduce an overlapping area in plan view between the contact 10 and the upper diffusion layer 23 and the pillar 2 of the vertical transistor T. The conductive pad 15a can allow that the contact 10 does not overlap the upper diffusion layer 23 and the pillar 2 of the vertical transistor T. Reduction of the overlapping area in plan view between the contact 10 and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact 10 and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact 10 and the vertical transistor T results as follows. Almost no amount or a reduced amount of a dopant is introduced into the vertical transistor T during the contact implantation process, even if a sufficiently large amount of a dopant is introduced into the conductive pad 15a during the contact implantation process. The conductive pad 15a is sufficiently reduced in its contact resistance with the contact 10. Any punch through due to the contact implantation process can be avoided effectively. Thus, the vertical transistor T can show high performances.

The pad contact layer 23a reduces the contact resistance between the conductive pad 25a and the upper diffusion layer 23.

In accordance with this embodiment, the resistance reduction processes include the contact implantation process and the diffusion of the dopant. At lest a part of the transistor connection region 15e is covered by the inter-layer insulator 11 having the contact holes 10a. The contact implantation process is carried out using the inter-layer insulator 11 with the contact holes 10a as a mask to selectively introduce a dopant into the conductive pads 15d, thereby forming doped regions 15g in the conductive pads 15d. The heat treatment is carried out to diffuse the dopant from the doped regions 15g to the entire region of the conductive pads 15d as well as to the entire region of the selective epitaxial layer 24 and the non-doped silicon region 1a. The heat treatment also activates the polysilicon of the conductive pads 15d and the non-doped silicon region 1a, thereby reducing the resistance of the conductive pads 15d. The activation also reduces the resistances of the selective epitaxial layer 24 and the non-doped silicon region 1a. Diffusion of the dopant and activation of the polysilicon results in transforming the selective epitaxial layer 24 and the non-doped silicon region 1a into the pad contact layer 23a and the upper diffusion layer 23 as well as transforming the conductive pad 15d into the conductive pad 15a. The conductive pad 15a is electrically connected through the pad contact layer 23a to the upper diffusion layers 23.

The contact formation process is that the contacts 10 are formed in contact holes 10a. The contacts 10 are disposed over the contact region 15f of the conductive pad 15d. The contact implantation process is carried out to introduce a dopant through the contact hole 10a into the doped regions 15g in the conductive pads 15d. Even the pad contact layer 23a is provided to reduce the contact resistance between the conductive pad 25a and the upper diffusion layer 23, the contact hole 10a does not largely overlap or does not overlap the vertical transistor T. The conductive pads 15d including the transistor connection region 15e and the contact region 15f can reduce an overlapping area in plan view between the contact hole 10a and the upper diffusion layer 23 and the pillar 2 of the vertical transistor T. The conductive pad 15d can allow the contact hole 10a does not overlap the upper diffusion layer 23 and the pillar 2 of the vertical transistor T. Reduction of the overlapping area in plan view between the contact hole 10a and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact hole 10a and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact hole 10a and the vertical transistor T results as follows. Almost no amount or a reduced amount of a dopant is introduced into the vertical transistor T during the contact implantation process, even if a sufficiently large amount of a dopant is introduced into the conductive pad 15a during the contact implantation process. The conductive pad 15a is sufficiently reduced in its contact resistance with the contact 10. Any punch through due to the contact implantation process can be avoided effectively. Thus, the vertical transistor T can show high performances.

Fifth Embodiment

The semiconductor device shown in FIGS. 34A and 34B can be formed by other processes than those described with reference to FIGS. 29A, 29B, 30A, 30B, 31A, 31B, 32A, 32B, 33A and 3313. The semiconductor device shown in FIGS. 34A and 34B can be formed by the following processes.

The same processes as described with reference to FIGS. 29A, 29B, 30A, 30B, 31A, 31B, 32A and 3213 are also carried out in this embodiment. The contact holes 10a are formed in the inter-layer insulator 11. The contact holes 10a are positioned over parts of the conductive pads 15d. The contact holes 10a are each positioned over a part of the transistor connection region 15e and a part of the contact region 15f. The resist film is then removed. The inter-layer insulator 11 has the contact holes 10a which expose the parts of the conductive pads 15d. The contact holes 10a each expose a part of the transistor connection region 15e and a part of the contact region 15f.

Figures 35A, 35B, 36A, 36B:
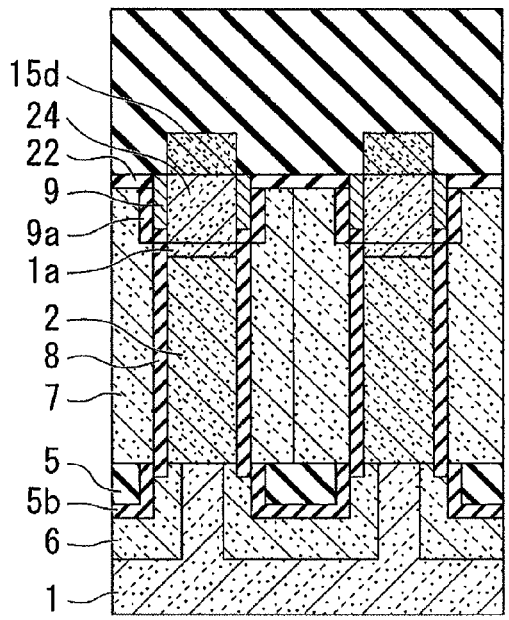
FIG. 35A is a fragmentary cross sectional elevation view, taken along the first direction, illustrating a semiconductor device of the fifth embodiment in a step involved in a method of forming the semiconductor device of FIG. 34A.
FIG. 35B is a fragmentary cross sectional elevation view, taken along the second direction, illustrating the semiconductor device of FIG. 35A.
FIG. 36A is a fragmentary cross sectional elevation view, taken along the first direction, illustrating a semiconductor device of the fifth embodiment in a step subsequent to the step of FIG. 35A involved in the method of forming the semiconductor device of FIGS. 34A and 34B.
FIG. 36B is a fragmentary cross sectional elevation view, taken along the second direction, illustrating the semiconductor device of FIG. 36A.

FIG. 35A is a fragmentary cross sectional elevation view, taken along the first direction, illustrating a semiconductor device of the fifth embodiment in a step involved in a method of forming the semiconductor device of FIG. 34A. FIG. 35B is a fragmentary cross sectional elevation view, taken along the second direction, illustrating the semiconductor device of FIG. 35A.

The conductive pads 15d, and the selective epitaxial layer 24 and the non-doped silicon region 1a are reduced in its resistivity.

A dopant implantation process or a source/drain implantation process is carried out using the inter-layer insulator 11 with the contact holes 10a as a mask to selectively introduce a dopant into the conductive pads 15d, thereby forming doped regions 15h in the conductive pads 15d. Namely, the source/drain implantation process is carried out to introduce the dopant through the contact holes 10a into the exposed parts of the transistor connection region 15e and the exposed part of the contact region 15f, thereby forming the doped regions 15h in the transistor connection region 15e and the doped regions 15h in the contact region 15f. The source/drain implantation process can be carried out by using phosphorous as the dopant at implantation energy of 20 KeV and at a dose of 3E15/cm$^2$.

FIG. 36A is a fragmentary cross sectional elevation view, taken along the first direction, illustrating a semiconductor device of the fifth embodiment in a step subsequent to the step of FIG. 35A involved in the method of forming the semiconductor device of FIGS. 34A and 34B. FIG. 36B is a fragmentary cross sectional elevation view, taken along the second direction, illustrating the semiconductor device of FIG. 36A.

A heat treatment is carried out to diffuse the dopant from the doped regions 15g to the entire region of the conductive pads 15d as well as to a part of the selective epitaxial layer 24, and activate the polysilicon of the conductive pads 15d and the polysilicon of the part of the selective epitaxial layer 24, thereby reducing the resistance of the conductive pads 15d as well as reducing the resistances of the selective epitaxial layer 24. Diffusion of the dopant and activation of the polysilicon results in formation of conductive pads 15m and the upper diffusion layer 23b. When the heat treatment is finished, the upper diffusion layer 23b over the selective epitaxial layer 24 has an insufficient amount of diffused dopant.

Figure 37A:
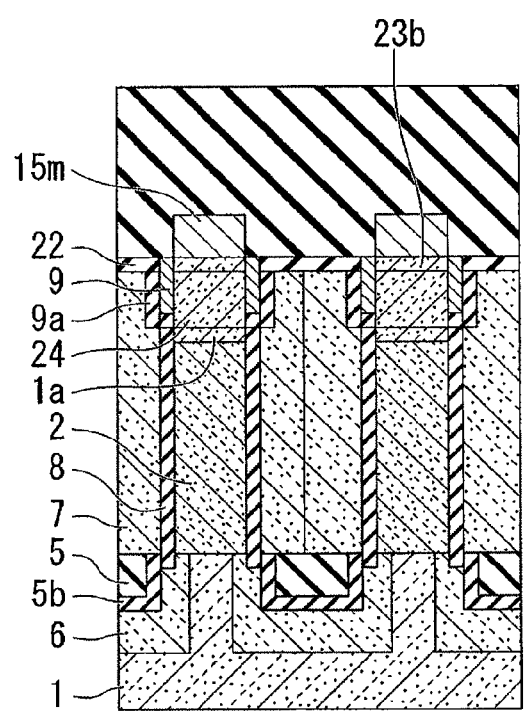
FIG. 37A is a fragmentary cross sectional elevation view, taken along the first direction, illustrating a semiconductor device of the fifth embodiment in a step subsequent to the step of FIG. 36A involved in the method of forming the semiconductor device of FIGS. 34A and 34B.
Figure 37B:
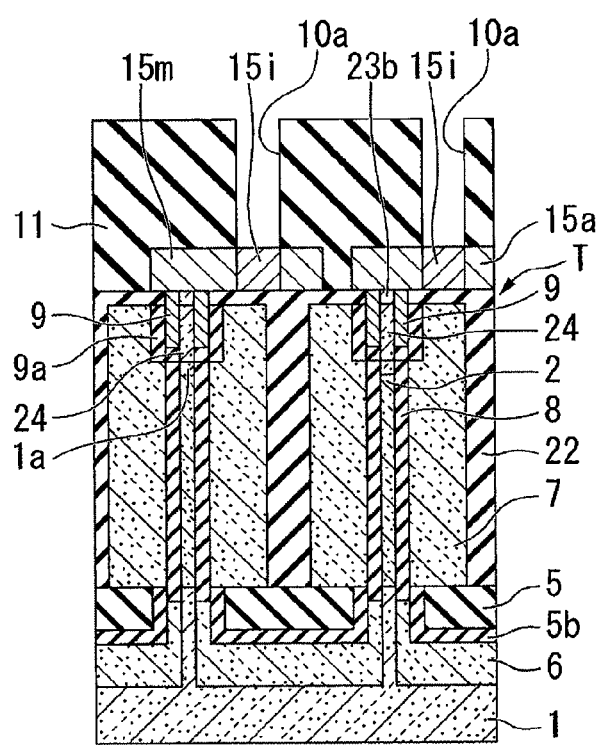
FIG. 37B is a fragmentary cross sectional elevation view, taken along the second direction, illustrating the semiconductor device of FIG. 37A.

FIG. 37A is a fragmentary cross sectional elevation view, taken along the first direction, illustrating a semiconductor device of the fifth embodiment in a step subsequent to the step of FIG. 36A involved in the method of forming the semiconductor device of FIGS. 34A and 34B. FIG. 37B is a fragmentary cross sectional elevation view, taken along the second direction, illustrating the semiconductor device of FIG. 37A.

A further dopant implantation process or a contact implantation process is carried out using the inter-layer insulator 11 with the contact holes 10a as a mask to selectively introduce a dopant into the conductive pads 15m, thereby forming doped regions 15i in the conductive pads 15d. The contact implantation process can be carried out by using phosphorous as the dopant at implantation energy of 20 KeV and at a dose of 3E16/cm$^2$.

With reference again to FIGS. 34A and 34B, a heat treatment is carried out to diffuse the dopant from the doped regions 15i to the entire region of the conductive pads 15m as well as to the entire region of the selective epitaxial layer 24 and the non-doped silicon region 1a, and activate the polysilicon of the conductive pads 15m, the polysilicon of the selective epitaxial layer 24, and the non-doped silicon region 1a, thereby reducing the resistance of the conductive pads 15m as well as reducing the resistances of the selective epitaxial layer 24 and the non-doped silicon region 1a. Diffusion of the dopant and activation of the polysilicon results in transforming the selective epitaxial layer 24 and the non-doped silicon region 1a into the pad contact layer 23a and the upper diffusion layer 23 as well as transforming the conductive pad 15m into the conductive pad 15a. The conductive pad 15a is electrically connected through the pad contact layer 23a to the upper diffusion layers 23. The conductive pad 15a each includes, but is not limited to, a transistor connection region 15b and a contact region 15c. The transistor connection region 15b overlaps the vertical transistor T in plan view. The contact region 15c does not overlap the vertical transistor T in plan view as shown in FIGS. 34A and 34B.

The contact holes 10a are filled with a conductive material, thereby forming contacts 10 in contact holes 10a. The contacts 10 are electrically connected to the conductive pads 15a. The contacts 10 may each be disposed over a part of the contact region 15c and a part of the transistor connection region 15b of the conductive pads 15a. This arrangement of the contact 10 overlapping entirely the contact region 15c of the conductive pads 15a can be more effective to reduce or prevent the punch-through effects which would be caused by the contact implantation and/or the source/drain implantation.

In accordance with this embodiment, the resistance reduction processes include the source/drain implantation process and the subsequent diffusion of the dopant and the contact implantation process and the subsequent diffusion of the dopant. At lest a part of the transistor connection region 15e is covered by the inter-layer insulator 11 having the contact holes 10a. The source/drain implantation process is carried out using the inter-layer insulator 11 with the contact holes 10a as a mask to selectively introduce a dopant into the conductive pads 15d, thereby forming doped regions 15h in the conductive pads 15d. The heat treatment is carried out to diffuse the dopant from the doped regions 15h to the entire region of the conductive pads 15d as well as to the entire region of the selective epitaxial layer 24 and the non-doped silicon region 1a. The heat treatment also activates the polysilicon of the conductive pads 15d and the non-doped silicon region 1a, thereby reducing the resistance of the conductive pads 15d. The activation also reduces the resistances of the selective epitaxial layer 24 and the non-doped silicon region 1a. Diffusion of the dopant and activation of the polysilicon results in transforming the selective epitaxial layer 24 and the non-doped silicon region 1a into the pad contact layer 23a and the upper diffusion layer 23 as well as transforming the conductive pad 15d into the conductive pad 15m. The contact implantation process is carried out using the inter-layer insulator 11 with the contact holes 10a as a mask to selectively introduce a dopant into the conductive pads 15m, thereby forming doped regions 15i in the conductive pads 15m. The heat treatment is carried out to diffuse the dopant from the doped regions 15i to the entire region of the conductive pads 15m as well as to the entire region of the selective epitaxial layer 24 and the non-doped silicon region 1a. The heat treatment also activates the polysilicon of the conductive pads 15m and the non-doped silicon region 1a, thereby reducing the resistance of the conductive pads 15m. The activation also reduces the resistances of the selective epitaxial layer 24 and the non-doped silicon region 1a. Diffusion of the dopant and activation of the polysilicon results in transforming the selective epitaxial layer 24 and the non-doped silicon region 1a into the pad contact layer 23a and the upper diffusion layer 23 as well as transforming the conductive pad 15m into the conductive pad 15a. The conductive pad 15a is electrically connected through the pad contact layer 23a to the upper diffusion layers 23.

The contact formation process is that the contacts 10 are formed in contact holes 10a. The contacts 10 are disposed over the contact region 15f of the conductive pad 15d. The source/drain implantation process is carried out to introduce a dopant through the contact hole 10a into the doped regions 15h in the conductive pads 15d. The contact implantation process is carried out to introduce a dopant through the contact hole 10a into the doped regions 15i in the conductive pads 15m. Even the pad contact layer 23a is provided to reduce the contact resistance between the conductive pad 25a and the upper diffusion layer 23, the contact hole 10a does not largely overlap or does not overlap the vertical transistor T. The conductive pads 15d including the transistor connection region 15e and the contact region 15f can reduce an overlapping area in plan view between the contact hole 10a and the upper diffusion layer 23 and the pillar 2 of the vertical transistor T. The conductive pad 15d can allow the contact hole 10a does not overlap the upper diffusion layer 23 and the pillar 2 of the vertical transistor T. Reduction of the overlapping area in plan view between the contact hole 10a and the upper diffusion layer 23 and the pillar 2 of the vertical transistor T results in reduction of the amount of a dopant to be introduced into the upper diffusion layer 23 and the pillar 2 of the vertical transistor T during the contact implantation process. No overlapping area in plan view between the contact hole 10a and the upper diffusion layer 23 and the pillar 2 of the vertical transistor T results in almost no amount of a dopant to be introduced into the upper diffusion layer 23 and the pillar 2 of the vertical transistor T during the contact implantation process.

No overlapping area or such a reduced overlapping area in plan view between the contact hole 10a and the vertical transistor T results as follows. Almost no amount or a reduced amount of a dopant is introduced into the vertical transistor T during the contact implantation process, even if a sufficiently large amount of a dopant is introduced into the conductive pad 15a during the contact implantation process. The conductive pad 15a is sufficiently reduced in its contact resistance with the contact 10. Any punch through due to the contact implantation process can be avoided effectively. Thus, the vertical transistor T can show high performances.

Sixth Embodiment

The semiconductor device shown in FIGS. 34A and 34B can be formed by other processes than those described with reference to FIGS. 29A, 29B, 30A, 30B, 31A, 31B, 32A, 32B, 33A and 33B. The semiconductor device shown in FIGS. 34A and 34B can be formed by the following processes.

The same processes as described with reference to FIGS. 1A, 1B, 2A, 2B, 3A, 3B, 4A, 4B, 5A, 5B, 6A, 6B, 7A and 7B are also carried out in this embodiment. The selective epitaxial layers 24 are formed on the exposed surfaces of the non-doped silicon regions 1a. The selective epitaxial layers 24 are then planarized. The selective epitaxial layers 24 can be made of a polysilicon film. The thickness of the selective epitaxial layers 24 may be, but is not limited to, 20 nm.

Figure 38A:
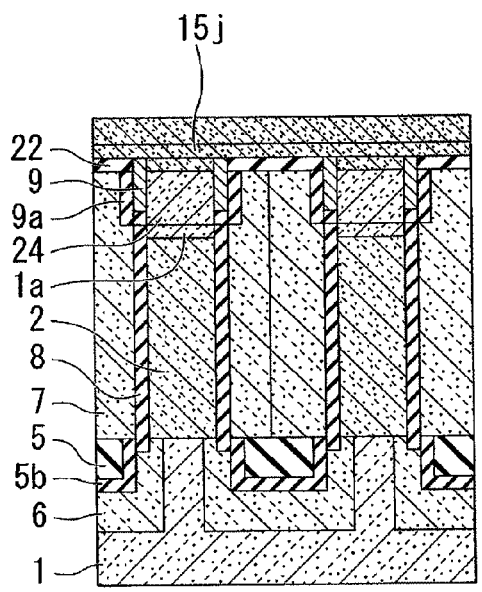
FIG. 38A is a fragmentary cross sectional elevation view, taken along the first direction, illustrating a semiconductor device of the sixth embodiment in a step involved in a method of forming the semiconductor device of FIG. 34A.
Figure 38B:
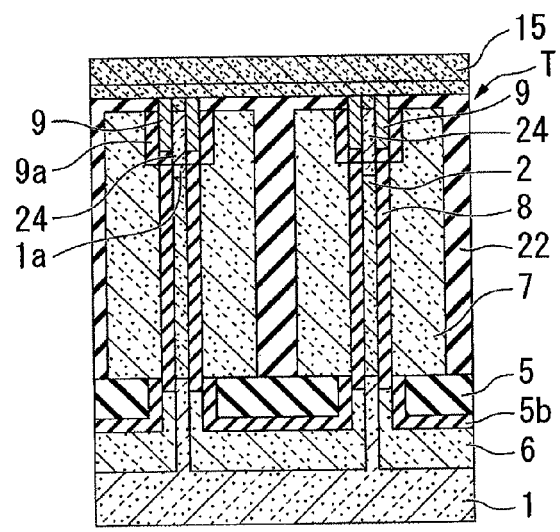
FIG. 38B is a fragmentary cross sectional elevation view, taken along the second direction, illustrating the semiconductor device of FIG. 38A.

FIG. 38A is a fragmentary cross sectional elevation view, taken along the first direction, illustrating a semiconductor device of the sixth embodiment in a step involved in a method of forming the semiconductor device of FIG. 34A. FIG. 38B is a fragmentary cross sectional elevation view, taken along the second direction, illustrating the semiconductor device of FIG. 38A.

A polysilicon film 15 is formed entirely over the semiconductor substrate 1, while carrying out an in-situ doping of phosphorous into the polysilicon film 15. The polysilicon film 15 can be deposited by a chemical vapor deposition process. The thickness of the polysilicon film 15 may be, but is not limited to, 30 nm.

Another dopant implantation process or a contact implantation process is carried out to selectively introduce a dopant into a part of the polysilicon film 15 and a part of the selective epitaxial layers 24 in a depth range, thereby forming a contact implantation layer 15j under the polysilicon film 15 and over the selective epitaxial layers 24. For example, the contact implantation process can be realized by, but is not limited to, the followings. Arsenic is implanted at implantation energy of 50 KeV and at a dose of $1E15/cm^2$.

Figure 39A:
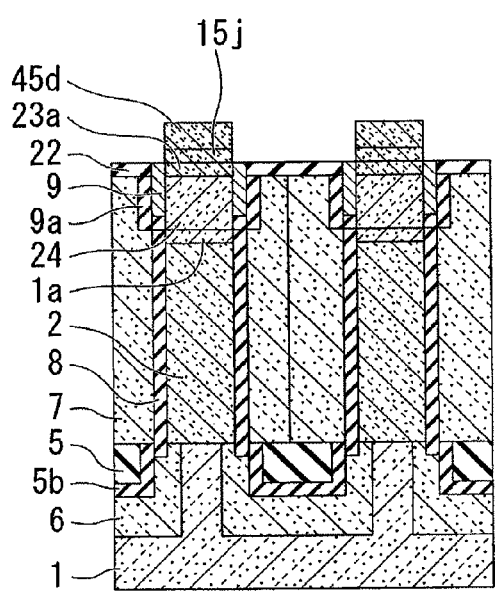
FIG. 39A is a fragmentary cross sectional elevation view, taken along the first direction, illustrating a semiconductor device of the sixth embodiment in a step subsequent to the step of FIG. 38A involved in the method of forming the semiconductor device of FIGS. 34A and 34B.
Figure 39B:
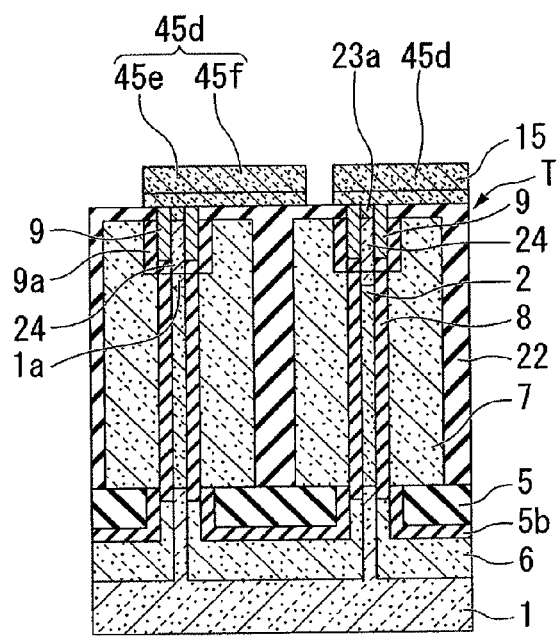
FIG. 39B is a fragmentary cross sectional elevation view, taken along the second direction, illustrating the semiconductor device of FIG. 39A.

FIG. 39A is a fragmentary cross sectional elevation view, taken along the first direction, illustrating a semiconductor device of the sixth embodiment in a step subsequent to the step of FIG. 38A involved in the method of forming the semiconductor device of FIGS. 34A and 34B. FIG. 39B is a fragmentary cross sectional elevation view, taken along the second direction, illustrating the semiconductor device of FIG. 39A.

A resist film is formed over the polysilicon film 15. A lithography process is carried out to pattern the resist film, thereby forming a resist pattern over the polysilicon film 15. A dry etching process is carried out using the resist pattern as a mask to selectively etch the polysilicon films 15 and 15j, thereby forming conductive pads 45d. The conductive pads 45d may each include, but is not limited to, a transistor connection region 45e and a contact region 45f. The transistor connection region 45e overlaps the vertical transistor T in plan view. The contact region 45f does not overlap the vertical transistor T in plan view. The resist pattern is removed. The upper portions underlying the conductive pads 45d are formed into pad contact layer 23a.

Figure 40A:
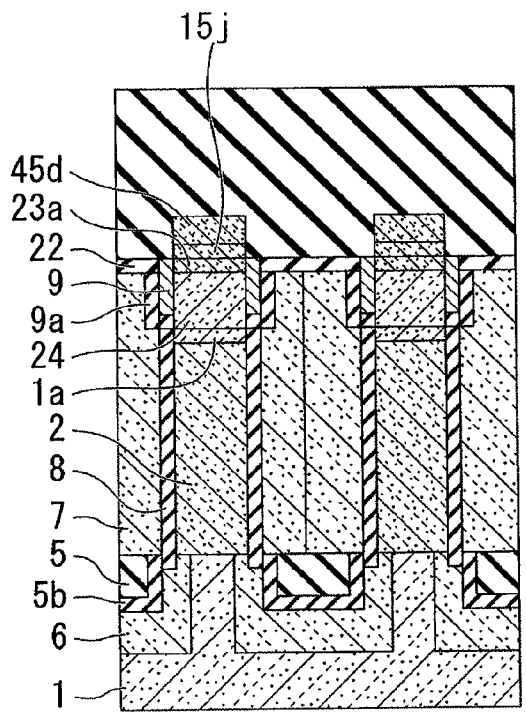
FIG. 40A is a fragmentary cross sectional elevation view, taken along the first direction, illustrating a semiconductor device of the sixth embodiment in a step subsequent to the step of FIG. 39A involved in the method of forming the semiconductor device of FIGS. 34A and 34B.
Figure 40B:
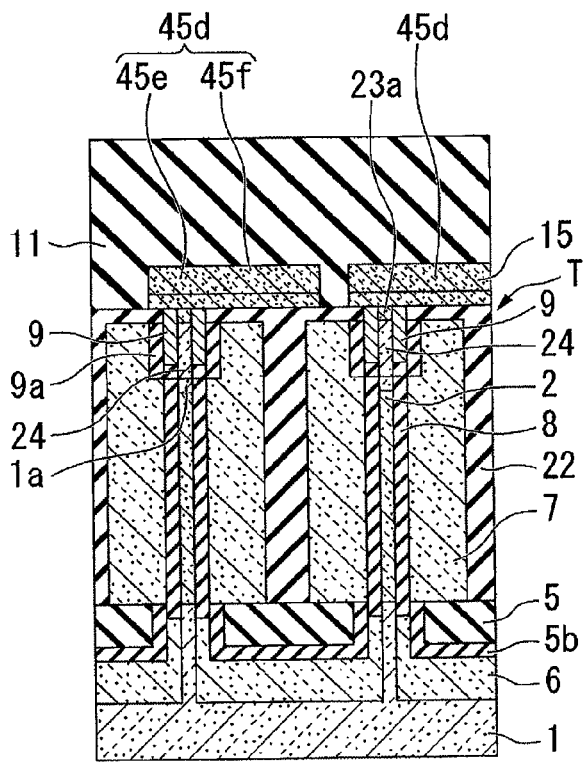
FIG. 40B is a fragmentary cross sectional elevation view, taken along the second direction, illustrating the semiconductor device of FIG. 40A.

FIG. 40A is a fragmentary cross sectional elevation view, taken along the first direction, illustrating a semiconductor device of the sixth embodiment in a step subsequent to the step of FIG. 39A involved in the method of forming the semiconductor device of FIGS. 34A and 34B. FIG. 40B is a fragmentary cross sectional elevation view, taken along the second direction, illustrating the semiconductor device of FIG. 40A.

An inter-layer insulator 11 is formed over the conductive pads 45d and the inter-layer insulator 22. The inter-layer insulator 11 can be formed by a sputtering method. A chemical mechanical polishing process is then carried out to planarize the inter-layer insulator 11.

Figure 41A:
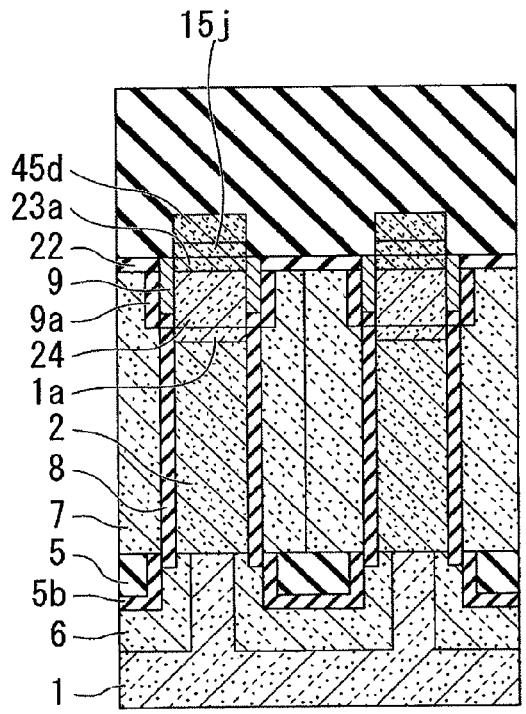
FIG. 41A is a fragmentary cross sectional elevation view, taken along the first direction, illustrating a semiconductor device of the sixth embodiment in a step subsequent to the step of FIG. 40A involved in the method of forming the semiconductor device of FIGS. 34A and 34B.
Figure 41B:
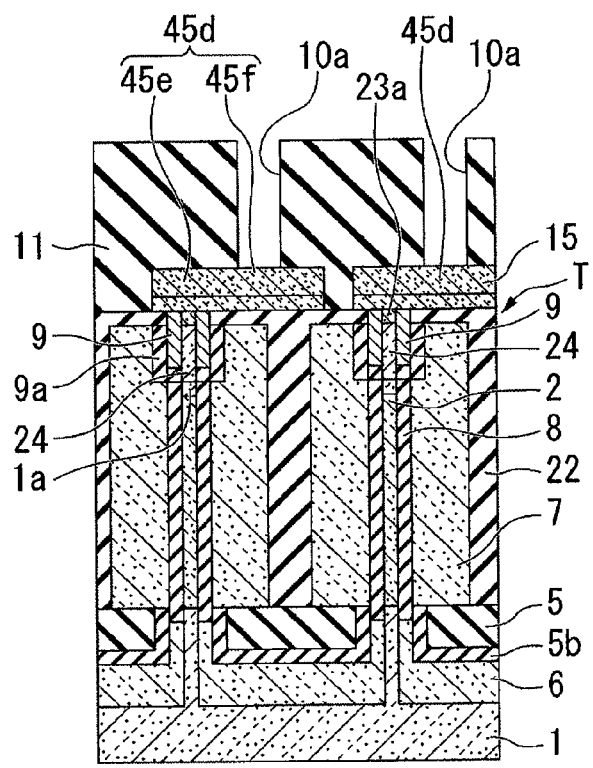
FIG. 41B is a fragmentary cross sectional elevation view, taken along the second direction, illustrating the semiconductor device of FIG. 41A.

FIG. 41A is a fragmentary cross sectional elevation view, taken along the first direction, illustrating a semiconductor device of the sixth embodiment in a step subsequent to the step of FIG. 40A involved in the method of forming the semiconductor device of FIGS. 34A and 34B. FIG. 41B is a fragmentary cross sectional elevation view, taken along the second direction, illustrating the semiconductor device of FIG. 41A.

A resist film is formed over the inter-layer insulator 11. A lithography process is carried out to pattern the resist film, thereby forming a resist pattern over the inter-layer insulator 11. A dry etching process is carried out using the resist pattern as a mask to selectively etch the inter-layer insulator 11, thereby forming contact holes 10a in the inter-layer insulator 11. The contact holes 10a are positioned over parts of the conductive pads 45d. The contact holes 10a are each positioned over a part of the transistor connection region 45e and a part of the contact region 45f. The resist film is then removed. The inter-layer insulator 11 has the contact holes 10a which expose the parts of the conductive pads 45d. The contact holes 10a each expose a part of the transistor connection region 45e and a part of the contact region 45f.

FIG. 42A is a fragmentary cross sectional elevation view, taken along the first direction, illustrating a semiconductor device of the sixth embodiment in a step subsequent to the step of FIG. 41A involved in the method of forming the semiconductor device of FIGS. 34A and 34B. FIG. 42B is a fragmentary cross sectional elevation view, taken along the second direction, illustrating the semiconductor device of FIG. 42A.

The polysilicon film 15, the selective epitaxial layers 24 and the non-doped silicon region 1a are reduced in their resistivity through the conductive pads 45d and the pad contact layer 23a. Another dopant implantation process or a source/drain implantation process is carried out using the inter-layer insulator 11 with the contact holes 10a as a mask to selectively introduce a dopant into the conductive pads 45d, thereby forming doped regions 15k in the conductive pads 45d. Namely, the source/drain implantation process is carried out to introduce the dopant through the contact holes 10a into the exposed parts of the transistor connection region 45e and the exposed part of the contact region 45f, thereby forming the doped regions 15k in the transistor connection region 45e and the doped regions 15k in the contact region 45f. The source/drain implantation process can be carried out by using phosphorous as the dopant at implantation energy of 20 KeV and at a dose of $3E15/cm^2$.

With reference again to FIGS. 34A and 34B, a heat treatment is carried out to diffuse the dopant from the doped regions 15k through the entire region of the conductive pads 45d and the pad contact layer 23a to the conductive pads 45d and the polysilicon film 15 as well as the entire of the selective epitaxial layers 24 and the non-doped silicon region 1a. The heat treatment further activates the polysilicon of the polysilicon film 15 adjacent to the conductive pads 45d a, the polysilicon of the selective epitaxial layers 24 and the non-doped silicon region 1a, thereby reducing the resistance thereof. Diffusion of the dopant and activation of the polysilicon results in transforming the selective epitaxial layer 24 and the non-doped silicon region 1a into the pad contact layer 23a and the upper diffusion layer 23 as well as transforming the conductive pad 45d and the polysilicon film 15 into the conductive pad 15a. The conductive pad 15a is electrically connected through the pad contact layer 23a to the upper diffusion layers 23. The conductive pad 15a each includes, but is not limited to, a transistor connection region 15b and a contact region 15c. The transistor connection region 15b overlaps the vertical transistor T in plan view. The contact region 15c does not overlap the vertical transistor T in plan view.

The source/drain implantation process can preferably be carried out by using phosphorous as a dopant. Phosphorous is a dopant having a large diffusion coefficient which can easily be diffused into the conductive pad 45d, the pad contact layer 23a, the selective epitaxial layer 24 and the non-doped silicon region 1a, thereby easily forming the pad contact layer 23a to the upper diffusion layers 23.

The contact holes 10a are filled with a conductive material, thereby forming contacts 10 in contact holes 10a. The contacts 10 are electrically connected to the conductive pads 15a. The contacts 10 may each be disposed over a part of the contact region 15c and a part of the transistor connection region 15b of the conductive pads 15a. This arrangement of the contact 10 overlapping entirely the contact region 15c of the conductive pads 15a can be more effective to reduce or prevent the punch-through effects which would be caused by the contact implantation and/or the source/drain implantation.

In accordance with this embodiment, the process for forming the semiconductor device includes forming the vertical transistor T which includes the upper diffusion layers 23, the pillars 2, and the selective epitaxial layer 24. The process for forming the semiconductor device includes forming the conductive pad 45d which includes the transistor connection region 45e and a contact region 45f. The transistor connection region 45e overlaps the vertical transistor T in plan view. The contact region 45f does not overlap the vertical transistor T in plan view. The conductive pad 45d is electrically connected to the vertical transistor T. The process for forming the semiconductor device includes the contact implantation process which is carried out using the inter-layer insulator 11 with the contact holes 10a as a mask to selectively introduce a dopant into the conductive pads 15d. The process for forming the semiconductor device includes the heat treatment which is carried out to diffuse the dopant from the doped regions 15k through the entire region of the conductive pads 45d and the pad contact layer 23a to the conductive pads 45d and the polysilicon film 15 as well as the entire of the selective epitaxial layers 24 and the non-doped silicon region 1a. The heat treatment further activates the polysilicon of the polysilicon film 15 adjacent to the conductive pads 45d a, the polysilicon of the selective epitaxial layers 24 and the non-doped silicon region 1a, thereby reducing the resistance thereof. Diffusion of the dopant and activation of the polysilicon results in transforming the selective epitaxial layer 24 and the non-doped silicon region 1a into the pad contact layer 23a and the upper diffusion layer 23 as well as transforming the conductive pad 45d and the polysilicon film 15 into the conductive pad 15a. The conductive pads 45d including the transistor connection region 45e and the contact region 45f can reduce an overlapping area in plan view between the contact hole 10a and the upper diffusion layer 23 and the pillar 2 of the vertical transistor T. The conductive pad 45d can allow the contact hole 10a does not overlap the upper diffusion layer 23 and the pillar 2 of the vertical transistor T. Reduction of the overlapping area in plan view between the contact hole 10a and the upper diffusion layer 23 and the pillar 2 of the vertical transistor T results in reduction of the amount of a dopant to be introduced into the upper diffusion layer 23 and the pillar 2 of the vertical transistor T during the source/drain implantation process. No overlapping area in plan view between the contact hole 10a and the upper diffusion layer 23 and the pillar 2 of the vertical transistor T results in almost no amount of a dopant to be introduced into the upper diffusion layer 23 and the pillar 2 of the vertical transistor T during the source/drain implantation process.

No overlapping area or such a reduced overlapping area in plan view between the contact hole 10a and the vertical transistor T results as follows. Almost no amount or a reduced amount of a dopant is introduced into the vertical transistor T during the source/drain implantation process, even if a sufficiently large amount of a dopant is introduced into the conductive pad 45a during the source/drain implantation process. The conductive pad 45a is sufficiently reduced in its contact resistance with the contact 10. Any punch through due to the source/drain implantation process can be avoided effectively. Thus, the vertical transistor T can show high performances. The pad contact layer 23a reduces the contact resistance between the conductive pad 15a and the upper diffusion layer 23.

Seventh Embodiment

FIG. 45A is a fragmentary cross sectional elevation view, taken along a first direction, illustrating a semiconductor device in a seventh embodiment in accordance with the present invention. FIG. 45B is a fragmentary cross sectional elevation view, taken along a second direction perpendicular to the first direction, illustrating the semiconductor device of FIG. 45A.

The semiconductor device shown in FIGS. 45A and 45B is different from the semiconductor device shown in FIGS. 23A and 23B only in that conductive pads 35a are made of a silicide, and metal layers 35d are formed in lower portions of the contact holes 10a.

As shown in FIGS. 45A and 45B, the semiconductor device may include conductive pads 35a. The conductive pads 35a are disposed over the upper diffusion layers 23. The upper diffusion layers 23 are upper portions of the vertical transistor T. The conductive pads 35a may be formed of a silicide layer. The conductive pads 35a may each have, but is not limited to, a generally L-shape in plan view as shown in FIGS. 15 and 16. The conductive pads 35a may each include, but is not limited to, a transistor connection region 35b and a contact region 35c. The transistor connection region 35b overlaps the vertical transistor T in plan view. The contact region 35c does not overlap the vertical transistor T in plan view as shown in FIGS. 45A and 45B.

As shown in FIGS. 45A and 45B, the semiconductor device may include contacts 10 and metal layers 35d in the contact holes 10a. The metal layer 35d is positioned under the contact 10 and over the conductive pad 35a. The contact 10 is connected through the metal layers 35d to the conductive pad 35a. The contact 10 and the metal layer 35d may be disposed over the contact region 35c and a part of the transistor connection region 35b of the conductive pads 35a. It is also possible that the contacts 10 and the metal layer 35d may overlap only the contact region 35c but does not overlap the transistor connection region 35b of the conductive pads 35a.

The semiconductor device as described with reference to FIGS. 45A and 45B can be formed by, but not limited to, the following processes.

The same processes as described with reference to FIGS. 1A, 1B, 2A, 2B, 3A, 3B, 4A, 4B, 5A, 5B, 6A, 6B, 7A, 7B, 17A, 17B, 18A, 18B, 19A, 19B, 20A, 20B, 21A and 21B are also carried out in this embodiment. As shown in FIGS. 21A and 21B, the contact holes 10a are formed in the inter-layer insulator 11a. As shown in FIGS. 22A and 22B, the conductive pads 25d are reduced in its resistivity. A dopant implantation process or a contact implantation process is carried out using the inter-layer insulator 11a with the contact holes 10a as a mask to selectively introduce a dopant into the conductive pads 25d, thereby forming doped regions 25g in the conductive pads 25d. Namely, the contact implantation process is carried out to introduce the dopant through the contact holes 10a into the exposed parts of the transistor connection region 25e and the exposed part of the contact region 25f, thereby forming the doped regions 25g in the transistor connection region 25e and the doped regions 25g in the contact region 25f. The contact implantation process can be carried out by using phosphorous as the dopant at implantation energy of 20 KeV and at a dose of 3E16/cm$^2$.

A heat treatment is carried out to diffuse the dopant from the doped regions 25g to the entire region of the conductive pads 25d, and activate the polysilicon of the conductive pads 25d, thereby reducing the conductive pads 25d. Diffusion of the dopant to the entire region of the conductive pads 25d and activation of the polysilicon of the conductive pads 25d results in forming the conductive pads 35e. The conductive pads 35e are electrically connected to the upper diffusion layers 23.

Figure 43A:
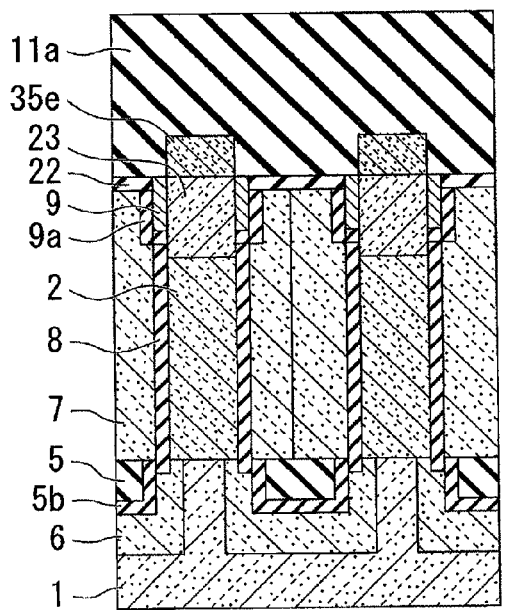
FIG. 43A is a fragmentary cross sectional elevation view, taken along the first direction, illustrating a semiconductor device of the seventh embodiment in a step involved in a method of forming the semiconductor device of FIG. 45A.
Figure 43B:
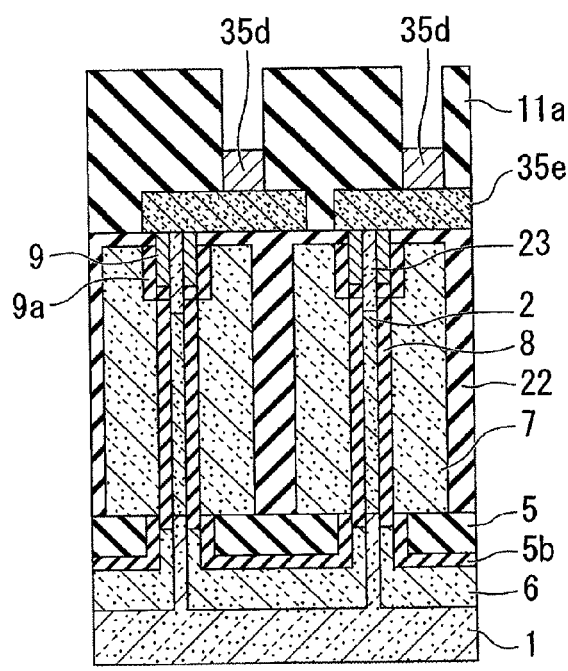
FIG. 43B is a fragmentary cross sectional elevation view, taken along the second direction, illustrating the semiconductor device of FIG. 43A.

FIG. 43A is a fragmentary cross sectional elevation view, taken along the first direction, illustrating a semiconductor device of the seventh embodiment in a step involved in a method of forming the semiconductor device of FIG. 45A. FIG. 43B is a fragmentary cross sectional elevation view, taken along the second direction, illustrating the semiconductor device of FIG. 43A.

Metal films 35d are formed on the exposed parts of the conductive pads 35e. The metal layer 35d fills the power part of the contact hole 10a. The metal layer 35d can be formed by a sputtering process. The metal layer 35d may be made of, but not limited to, cobalt. The thickness of the metal layer 35d may be, but is not limited to, 20 nm.

Figure 44A:
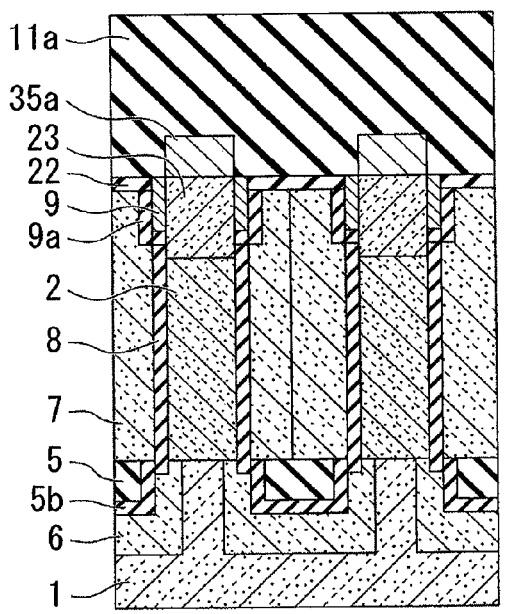
FIG. 44A is a fragmentary cross sectional elevation view, taken along the first direction, illustrating a semiconductor device of the seventh embodiment in a step subsequent to the step of FIG. 43A involved in the method of forming the semiconductor device of FIGS. 45A and 45B.
Figure 44B:
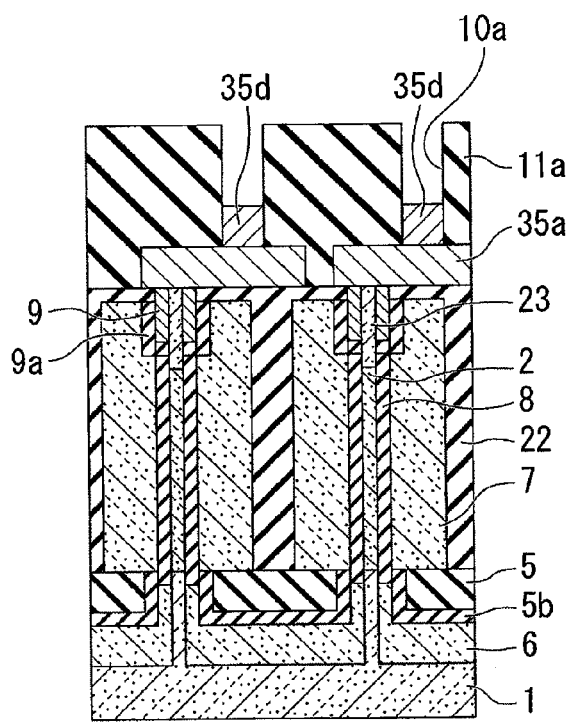
FIG. 44B is a fragmentary cross sectional elevation view, taken along the second direction, illustrating the semiconductor device of FIG. 44A.

FIG. 44A is a fragmentary cross sectional elevation view, taken along the first direction, illustrating a semiconductor device of the seventh embodiment in a step subsequent to the step of FIG. 43A involved in the method of forming the semiconductor device of FIGS. 45A and 45B. FIG. 44B is a fragmentary cross sectional elevation view, taken along the second direction, illustrating the semiconductor device of FIG. 44A.

A heat treatment is carried out to silicide the conductive pads 35e, thereby forming conductive pads 35a of silicide, which are reduced in its resistivity. The heat treatment can be carried out by a lamp anneal. The conductive pad 35a each includes, but is not limited to, a transistor connection region 35b and a contact region 35c. The transistor connection region 35b overlaps the vertical transistor T in plan view. The contact region 35c does not overlap the vertical transistor T in plan view.

As shown in FIGS. 45A 45B, the contact holes 10a are filled up with a conductive material, thereby forming contacts 10 on the metal layers 35d in the contact holes 10a. The contacts 10 are electrically connected through the metal layers 35d to the conductive pads 35a. The contacts 10 may each be disposed over a part of the contact region 35c and a part of the transistor connection region 35b of the conductive pads 35a. This arrangement of the contact 10 overlapping entirely the contact region 35c of the conductive pads 35a can be more effective to reduce or prevent the punch-through effects which would be caused by the contact implantation and/or the source/drain implantation. The metal layer 35d reduces the contact resistance between the conductive pads 35a and the contact 10.

In accordance with this embodiment, the contact implantation process is carried out to selectively introduce a dopant into the conductive pads 25d. The heat treatment is carried out to diffuse the dopant from the doped regions 25g to the entire region of the conductive pads 25d, and activate the polysilicon of the conductive pads 25d, thereby reducing the conductive pads 25d, thereby forming the conductive pads 35e. The silicidation process is carried out to silicide the conductive pads 35e with the metal layers 35d, thereby forming conductive pads 35a of silicide, which are reduced in its resistivity. The metal layer 35d reduces the contact resistance between the conductive pads 35a and the contact 10. The doping and diffusion processes are carried out to diffuse the dopant into the conductive pads 35e before the doped conductive pads 35e is then silicided with the metal layers 35d. The silicidation of the doped conductive pads 35e is easier than the silicidation of the non-doped conductive pads 25d.

As used herein, the following directional terms "over, under, forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

It is apparent that the present invention is not limited to the above embodiments, but may be modified and changed without departing from the scope and spirit of the invention.

What is claimed is:

1. A semiconductor device comprising:
    a transistor;
    a conductive pad being electrically connected to the transistor, the conductive pad comprising a first region and a second region;
    a contact being electrically connected to the conductive pad, wherein at least a main part of the first region overlaps the transistor in plan view, at least a main part of the second region does not overlap the transistor in plan view, at least a main part of the contact overlaps the second region in plan view, the at least main part of the contact does not overlap the first region in plan view, and the at least main part of the contact does not overlap the transistor in plan view; and
    a pad contact layer disposed between an upper diffusion layer of the transistor and the first region of the conductive pad,
    wherein the pad contact layer overlaps the upper diffusion layer and the first region of the conductive pad in plan view, and
    the pad contact layer reduces a contact resistance between the upper diffusion layer and the first region of the conductive pad.

2. The semiconductor device according to claim 1, further comprising:
    a capacitor disposed over the contact, the capacitor being electrically connected to the contact.

3. The semiconductor device according to claim 1, wherein plural sets of the transistor, the conductive pad and the contact are provided,
    the transistors are disposed in a form of a matrix array, and
    pairs of the conductive pads and the contacts are disposed in a form of a staggered array.

4. The semiconductor device according to claim 1, wherein plural sets of the transistor, the conductive pad and the contact are disposed in a form of a matrix array.

5. A semiconductor device comprising:
    a transistor;
    a conductive pad being electrically connected to the transistor, the conductive pad comprising a first region and a second region;
    a contact being electrically connected to the conductive pad, wherein at least a main part of the first region overlaps the transistor in plan view, at least a main part of the second region does not overlap the transistor in plan view, at least a main part of the contact overlaps the second region in plan view, the at least main part of the contact does not overlap the first region in plan view, and the at least main part of the contact does not overlap the transistor in plan view; and
    a metal layer disposed between the contact and the second region of the conductive pad,
    wherein the conductive pad comprises a silicide layer.

6. The semiconductor device according to claim 5, wherein the transistor comprises:
    a lower diffusion layer;
    a pillar disposed over the lower diffusion layer;
    an upper diffusion layer disposed over the pillar, the upper diffusion layer being connected to the first region of the conductive pad.

7. The semiconductor device according to claim 5, further comprising:
    a capacitor disposed over the contact, the capacitor being electrically connected to the contact.

8. The semiconductor device according to claim 5, wherein plural sets of the transistor, the conductive pad and the contact are provided,
    the transistors are disposed in a form of a matrix array, and
    pairs of the conductive pads and the contacts are disposed in a form of a staggered array.

9. The semiconductor device according to claim 5, wherein plural sets of the transistor, the conductive pad and the contact are disposed in a form of a matrix array.

10. A semiconductor device comprising:
    a semiconductor body;
    a plurality of semiconductor pillars projecting from the semiconductor body with a space thereamong, each of the semiconductor pillars comprising a first diffusion region formed in an upper portion thereof, a second diffusion region formed in a lower portion thereof and a channel region formed in a portion between the upper and lower portions, the semiconductor pillars including a first semiconductor pillar;
    a conductive pad comprising first and second regions, the first region being in contact with the first diffusion region of the first semiconductor pillar, the second region being elongated laterally from the first region and terminating over the space; and
    a contact formed in contact with the second region of the conductive pad so that a contacting portion between the contact and the second region of the conductive pad lies in plan view apart from the first region of the conductive pad and from the first region of each of the semiconductor pillars inclusive of the first semiconductor pillar.

11. The device as claimed in claim 10, wherein the conductive pad comprises a polycrystalline semiconductor layer and the contact comprises a metal layer.

12. The device as claimed in claim 10, further comprising:
    a plurality of additional conductive pads each comprising first and second regions, the first region of each of the additional conductive pads being, in contact with the first diffusion region of an associated one of remaining ones of the semiconductor pillars, the second region of each of the additional conductive pads being elongated laterally from the first region of an associated one of the additional conductive pads and terminating over the space; and
    a plurality of additional contacts each formed in contact with the second region of an associated one of the additional conductive pads so that a contacting portion between each of the additional contacts and the second region of each of the additional conductive pads lies in plan view apart from the first region of each of the additional conductive pads and from the first diffusion region of each of the semiconductor pillars inclusive of the first semiconductor pillar.

13. The device as claimed in claim 12, wherein the device further comprises a plurality of capacitors that are electrically connected respectively to the contact and the additional contacts.

14. The device as claimed in claim 12, wherein the semiconductor pillars inclusive of the first semiconductor pillar are arranged in matrix including a plurality of rows and columns, the second regions belonging to the same column are disposed in line, and the second regions belonging to the same row are disposed in zigzag.

15. The device as claimed in claim 14, wherein the device further comprises a plurality of capacitors that are electrically connected respectively to the contact and the additional contacts.

16. The device as claimed in claim 10, wherein the space is filled with gate structures and an insulating layer, each of the gate structures includes a gate insulating film covering the channel region of an associated one of the semiconductor pillars inclusive of the first semiconductor pillar and a gate electrode formed on the gate insulating film, the insulating layer being between adjacent ones of the gate electrodes.

17. The device as claimed in claim 16, wherein the semiconductor pillars inclusive of the first semiconductor pillar are arranged in matrix including a plurality of rows and columns, the gate electrodes of adjacent ones of the gate structures belonging to the same column are in contact with each other, and the insulating layer intervenes between the gate electrodes of adjacent ones of the gate structures belonging to the same row.

18. The device as claimed in claim 17, wherein the device further comprises a plurality of capacitors that are electrically connected respectively to the contact and the additional contacts.

* * * * *